(12) United States Patent
Yücesan

(10) Patent No.: US 12,170,168 B2
(45) Date of Patent: Dec. 17, 2024

(54) SUPERCAPACITORS COMPRISING PHOSPHONATE AND ARSONATE METAL ORGANIC FRAMEWORKS (MOFS) AS ACTIVE ELECTRODE MATERIALS

(71) Applicant: TECHNISCHE UNIVERSITÄT BERLIN, Berlin (DE)

(72) Inventor: Gündog Yücesan, Siegen (DE)

(73) Assignee: Technische Universitat Berlin, Berlin (DE)

( * ) Notice: Subject to any disclaimer, the term of this patent is extended or adjusted under 35 U.S.C. 154(b) by 295 days.

(21) Appl. No.: 17/637,508

(22) PCT Filed: Jul. 8, 2020

(86) PCT No.: PCT/EP2020/069245
§ 371 (c)(1),
(2) Date: Feb. 23, 2022

(87) PCT Pub. No.: WO2021/037428
PCT Pub. Date: Mar. 4, 2021

(65) Prior Publication Data
US 2022/0293350 A1    Sep. 15, 2022

(30) Foreign Application Priority Data

Aug. 23, 2019 (EP) .................................. 19193222

(51) Int. Cl.
*H01G 11/30* (2013.01)
*H10K 30/30* (2023.01)
(Continued)

(52) U.S. Cl.
CPC ............. *H01G 11/30* (2013.01); *H10K 30/30* (2023.02); *H10K 85/331* (2023.02); *H10K 85/60* (2023.02); *H10K 85/6572* (2023.02)

(58) Field of Classification Search
CPC .... H01G 11/30; H01G 9/2004; H01G 9/2059; H01G 11/26; H01G 11/46; H01G 11/48;
(Continued)

(56) References Cited

U.S. PATENT DOCUMENTS

| | | | |
|---|---|---|---|
| 8,124,660 B2 * | 2/2012 | de Figueiredo Gomes | ................. C08J 5/2275 429/492 |
| 9,114,348 B2 * | 8/2015 | Hafizovic | ............... C07C 63/15 |

(Continued)

FOREIGN PATENT DOCUMENTS

| | | |
|---|---|---|
| CN | 108084452 A | 5/2018 |
| CN | 108492999 A | 9/2018 |

(Continued)

OTHER PUBLICATIONS

Int'l Search Report for PCT/EP2020/069245, dated Dec. 22, 2020.

(Continued)

*Primary Examiner* — Dion R. Ferguson
(74) *Attorney, Agent, or Firm* — MaxGoLaw PLLC

(57) ABSTRACT

An electrode suitable for constructing an electrochemical double layer capacitor and/or supercapacitor is provided that includes an electrode material a metal organic framework (MOF), wherein the MOF includes an inorganic building unit including metal atoms selected from group 1 to group 12 elements, and functional groups of organic linkers including oxygen (O) and one or more atoms selected from the group comprising phosphorus (P), arsenic (As), antimony (Sb), silicon (Si), selenium (Se) and bismuth (Bi). The functional groups of the organic linkers can include phosphonate, arsonate, phosphonic acid, phosphinic acid, arsonic acids and/or arsenic acids, monoester and/or diester forms thereof. Further, the metal atoms may be selected from zinc (Zn), cadmium (Cd), copper (Cu), cobalt (Co), nickel (Ni), gold (Au) and silver (Ag). The use of the MOF as a semiconductor in semiconductor applications, a semiconductive device, such as a photovoltaic cell, including the MOF are also provided.

19 Claims, 29 Drawing Sheets

(51) Int. Cl.
*H10K 85/30* (2023.01)
*H10K 85/60* (2023.01)

(58) Field of Classification Search
CPC ...... H10K 30/30; H10K 85/331; H10K 85/60; H10K 85/6572; Y02E 60/10; Y02E 10/542; Y02E 60/13; C07F 9/3839; H01M 4/60; Y02B 10/10; H01L 31/022425

See application file for complete search history.

(56) References Cited

U.S. PATENT DOCUMENTS

| 2015/0175518 | A1* | 6/2015 | Schroder | B01J 20/3085 |
| | | | | 556/179 |
| 2016/0064773 | A1* | 3/2016 | Choi | H01M 10/0565 |
| | | | | 429/313 |
| 2017/0207446 | A1* | 7/2017 | Kang | H01M 4/5815 |
| 2019/0190005 | A1* | 6/2019 | Lee | H01M 10/052 |
| 2019/0211043 | A1* | 7/2019 | Dinca | C07F 15/045 |
| 2020/0118768 | A1* | 4/2020 | Mallick | H01G 11/48 |
| 2021/0098203 | A1* | 4/2021 | Dinca | H01G 11/62 |
| 2021/0151262 | A1* | 5/2021 | Mallick | C07D 471/06 |
| 2021/0288303 | A1* | 9/2021 | Kim | H01M 4/583 |
| 2022/0293350 | A1* | 9/2022 | Yücesan | H01G 11/24 |

FOREIGN PATENT DOCUMENTS

| EP | 3254755 A1 | 12/2017 |
| FR | 3063180 A1 | 8/2018 |
| KR | 101986247 B1 * | 6/2019 |
| WO | 2017050936 A1 | 3/2017 |

OTHER PUBLICATIONS

Hu, Xiaoshi, et al. "Cobalt-based metal organic framework with superior lithium anodic performance", Journal of Solid State Chemistry, Orlando, FL, US, vol. 242, Jul. 20, 2016 (Jul. 20, 2016), pp. 71-76.

* cited by examiner

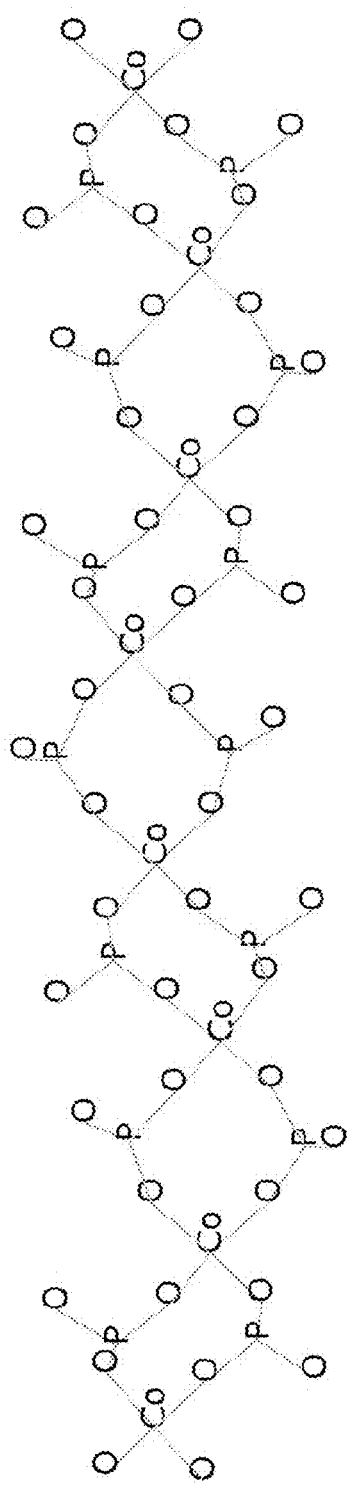
Figure 1C (continued)
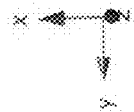

A

B

C

D

E

F

G

H

I

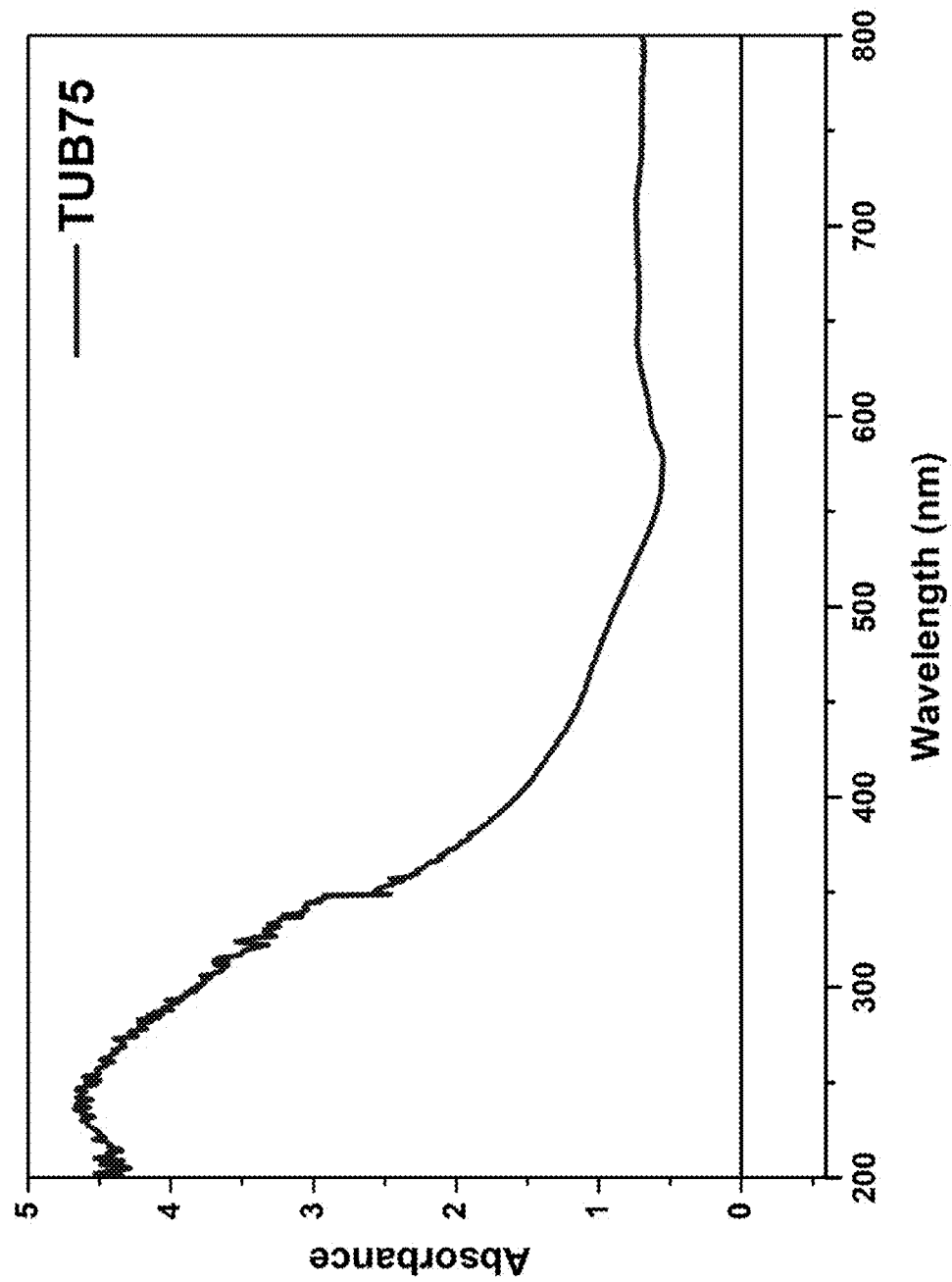

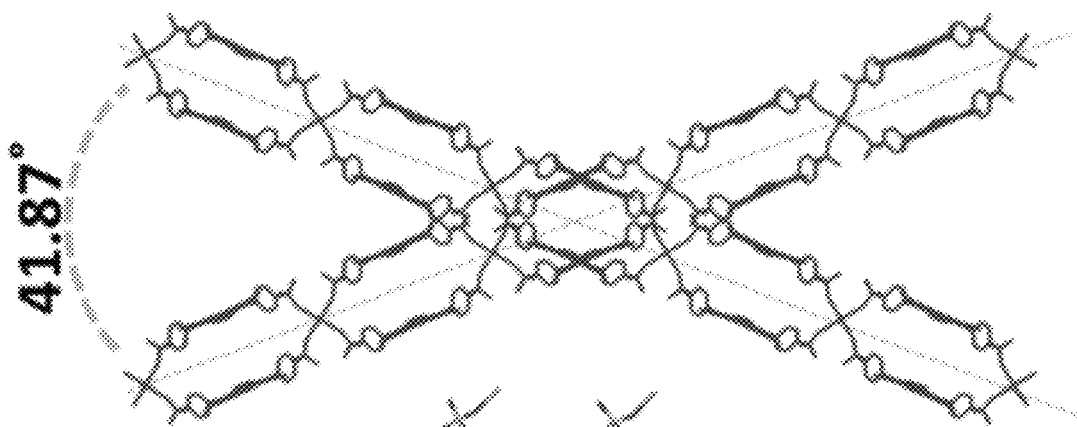
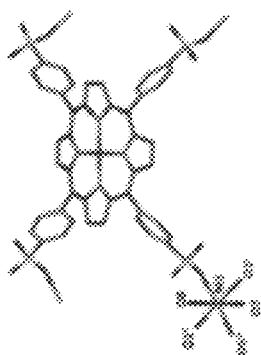
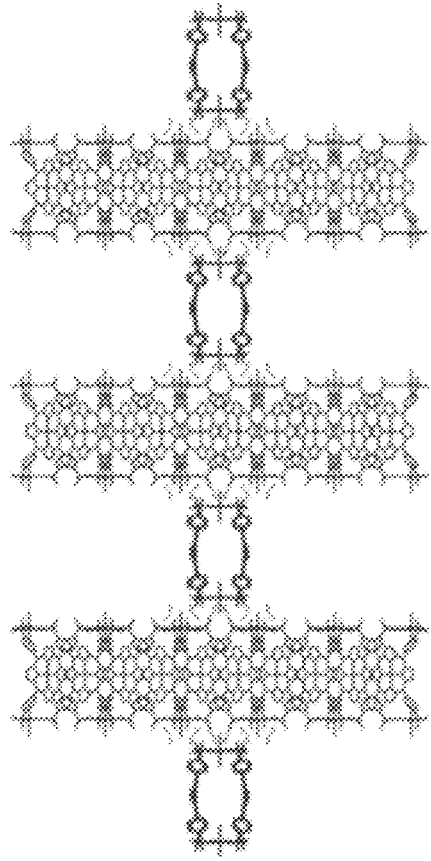
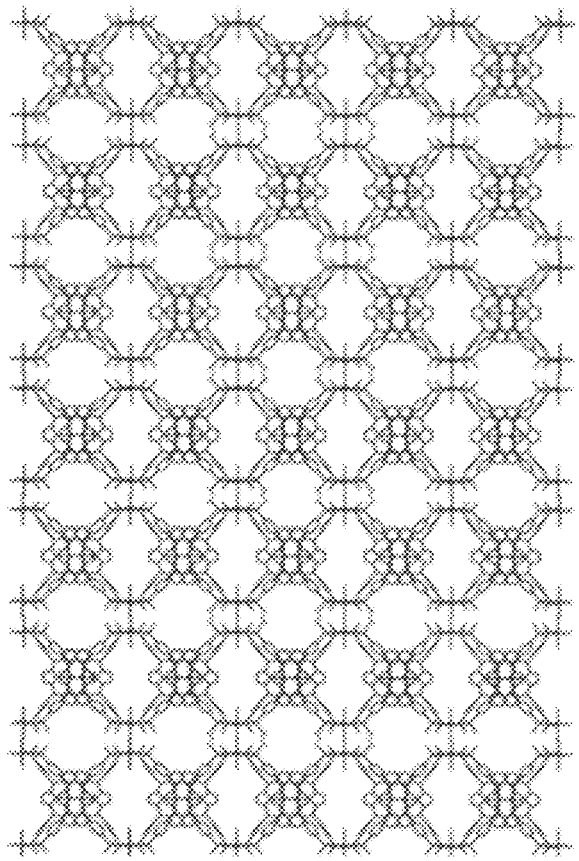
Figure 15D
Figure 15C
Figure 15A
Figure 15B States/a.u.

States/a.u.

A

B

A

B

A

B $n=0,1,2,3,4,5\ldots$ $n=0,1,2,3,4,5\ldots$

SUPERCAPACITORS COMPRISING PHOSPHONATE AND ARSONATE METAL ORGANIC FRAMEWORKS (MOFS) AS ACTIVE ELECTRODE MATERIALS

FIELD OF THE INVENTION

The invention relates to an electrode suitable for constructing an electrochemical double layer capacitor and/or supercapacitor and comprising as an electrode material a metal organic framework (MOF), wherein the MOF comprises an inorganic building unit comprising metal atoms selected from group 1 to group 12 elements, and functional groups of organic linkers comprising oxygen (O) and one or more atoms selected from the group comprising phosphorus (P), arsenic (As), antimony (Sb), silicon (Si), selenium (Se) and bismuth (Bi). In embodiments of the invention, the functional groups of the organic linkers are selected from the group comprising phosphonate, arsonate, phosphonic acid, phosphinic acid, arsonic acids and/or arsenic acids, monoester and/or diester forms thereof. Further, the metal atoms may be selected from the group comprising zinc (Zn), cadmium (Cd), copper (Cu), cobalt (Co), nickel (Ni), gold (Au) and silver (Ag). In further aspects the invention relates to the use of the MOF as a semiconductor and/or in semiconductor applications, and to a semiconductive device, such as a photovoltaic cell, comprising the MOF.

BACKGROUND OF THE INVENTION

Electrochemical double layer capacitors (EDLCs) provide high power density and they have been emerging as electrical energy storage units. EDLCs can be used in electrical devices, power units and in memory backup devices. They have expected applications for example in optimizing the batteries of electricity powered vehicles. [1] In order to reach the most optimum EDLCs, the electrode should provide good conductivity, long-term thermal and chemical stability, resistance against corrosion and should exhibit high surface areas per unit volume and mass. [2]

Activated carbon electrodes are majorly used in the construction of electrochemical double layer capacitors (EDLCs). However, activated carbon provides limited surface areas between 500 to 1500 $m^2/g$, which restrains the further development of their supercapacitor applications. Alternative electrode materials with tunable porosities should be explored to construct the new generation of supercapacitors. [3,4,5,6] One emerging option to improve the surface areas of the future electrodes is the metal organic frameworks (MOFs).

Metal organic frameworks (MOFs) emerged as a new family of microporous materials at the beginning of the 21st century. They are composed of inorganic building units (IBUs) and organic linkers, which combine to create microporous frameworks. Owing to the vast range of organic linker geometries and functional groups, and the option of postsynthetic modification of pore surfaces, many diverse applications of MOF chemistry have emerged, including small molecule storage, greenhouse gas sequestration, drug delivery, and detoxifying agents; and the presence of IBUs has led to applications in heterogeneous catalysis, magnetism, and conductivity. Among these applications, magnetic MOFs have recently attracted a great deal of attention due to the possibility of creating tunable magnetic materials by varying the host-guest interactions at pore sites or exploiting structural changes induced by MOF breathing; and conductive MOFs are expected to serve as next-generation porous electrode materials with higher and customizable surface areas compared to active carbon electrodes. Traditional MOFs have primarily relied on molecular IBUs known widely as paddle wheel patterns. The large distances between the polyaromatic linkers in paddle wheel patterned carboxylate MOFs limited their conductivity with respect to electron hoping mechanisms and such IBUs with carboxylate metal binding groups mainly worked as insulators with band gaps above semiconductive range. Therefore, thousands of carboxylate-MOFs are known to be insulators with a few random exceptions. Therefore, the construction of conductive MOFs requires more subtle design elements. For example, flat conjugated linkers such as phthalocyanine or porphyrins with orthodiimine, orthodihydroxy and metal-binding units connected via molecular IBUs composed of a single metal ion, are known to give rise to conductivity. Azolate linkers are known to generate conductance via through-bond pathways. However, due to the limited number of metal-binding modes for the single nitrogen, sulfur and oxygen donating linkers and the highly conservative nature of metal binding in these systems, progress in the design of conductive MOFs has been limited. Alternative metal binding units capable of yielding both rich structural diversity and conductivity are needed for constructing next-generation conductive MOFs.

Carboxylate MOFs provided high surface area to mass ratios above 7000 $m^2/g$. Despite their high surface areas, the tested carboxylate MOFs were not able to provide the desired conductivity for the supercapacitor applications and they exhibit lower resistance against high temperatures and corrosion. [7] Furthermore, carboxylate MOFs display comparably low chemical stability in presence of for example electrolytes, humidity, acidic medium and water.

So far, electrically conductive two-dimensional MOFs with up to 40 S/cm using organic linkers comprising nitrogen in their functional groups, in particular ortho-diimine organic linkers, have been synthetized, but their surface area of about 600 $m^2/g$ was not significantly higher than that of activated carbon electrodes. [2, 9] MOFs constructed using ortho-diimine linkers are generally composed of two-dimensional crystal structures. In addition, two-dimensional MOFs constructed with ortho-diimine functionalized linkers constitute one of the relatively less stable MOF families. [J. Am. Chem. Soc. 2017, 139, 13608-13611] The correct choice of metal binding functional group of the organic linker is the most significant factor contributing to the stability, structure and conducting properties of the new generation of superconductors.

Therefore, MOFs with new metal-binding units that give rise to high structural diversity and semiconductivity are needed. Provision of such semiconductive MOFs that enable high structural diversity would also make it possible to use such MOFs in other semiconductive applications and products requiring semiconductive materials, such as thin films on surfaces, optoelectronic applications, solar panels, printed electronics such as screen printing, flexography, gravure, offset lithography, and inkjet. In particular, such semiconductive MOFs could be used and incorporated into photovoltaic devices and solar cells, such as dye-sensitized solar cells (DSSCs).

Since the principle of photovoltaic devices is transducing optical signals into electronic circuits, the most straightforward strategy to utilize MOFs in photovoltaic applications is using them as the photoactive materials. To this end, MOFs should possess decent light-harvesting capability in the region from visible light to near-infrared (NIR). Given that the electronic configuration of MOFs is contributed by both the constituent metal ion and the organic linker, the resultant bandgap ($E_g$) and semiconducting properties of MOFs can thus be tailored by their composition engineering. Basically, the material's light-harvesting window is primarily determined by its $E_g$. Therefore, synthesizing a MOF with a suitable $E_g$ that can absorb light in the solar spectrum is a prerequisite for it to serve as the photoactive material. Owing to the full shell of the metal ion and low conjugation of the organic linker, MOFs usually possess a relatively large $E_g$ that cannot effectively absorb light in the solar spectrum. For example, isoreticular MOFs (IRMOFs), consisting of $Zn^{2+}$ ions with a full d shell which were coordinated with aromatic carboxylate linkers, generally possess large $E_g$s, which makes them only absorb UV radiation.

Utilizing MOFs and MOF-derived materials in photovoltaic applications has become an emerging subfield in recent years. Engineering the structures of MOFs to afford suitable $E_g$s and satisfactory semiconducting properties is being explored to improve the photovoltaic properties of MOFs themselves. Specific applications and efforts comprise the use of MOF materials in DSSCs, PVSCs, and OSCs to enhance their performance and stability. Designing electrically conducting MOFs with proper photoactive units is one of the solutions for photovoltaic applications of MOFs, but the examples of electrically conducting MOFs are still very limited to date; research efforts on developing more functional conducting MOFs are still required, as review by Chueh et al. (J. Mater. Chem. A, 2019, 7, 17079-17095).

The use of a Co-containing MOF as electrode material in a supercapacitor has been described for example in CN108492999A. However, the described MOF comprises as an organic linker terephthalic acid, comprising a carboxylate groups as metal binding groups. Such MOFs have have suboptimal properties for semiconductive applications.

US2015/175518A1 describes MOFs comprising a metal atoms selected among copper, cobalt, zing, nickel and others, and organic linkers with functional groups such as —$PO_3H$ and $AsO_3H$. However, these components are provided in the context of long lists requiring combination of features from several list to arrive at a MOF corresponding to a MOF as described herein. Furthermore, there is no disclosure of properties or features of such components that would prompt a skilled person to use such MOFs in the context of a semiconductive application or device.

US2019/0211043A1 describes MOFs containing organic linkers with ortho-diimine groups as conductive material for use in the context of chemical sensors or capacitors. However, no MOFs comprising of P and As in the functional groups of the organic linkers are described.

In light of the prior art, there is a significant need to provide semiconductive MOFs with suitable band gap values for photovoltaic applications. Furthermore, there remains a significant need in the art to provide improved electrodes for the electrically additional means for construction of electrochemical double layer capacitors and/or supercapacitors that comprise a material with a high porosity and surface area to mass ratios that also provides the high conductivity required supercapacitor applications. Preferably, this material of the electrodes should be highly stable and exhibit high resistance against high temperatures and corrosion.

SUMMARY OF THE INVENTION

In light of the prior art the technical problem underlying the present invention is to provide an alternative and/or improved electrode suitable for constructing an electrochemical double layer capacitor and/or supercapacitor. Furthermore, the technical problem also relates to the provision of semiconductive MOFs that enable high structural diversity for use in semiconductive applications and as components of semiconductive products.

This problem is solved by the features of the independent claims. Preferred embodiments of the present invention are provided by the dependent claims.

In a first aspect, the invention therefore relates to an electrode suitable for constructing an electrochemical double layer capacitor and/or supercapacitor and comprising as an electrode material a metal organic framework (MOF), wherein the MOF comprises an inorganic building unit (IBU) comprising (a.) metal atoms selected from group 1 to group 12 elements, and (b.) functional groups of organic linkers comprising oxygen (O) and one or more atoms selected from the group comprising phosphorus (P), arsenic (As), antimony (Sb), silicon (Si), selenium (Se) and bismuth (Bi).

In a second aspect, the invention relates to the use of the MOFs disclosed herein in semiconductive applications. Furthermore, the invention relates to products requiring semiconductive materials, such as solar cells, photovoltaic devices, thin films on surfaces, optoelectronic applications, solar panels, printed electronics such as screen printing, flexography, gravure, offset lithography, and inkjet. The specific MOFs and features of MOFs disclosed herein can be used in all kinds of semiconductive applications disclosed herein and are herewith also disclosed as materials not only of electrodes suitable for constructing an electrochemical double layer capacitor and/or supercapacitor, but also as material of photovoltaic devices, such as solar cells, or optoelectronic devices.

In embodiments, the inorganic building units, which may also be called metal-based inorganic groups of the MOF or secondary building units, are molecular, one-dimension, two-dimensional or three-dimensional.

It was completely unknown and unexpected that MOFs comprising inorganic building units as described by the present invention are conductive and have low band gap values that enables them to be used as electrode material, for example in an electrochemical double layer capacitor and/or supercapacitor. Furthermore, these conductive properties make them an interesting material to be used in other semiconductive applications, such as optoelectronic applications and photovoltaic applications, including solar cells.

This is particularly the case for MOFs comprising as a metal atom of the inorganic building unit Zn, Cu, Ni or Co and as a functional group of the organic linker phosphonate, arsonate, phosphonic acid, phosphinic acid, arsonic acids and/or arsenic acids, monoester and/or diester forms thereof.

In preferred embodiments, the metal atom of the inorganic building unit is Ni. In preferred embodiments, the metal atom of the inorganic building unit is Cu. In preferred embodiments, the metal atom of the inorganic building unit is Zn. In preferred embodiments, the metal atom of the inorganic building unit is Co.

In preferred embodiments, the IBUs of the MOF comprise as a functional group of the organic linker a phosphonic acid group. As shown in the examples, multiple different MOFs comprising organic linkers with phosphonic acid groups interacting with a metal atom in the IBU of the MOFs, for example with Co, Zn, Cu or Ni, have semiconductive properties and are therefore highly suitable for semiconductive applications and can be used as for example electrode material in supercapacitors. Similarly, organic linkers with arsenic acid groups also have semiconductive properties and are therefore equally well suited for such semiconductive applications.

It was thought at the time of the present invention that such MOFs have insufficient conductive properties for such applications and were therefore not considered as electrode material or material suitable for other semiconductive applications.

However, as disclosed herein, MOFs as claimed by the present invention have the low band gap values and display excellent electrical conductivity, which makes them an advantageous electrode material. Furthermore, the MOFs of the invention are extremely stable, in particular in the presence of electrolytes, humidity, acidic medium and water.

MOFs comprising phosphonic acid derivatives is a recently developing research area and there are only a few porous phosphonate-MOFs currently reported in the literature. Therefore, many properties of porous phosphonate-MOFs are still unknown. Therefore, conductive properties of phosphonate-MOFs have not been studied until now and there is no reported conductivity study concerning the MOFs of the present invention and in particular phosphonate-MOFs and porous arsonate-MOFs. Accordingly, there has been no reliable information concerning the conductivity of the MOFs of the present invention and in particular phosphonate-MOFs and porous arsonate-MOFs.

Phosphonate-MOFs are distinct family of MOFs, in which the metal coordination is achieved via phosphonate metal binding functional group. Phosphonate-MOFs are unique with respect to their exceptional chemical and thermal stabilities, and structural richness due to their rich metal binding modes.

When the connectivity of organophosphonate linkers is achieved via a metal center, the resulting phosphonate-MOFs can produce even lower band gap values, more metallic behavior and better conductivities. Therefore, combination inorganic building units with aromatic phosphonic acid linkers could produce advantageous conductive behavior. In addition, the delocalization of fully and mono-deprotonated phosphonate electrons could also lead conductive properties in the presence of d orbitals.

To date, electrical conductivity of phosphonate-MOFs has not been studied and there is no information about the electrical conductivity properties of porous metal organophosphonates in the literature. Organoarsonate compounds provide analogous binding modes and structural properties with phosphonates and they are expected to produce similar properties with phosphonates. Porous arsonate-MOFs are hitherto unknown in both patent and scientific literature. Metal phosphonates and arsonates are known for their extreme thermal and chemical stabilities. [*An ultrastable zirconium-phosphonate framework as bifunctional catalyst for highly active $CO_2$ chemical transformation*, C. Gao, J. Ai, H. Tian, D. Wub and Z. Sun, *Chemical Communications*, 2017, 53, 1293-1296; *Metal-organic solids derived from arylphosphonic acids*, G. Yücesan, Y. Zorlu, M. Stricker and J. Beckmann, *Coordination Chemistry Reviews*, 2018, 369, 105-122].

Phosphonate-MOFs differ from traditional MOFs with their exceptional thermal/chemical stabilities. They are also stable in the presence of acids. A recent report about zirconium arylphosphonates claim that they are even chemically stable in aqua regia. Phosphonate-MOFs are usually thermally stable above 400° C., while conventional MOFs constructed using carboxylate and ortho-diimine metal binding functional groups usually totally decompose between ca. 400 and 500° C. Therefore, supercapacitors constructed using the phosphonate and arsonate metal binding groups and phosphorus containing inorganic building units are much more stable and enable longer usage time of electrodes of the invention compared to the conventional MOFs constructed using carboxylate and ortho-diimine metal binding functional groups. When fully deprotonated, phosphonate and arsonate groups possess strong electron delocalization and −2 negative charge. Such properties at the metal binding functional group contribute to the electrical conductivity and the stability of the porous MOF structure.

Importantly, the presence of d orbitals in phosphorus and arsenic in the functional group helps delocalize electrons on one-dimension, two-dimensional or three-dimensional inorganic building units and contributes to the conductive behavior of the MOFs of the invention.

Therefore, MOFs comprising phosphonates, arsonates, phosphinates etc. are more advantageous compared to the conventional MOFs constructed using carboxylates, ortho-diimine functional groups etc. Such properties of porous phosphonate-MOFs have not been reported. In addition, P and As are conductive elements while metal binding functional groups of traditional MOFs comprising C and N are not conductive elements and their conductivity is relied on the delocalization of electrons in the organic linkers. In addition, P and As have d orbitals and they are electron rich compared to the C and N containing metal binding functional groups.

Copper coordinated [$\{Cu_2(4,4'\text{-bpy})_{0.5}\}$(1,4-naphthalene-diphosphonate (NDPA))] (TUB75) has band gap value of about 1.4 eV. Zinc coordinated [$Zn\{N(CH_3)_2\}$(6-bromonapthalene-2-yl)phosphonate] has band gap value of about 0.8 eV. The presence and identity of metal ions and organic linkers in phosphonate-MOFs can be used as a tool to optimize or engineer the band gap modulations and conductivity.

MOFs are metal organic solids or coordination polymers composed of molecular, one-dimensional or two-dimensional inorganic building units, which are also called metal-based inorganic groups or secondary building units of the MOF, which are connected by the geometrical cores (also called organic cores) or the organic linkers to form the metal organic framework.

Organic linkers are also referred as organic ligands or bridging ligands or struts. Organic linkers are attached or bound to the metal atoms through functional groups of the organic linkers.

In embodiments, the inorganic building units can be molecular, one-dimensional, two-dimensional, or three-dimensional building blocks composed of the metal ions and elements of the metal binding functional group of the organic linker (strut). For example, an inorganic building unit of a phosphonate MOF includes a metal atom, preferably an ion, P and O. The MOFs can be constructed using auxiliary linkers (also called auxiliary ligands), which are linking several inorganic building units through interaction with the metal atoms. Interaction of the auxiliary linkers and the metal atoms of the inorganic building unit can occur via a functional group of the auxiliary linker, which can preferably comprise a nitrogen (N) atom. In embodiments of the invention, the MOF comprises an auxiliary linker comprising N, preferably the auxiliary linker is preferably the auxiliary linker is a pyridine or a bipyridine such as a 1,4-pyridine, or a 4,4'-bipyridine or a, 4,4'-(1,4-phenylene) bispyridine.

In the context of the invention, the metal atoms and the functional groups of the organic linkers can be bound to each other through covalent bonding, coordinate covalent bonding and/or an ionic bonding.

In the case of a phosphonate MOF, both coordinate bonds and ionic bonds can occur at the same time or separately and together as well. This behavior is also the same for conventional carboxylate-MOFs. The advantage of phosphonate or arsonate-MOFs or the present invention in comparison to organic linkers comprising carboxylates or single nitrogen donating functional groups is that they have −2 net charge $(R-PO_3)^{2-}$ and $(R-AsO_3)^{2-}$ when they are fully deprotonated, which indicates that they form stronger ionic bonds with metals compared to the conventional carboxylate-MOFs, which has −1 net charge when it is deprotonated.

Furthermore, the MOFs of the invention can be porous or non-porous, preferably the MOFs are porous. It is an important advantage of the electrodes of the invention that they can comprise as an electrode material porous MOFs as described herein, since porous MOFs provide the high surface to mass ratios as well as excellent conductivity, which makes them a preferred electrode material for use in supercapacitor applications. Preferably, the MOFs are an active electrode material.

In embodiments of the invention, the MOFs have the surface to mass ratio of more than 7000 $m^2/g$. However, due to their good conductivity the MOFs or the present invention are also suitable with lower surface to mass ratios. In embodiments of the invention, the MOFs have the surface to mass ratio of more than 1, 25, 50, 75, 100, 125, 150, 175, 200, 225, 250, 275, 300, 325, 350, 375, 400, 425, 450, 475, 500, 550, 600, 650, 700, 750, 800, 850, 900, 950, 1000, 1100, 1200, 1300, 1400, 1500, 1600, 1700, 1800, 1900, 2000, 2100, 2200, 2300, 2400, 2500, 2600, 2700, 2800, 2900, 3000, 3100, 3200, 3300, 3400, 3500, 3600, 3700, 3800, 3900, 4000, 4100, 4200, 4300, 4400, 4500, 4600, 4700, 4800, 4900, 5000, 5100, 5200, 5300, 5400, 5500, 5600, 5700, 5800, 5900, 6000, 6100, 6200, 6300, 6400, 6500, 6600, 6700, 6800, 6900, 7000, 7100, 7200, 7300, 7400, 7500, 7600, 7700, 7800, 7900 or 8000 $m^2/g$.

In photovoltaic applications, the MOFs as disclosed herein do not have to be porous and depending on the embodiments low porosity can be advantageous. In supercapacitor applications, MOFs with high porosity are preferred to increase the electrode surface area. Importantly, MOFs with smaller surface areas can be advantageous, since they often display increased stability and durability while still providing good conductivity and capacitance.

The present invention is based on the entirely surprising development that it is possible to synthesize porous MOFs as described herein, which have the required properties to serve as an electrode material which displays good conductivity. The required functional groups of the organic linkers that form for example porous arsonates can be synthesized using precursor p-di-methylarsonato-phenylboronic acid. Furthermore, in embodiments such organic arsonate-linkers can be synthesized using the methods described by Bart and Scheller. Suzuki Cross Coupling reaction could also be used to produce extended tether lengths of the arylphosphonic acid and arylarsonic acid linkers. [*Synthesis of Some Di- and Tetraphosphonic Acids by Suzuki Cross-Coupling*, A. Schütrumph, A. Duthie, E. Lork, G. Yücesan and J. Beckmann, Z. Allgem. Anorg. Chem., 2018, 644 (19), 1134-1142; *Substituted phenylarsonic acids, structures and spectroscopy*, N. C. Lloyd, H. W. Morgan, B. K. Nicholson, R. S. Ronimus, Journal of Organometallic Chemistry, 2008, 693, 2443-2450; *The Preparation of Aromatic Arsonic and Arsinic Acids by the Bart, Bechamp, and Rosenmund Reactions*, C. S. Hamilton, J. F. Morgan, In Organic Reactions; John Wiley & Sons, Inc., 2004; pages 415-454]. MOFs comprising arsonic acids as organic linkers can be synthesized via the same hydrothermal, solvothermal reactions used to synthesize phosphonate MOFs and also via mechanochemistry.

Furthermore, so far, no phosphonate or arsonate MOFs have been reported that have conductive properties either through conducting inorganic building units and highly conjugated aromatic linkers such as with naphthalene, anthracene, pyrene cores or with aromatic organic cores. Furthermore, no conductive properties have been reporter for MOFs comprising for example molybdenum, silver, rubidium, iridium, copper, nickel, cobalt, iron, zinc, cadmium, vanadium, manganese, a lanthanide or strontium oxides etc.

Therefore, the present invention comprising as an electrode material MOFs constructed using organic linkers possessing, for example, phosphonate and/or arsonate functional groups, or functional groups possessing P and/or As elements, or bases having P, As, Sb, Si and/or Bi in their backbones, or their monoesters and/or diesters in combination with metal ions capable of forming coordination bonds with Lewis bases, represent an entirely unexpected innovation in light of the prior art.

In embodiments of the invention, the MOF comprises a plurality of metal atoms or metal ions each coordinated with at least one ligand/organic linker. In embodiments of the invention, the MOF comprises one metal ions or metal atom coordinated with at least one ligand/organic linker. In embodiments, the MOF comprises a plurality of inorganic building units. In embodiments, the MOF comprises one inorganic building unit. In some embodiments, a portion of the metal ions or metal atom are associated with one, two, three, or four ligands. Such ligands can be functional groups of organic linkers and/or auxiliary linkers. Each of these ligands can be individually associated with one, two, three, or four metal ions or metal atoms. In some embodiments, a portion of the metal ions or atoms is associated with two ligands, and each of those ligands is individually associated with two metal ions or atoms. In some embodiments, a portion of the metal ions or atoms are associated with three ligands, and each of those ligands is individually associated with three metal ions or atoms. In some embodiments, a portion of the metal ions or atoms are associated with two ligands, and each of those ligands is individually associated with three metal ions or atoms. In some embodiments, a ligand is charged. In some embodiments, a ligand has a charge of (−1), (−2), (−3), (−4), (−5), (−6), (−7), (−8), (−9), (−10), (−11) or (−12). In some embodiments, a ligand has a charge of (−4). In some embodiments, a ligand doesn't have a charge.

Furthermore, the MOFs of the invention can comprise auxiliary linkers, wherein the auxiliary linkers preferably comprise organoimine groups or a Lewis base comprising a group 15 element. Preferably, the auxiliary linkers can comprise 1,4-pyridine, 4,4'-bipyridine or a, 4,4'-(1,4-phenylene)bis-pyridine or longer versions (tethers). The position of the nitrogen in such auxiliary linkers can be also meso and ortho. Auxiliary linkers could be secondary organophosphonic acids or organoarsonic acids as well. Solvent molecules such as water, ethanol, DMF, etc. could also behave as auxiliary linkers.

Embodiments Specifying the Functional Groups of the Organic Linkers of the MOF

In embodiments of the invention, the functional groups of the organic linkers comprise one or more atoms selected from selected from group 14, 15 and 16 elements. In embodiments, functional groups of the organic linkers comprise one or more atoms selected from selected from group 14, 15 and 16 elements.

In embodiments, the functional groups of the organic linkers comprise oxygen (O) and one or more atoms selected from the group comprising phosphorus (P), arsenic (As), antimony (Sb), silicon (Si), selenium (Se) and bismuth (Bi).

In embodiments of the invention, the organic linkers comprise one or more atoms selected from the group comprising phosphorus (P), arsenic (As), antimony (Sb), silicon (Si) and bismuth (Bi), and nitrogen (N). In embodiments, functional groups of the organic linkers comprise atoms selected from the group comprising phosphorus (P), arsenic (As), antimony (Sb), silicon (Si) and bismuth (Bi), and nitrogen (N).

Particularly preferred are embodiments, wherein the functional groups of the organic linkers comprise phosphorus and arsenic. In embodiments of the invention, the functional groups of the organic linkers comprise one or more atoms selected from the group comprising phosphorus (P), arsenic (As), antimony (Sb), silicon (Si) and bismuth (Bi), and nitrogen (N). Particularly preferred are embodiments, wherein the functional groups of the organic linkers comprise phosphorus and arsenic.

Phosphorus and arsenic possess d orbitals and they have electrical conductivities $1 \times 10^7$ S/m and $3.3 \times 10^6$ S/m, respectively, which are comparable to transition metal Ions and way higher than the carbon in carboxylate and the nitrogen in nitrogen donating linkers. Accordingly, MOFs comprising organic linkers with functional groups comprising atoms of these elements are particularly advantageous for constructing electrodes of the present invention. Similarly, antimony has $2.5 \times 10^6$ S/m, silicon has $1 \times 10^3$ S/m, bismuth has $7.7 \times 10^5$ S/m conductivities. Therefore, the preferred elements could make better conducting MOFs. Phosphonate and arsonate metal binding groups provide exceptionally rich metal binding modes. Therefore, phosphonate MOFs and arsonate MOFs provide lots of space for optimization of conductivity via engineering their metal binding modes of the phosphonate and arsonate linkers. Phosphonate-MOFs is a recently emerging family of MOFs and many properties of phosphonate-MOFs such electrical conductance are not known.

In a further embodiment, the functional groups of the organic linkers are selected from the group comprising phosphonate, arsonate, phosphonic acid, phosphinic acid, arsonic acids and/or arsenic acids, monoester and/or diester forms thereof, preferably phosphonate and/or arsonate and/or monoester and/or diester forms thereof.

In embodiments of the invention, the organic linkers comprise aromatic phosphonic acids and aromatic arsonic acids, as shown in the following Tables 1 and 2. In the structural formulas of Tables 1 and 2, R' can be H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

In preferred embodiments, all R' of a structural formula listed in Tables 1 or 2 are H.

TABLE 1

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| [Benzene ring with four R' substituents and two phosphonic acid groups (P(=O)(OH)$_2$) at the 1,4-positions] | Formula No. 1<br>1,4-benzenediphosphonic acid |
| [Benzene ring with three R' substituents and three phosphonic acid groups (P(=O)(OH)$_2$) at the 1,3,5-positions] | Formula No. 2<br>1,3,5-benzenetriphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
| --- | --- |
| 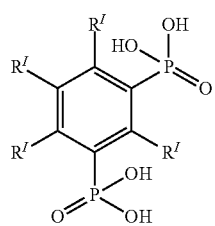 | Formula No. 3<br>1,3-benzenediphosphonic acid |
| 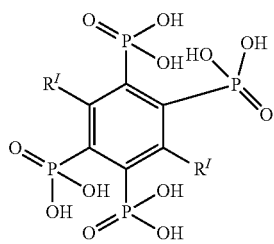 | Formula No. 4<br>1,2,4,5-benzenetetraphosphonic acid |
| 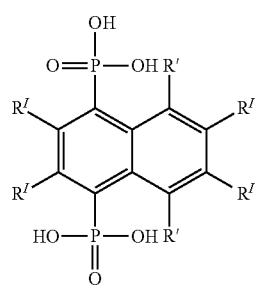 | Formula No. 5<br>1,4-naphthalenediphosphonic acid |
| 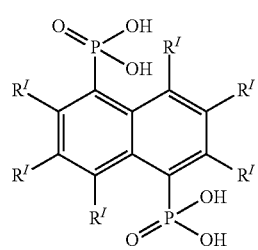 | Formula No. 6<br>1,5-naphthalenediphosphonic acid |
| 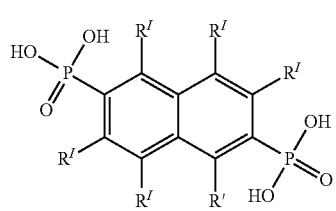 | Formula No. 7<br>2,6-napthalenedisphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| | Formula No. 8<br>9,10-anthracenediphosphonic acid |
| | Formula No. 9<br>1,3,6,8-pyrenetetraphosphonic acid |
| | Formula No. 10<br>pyrene-1,3,6,8-tetrakis-p-phenylphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
| --- | --- |
| 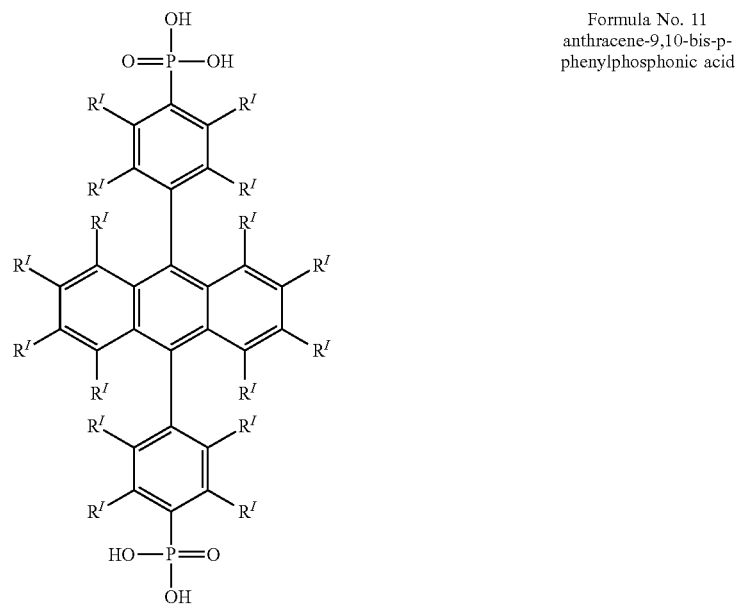 | Formula No. 11 anthracene-9,10-bis-p-phenylphosphonic acid |
| 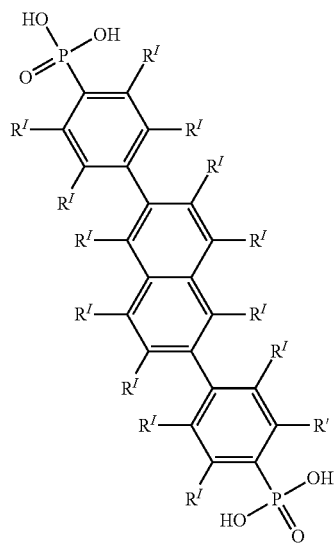 | Formula No. 12 naphthale-2,6-bis-p-phenylphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| 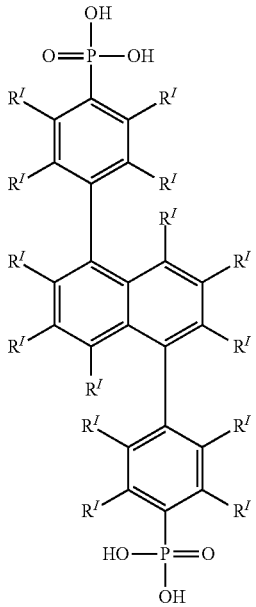 | Formula No. 13<br>naphthale-1,5-bis-p-phenylphosphonic acid |
| 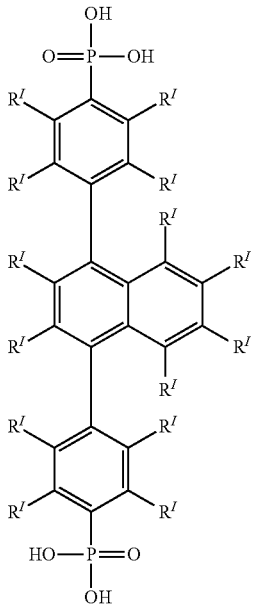 | Formula No. 14<br>naphthale-1,4-bis-p-phenylphosphonic acid |

TABLE 1-continued

Preferred non-limiting examples of aromatic phosphonic acids that can be comprised by the organic linkers of the MOFs of the invention. R' can be, H, F, Cl, Br, I, NO$_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
| --- | --- |
| 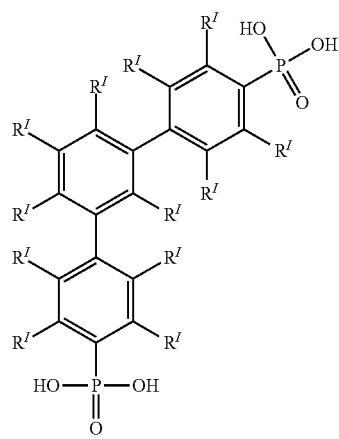 | Formula No. 15<br>benzene-1,3-bis-p-phenylphosphonic acid |
| 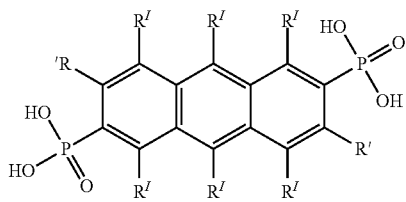 | Formula No. 16<br>P,P'-2,6-anthracenediylbisphosphonic acid |
| 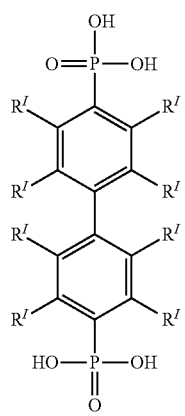 | Formula No. 17<br>4,4'-biphenyldiphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| | Formula No. 18<br>Methane tetra-p-phenylphosphonic acid |
| | Formula No. 19<br>Silane tetra-p-phenylphosphonic acid |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| 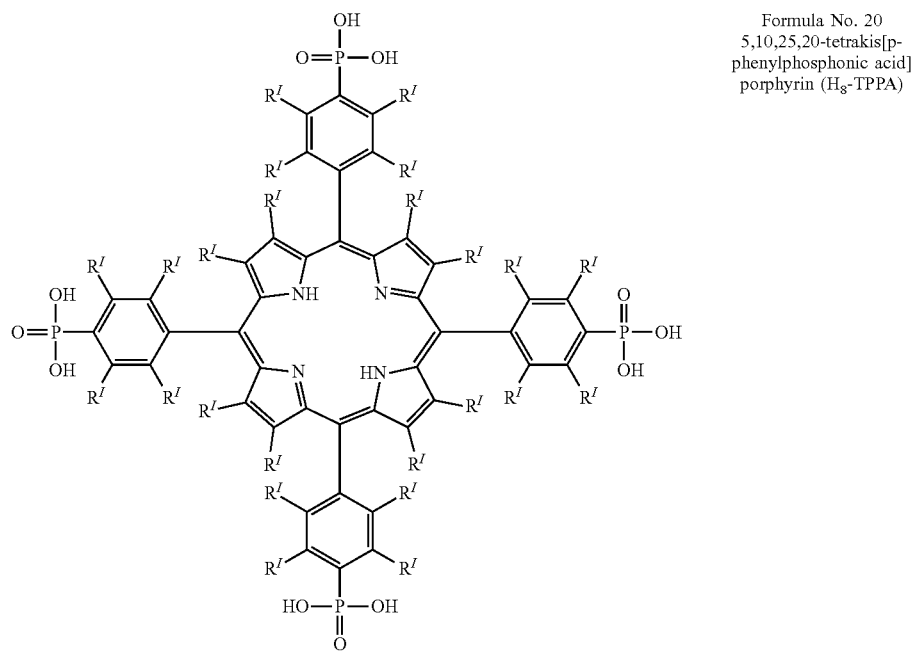 | Formula No. 20<br>5,10,25,20-tetrakis[p-phenylphosphonic acid] porphyrin ($H_8$-TPPA) |
| 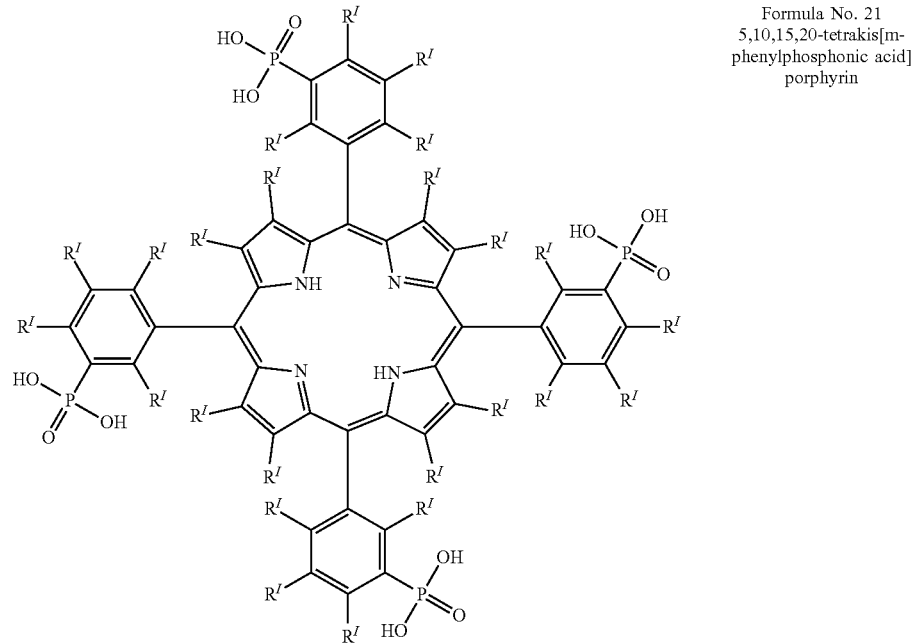 | Formula No. 21<br>5,10,15,20-tetrakis[m-phenylphosphonic acid] porphyrin |

TABLE 1-continued

Preferred non-limiting examples of aromatic phosphonic acids that can be comprised by the organic linkers of the MOFs of the invention. R' can be, H, F, Cl, Br, I, $NO_2$ and/or alkyl, aryl, phosphonic acid, aliphatic phosphonic acids including methylphosphonic acid, ethylphosphonic acid, aryl-phosphonic acids, including phenylphosphonic acid, arsonic acids, aliphatic arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structural formula of aromatic phosphonic acid | Formula No. |
|---|---|
| 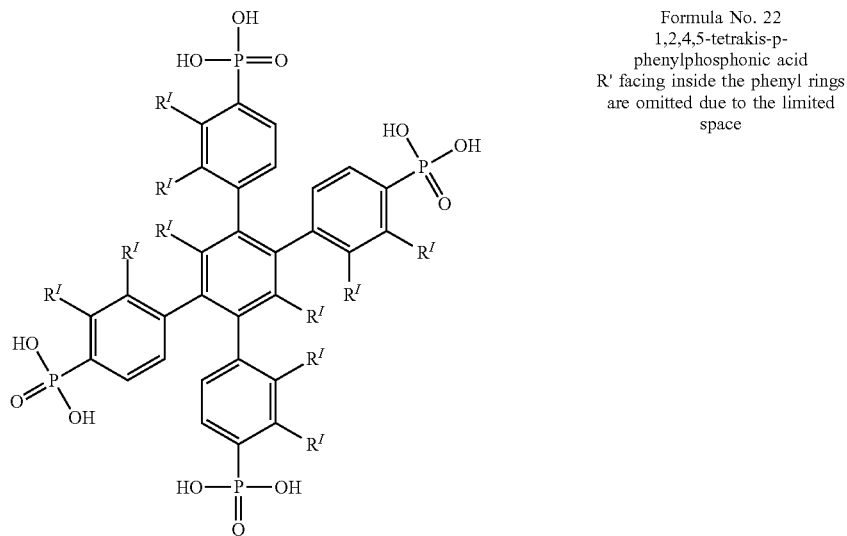 | Formula No. 22<br>1,2,4,5-tetrakis-p-phenylphosphonic acid<br>R' facing inside the phenyl rings are omitted due to the limited space |

TABLE 2

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
|  | Formula No. 23<br>1,4-benzenediarsonic acid |
| 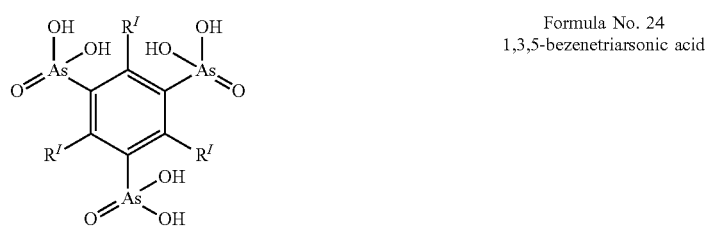 | Formula No. 24<br>1,3,5-bezenetriarsonic acid |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
| | Formula No. 25<br>1,3-benzenediarsonic acid |
| | Formula No. 26<br>1,2,4,5-benzenetetraarsonic acid |
| | Formula No. 27<br>1,4-napthalenediarsonic acid |
| | Formula No. 28<br>1,5-naphthalenediarsonic acid |
| | Formula No. 29<br>2,6-naphthalenediarsonic acid |

TABLE 2-continued

Preferred non-limiting examples of aromatic arsonic acids that can be comprised by the organic linkers of the MOFs of the invention. R' can be H, F, Cl, Br, I, NO$_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
| --- | --- |
| | Formula No. 30<br>9,10-anthracenediarsonic acid |
| | Formula No. 31<br>1,3,6,8-pyrenetetraarsonic acid |
| | Formula No. 32<br>pyrene-1,3,6,8-tetrakis-p-phenylarsonic acid |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
| 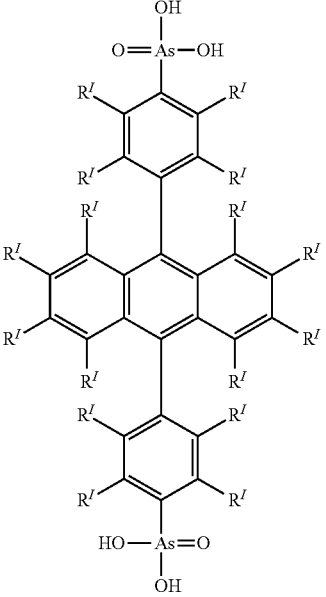 | Formula No. 33 anthracene-9,10-bis-p-phenylarsonic acid |
| 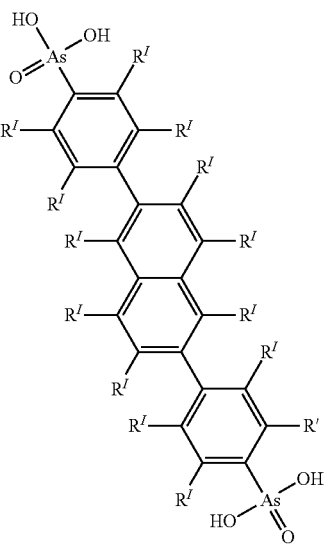 | Formula No. 34 naphthale-2,6-bis-p-phenylarsonic acid |

TABLE 2-continued

Preferred non-limiting examples of aromatic arsonic acids that can be comprised by the organic linkers of the MOFs of the invention. R' can be H, F, Cl, Br, I, NO$_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
| --- | --- |
| 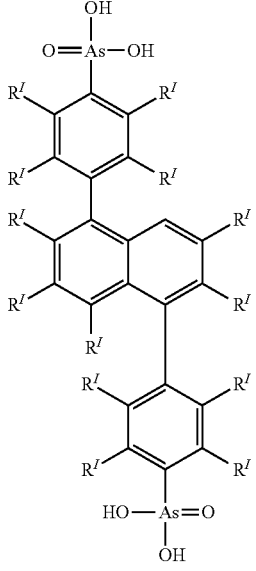 | Formula No. 35<br>naphthale-1,5-bis-p-phenylarsonic acid |
| 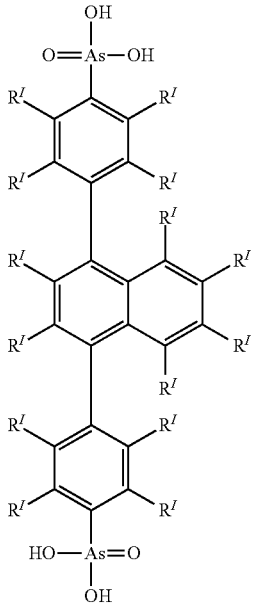 | Formula No. 36<br>naphthale-1,4-bis-p-phenylarsonic acid |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
| --- | --- |
| | Formula No. 37<br>benzene-1,3-bis-p-phenylarsonic acid |
| | Formula No. 38<br>P,P'-2,6-anthracenediylbisarsonic acid |
| | Formula No. 39<br>4,4'-biphenyldiarsonic acid |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
| | Formula No. 40<br>Methane tetra-p-phenylarsonic acid |
| 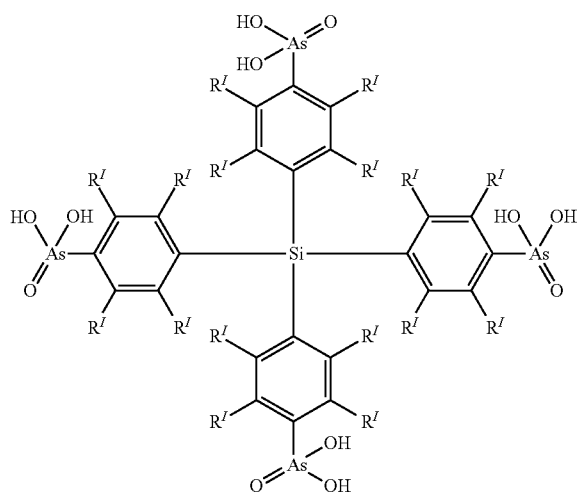 | Formula No. 41<br>Silane tetra-p-phenylarsonic acid |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
| | Formula No. 42<br>5,10,15,20-tetrakis[p-phenylarsonic acid]porphyrin |
| | Formula No. 43<br>5,10,15,20-tetrakis[m-phenylarsonic acid]porphyrin |

TABLE 2-continued

Preferred non-limiting examples of aromatic arsonic acids that can be comprised by the organic linkers of the MOFs of the invention. R' can be H, F, Cl, Br, I, $NO_2$ and/or alkyl, aryl, phosphonic acid, alkylphosphonic acids including methylphosphonic acid, ethylphosphonic acid, aryl-phosphonic acids, including phenylphosphonic acid, arsonic acids, alkylarsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas.

| Structure of aromatic acid | Formula No. |
|---|---|
| [structure diagram] | Formula No. 44<br>1,2,4,5-tetrakis-p-phenylarsonic acid<br>R' facing inside the phenyl rings omitted due to the limited space |

In preferred embodiments, the organic linkers of the MOFs of the present invention are selected from the organic linkers of Tables 1 and 2 and FIG. 2.

A single fully deprotonated phosphonate and arsonate metal binding unit provides −2 negative charge. Therefore, they form stronger ionic bonds with the metal ions compared to carboxylates or ortho-diimine functional groups. A P—C bond requires high energy to break down. Therefore, phosphonate and arsonate MOFs could be more stable compared to the conventional carboxylate and ortho-diimine MOFs. Lower electronegativities of P and As elements make the electrons on phosphonate and arsonate oxygens more readily available to make coordinate covalent bonds and ionic bonds. The presence of d orbitals in P and As could also facilitate extended conjugation in MOFs and promote through-bond pathways of conductivity. Phosphonates and arsonates have extremely rich metal binding modes creating distinct and richer properties. The delocalization of phosphonate and arsonate electrons and presence of d orbitals could provide superior conductivity.

In another embodiment, the functional groups of the organic linkers comprise arsonate and are synthetized using p-dimethylarsenato-phenylboronic acid, m-dimethylarsenato-phenylboronic acid and/or o-dimethylarsenato-phenylboronic acid. They can be also synthesized using Pd and Ni catalyzed Arbuzov reactions and conventional Arbuzov reactions.

The use of functional groups of organic linkers bearing the P and As atoms and the MOFs constructed using such linkers as electrode material for construction EDLCs and supercapacitors or in other devices and applications requiring semiconductive materials is advantageous, since such MOFs surprisingly could provide better electrical conductivities, larger and even adjustable surface areas in comparison to known electrode materials used in supercapacitor construction. Phosphonate and arsonate MOFs have higher thermal decomposition rates and excellent chemical stability among the known MOFs and they are resistant to humidity and corrosion. For some of these MOFs, such as $ZrH_4$-STPPA (STPPA=silane tetra-p-phenylphosphonic acid), it has even been shown that they are chemically stable in aquaregia. [10] The MOFs described herein in the context of the invention, and in particular phosphonate and arsonate MOFs, provide all of the desired properties of the most optimum active electrode materials to construct supercapacitors based on EDLCs.

Further embodiments of the invention, the organic linkers of the MOFs comprise geometrical cores that can be any of linear shaped, V-shaped, L-shaped, T-shaped, X-shaped, Y-shaped, tetragonal or hexagonal. Linkers can comprise aromatic structures, such as benzene, biphenyl, triphenyl, naphthalene, anthracene, pyrene, phthalocyanine, porphyrin, carbazole cores and other conjugated fluorescent cores, such as acridine, BODIPY, cyanine or cyanine derivatives, coumarine or coumarine derivatives, xanthene or xanthene derivatives such as fluorescein or rhodamine. Linkers can also comprise methane, silane and adamantine etc. Examples of such linkers are displayed in FIG. 2. Preferred examples include, without limitation, 1,4-benzenediphosphonic acid, 1,4-naphthalenediphosphonic acid, 1,5-naphthalenediphosphonic acid, 1,4-phenyldiphosphonic acid, methane tetra-p-phenylphosphonic acid (MTPPA), silane tetra-p-phenylphosphonic acid (STPPA), 5,10,15,20-tetrakis[p-phenylphosphonic acid] porphyrin ($H_8$TPPA), methane tetra-m-phenylphosphonic acid, silane tetra-m-phenylphosphonic acid, 5,10,15,20-Tetrakis[m-phenylphosphonic acid] porphyrin (m-$H_8$TPPA), 1,2,4,5-tetrakis(p-phosphonatophenyl)benzene, tetrabiphenylsilane tetrakis-4-phosphonic acid, 1,3,6,8-tetrakis(p-phosphonatophenyl)pyrene, 4,4'-bis(p-phosphonatophenyl)biphenyl, 9,10-bis(p-phosphonatophenyl)anthracene etc.

The presence of metal phosphonate inorganic building units has been found to be an important factor contributing to the conductive properties of phosphonate MOFs. Therefore, the MOFs, which are constructed using the phosphonic acids with aliphatic hydrocarbon cores, could also produce conductivity. Such linkers include methylenediphosphonic acid, 1,2-ethylenediphosphonic acid, 1,3-propylenediphosphonic acid, 1,4-butylenediphosphonic acid, 1,5-pentanediphosphonic acid, 1,6-hexylenediphosphonic acid, 1,7-heptylenediphosphonic acid, 1,8-octylenediphosphonic acid, 1,9-nonanediphosphonic acid, 1,10-decanediphosphonic acid, their arsonic acid, phosphinic acid derivatives etc. Furthermore, phosphonic acid, arsonic acid, their monoesters, and phosphinic acid metal binding units could have alkylene linkage between aromatic core and the metal binding unit (see examples of a alkylene linkage in FIG. 28 and aliphatic phosphonic acid and arsonic acid linkers can be seen in FIG. 29).

In some embodiments, more than one type of organic linkers may be employed, for example, a first type of organic linker and a second type of organic linker. The two or more types of organic linkers may be provided in any suitable ratio. The two or more types of organic linkers may be provided in any suitable ratio.

Embodiments Specifying the Metal Atoms of the Inorganic Building Unit (IBU)

In embodiments of the invention, the metal atoms selected from group 1 to group 12 elements. In preferred embodiments, the metal atoms are selected from group 3 to group 12 elements. These metal atoms have high conductance and high phosphonate and arsonate binding affinities.

In embodiments of the invention, the inorganic building units are composed of metal atoms or ions and functional groups of the organic linkers, which comprise oxygen and one or more atoms selected from the group comprising phosphorus (P), arsenic (As), antimony (Sb), silicon (Si), selenium (Se) and bismuth (Bi), preferably P or As. In embodiments, the inorganic building units form one-dimensional chains or two-dimensional sheets. Some examples of IBUs of the invention are displayed in FIGS. 1, 4, 5 and 7.

Molecular or cluster type inorganic building units are discrete and can be connected by organic linkers in the MOF structure, therefore the conductance may be mainly dependent on conjugated organic linkers. The dependence on the organic linkers could reduce the conductivity. One-dimensional and two-dimensional inorganic building units can also provide conjugation, electron delocalization and higher conductivity due to the presence of conductive As, P, Sb elements compared to the MOFs composed of molecular or cluster type inorganic building units.

The one- and two-dimensional inorganic building units may be composed of one or more metal atoms, phosphorus, oxygen atoms and optionally nitrogen atoms, which can be provided by functional groups of auxiliary linkers. The presence of one, two-dimensional, and three-dimensional inorganic building units increases the metallic character and is expected to have a positive impact on the conductivity of the resulting MOF.

In embodiments the inorganic building units comprise transition metal ions of group 3 to group 12 elements.

In embodiments, inorganic building units comprise alkali metals and alkaline earth metals (group 1 and group 2 elements).

Further Embodiments of the Invention

In preferred embodiments metal atoms comprise Zn, Cu and/or Co and the functional groups comprise phosphonate and/or arsonate.

In embodiments, the MOF is [{$Cu_2(4,4'$-bpy$)_{0.5}$}(1,4-naphthalenediphosphonate (NDPA))], [$Co_2(H_4$-MTPPA)]·3NMP·$H_2O$, [{$Cu(H_2O)$}(2,6-NDPA$)_{0.5}$], or [$Zn${$N(CH_3)_2$}(6-bromonapthalene-2-yl)phosphonate].

In further embodiments of the invention, the MOF is [{$Cu_2(4,4'$-bpy$)_{0.5}$}(1,4-naphthalenediphosphonate (NDPA))], or [$Co_2(H_4$-MTPPA)]·3NMP·$H_2O$.

In another embodiment, the MOF is [{$Cu_2(4,4'$-bipyridine$)_{0.5}$}(1,4-naphthalenediphosphonate (NDPA))] and its unique one-dimensional inorganic building unit is composed of copper dimer chains, which is connected by fully deprotonated (1,4-naphthalenediphosphonate)$^{4-}$ and 4,4'-bipyridine linkers to create rectangular void channels. The inorganic building unit of [{$Cu_2(4,4'$-bipyridine$)_{0.5}$}(1,4-naphthalenediphosphonate (NDPA))] can be retained by changing the identity of the organic linkers. The use of other metal ions or atoms than Cu disclosed herein is also possible.

In embodiments, the MOF is selected from the group comprising [{$Cu_2(4,4'$-bpy$)_{0.5}$}(1,4-naphthalenediphosphonate (NDPA))], [$Co_2(H_4$-MTPPA)]·3NMP·$H_2O$, [{$Cu(H_2O)$}(2,6-NDPA$)_{0.5}$], [$Zn${$N(CH_3)_2$}(6-bromonapthalene-2-yl)phosphonate], $Zn_2H_4$MTPPA, $Zn_2H_4$STPPA, [Ni(Cu—$H_4$TPPA)]·2($CH_3)2NH^{2+}$, $Zn_2$($H_4$TPPA), $Zn_2$(Cu—$H_4$TPPA), $Cu_3(H_5$-MTPPA$)_2$, and $K_6$(m-$H_2$-TPPA)·$2H_2O$ or [{$Ca_2$(DMF)}(2,6-NDPA)].

In embodiments, the MOF is synthesized/prepared solvothermally. In particular, $Zn_2H_4$MTPPA, $Zn_2H_4$STPPA, [Ni(Cu—$H_4$TPPA)]·2($CH_3)2NH^{2+}$, $Zn_2(H_4$TPPA), $Zn_2$(Cu—$H_4$TPPA) and $K_6$(m-$H_2$-TPPA)·$2H_2O$, or [{$Ca_2$(DMF)}(2,6-NDPA)] can be prepared solvothermally.

In embodiments, the MOF is synthesized mechanochemically or hydrothermally. Mechanochemical synthesis of MOFs is preferable for large scale synthesis, for example in industrial applications of the present invention.

In embodiments, the MOF comprises an IBU with a M—O—P—O—M—O—P—O ring pattern, where M is the metal atom. Examples of such MOFs are [{Cu(4,4'-bpy$)_{0.5}$(1,4-NDPA-$H_2$)] comprising a Cu—O—P—O—Cu—O—P—O ring pattern, $Zn_2H_4$MTPPA and $Zn_2H_4$STPPA, both comprising 8 membered Zn—O—P—O—Zn—O—P—O rings, [$Zn${$N(CH_3)_2$}(6-bromonapthalene-2-yl)phosphonate] comprising a eight membered ring Zn—O—P—O—Zn—O—P—O, $Cu_3(H_5$-MTPPA$)_2$ comprising Cu—O—P—O—Cu—O—P—O rings as IBUs.

In another preferred embodiment of the invention, the MOF is [$Co_2(H_4$-MTPPA)]·3NMP·$H_2O$, where $H_8$-MTPPA is methane tetra-p-phenylphosphonic acid (see FIG. 2G), NMP is N-methyl-2-pyrrolidone, which is the removable solvent molecule. The inorganic building unit of [$Co_2(H_4$-MTPPA)]·3NMP·$H_2O$ is composed of tetrahedral Co atoms forming corner shared 8 membered Co—O—P—O—Co—O—P—O rings. ($H_4$-MTPPA)$^{-4}$ indicates that is lost four protons. [$Zn_2(H_4$-MTPPA)] and [$Zn_2(H_4$-STPPA)] and $ZrH_4$-STPPA have the same inorganic building unit pattern composed of edge membered rings with different coordination numbers and conformations (The removable solvent molecules have been omitted from the chemical formulas of MOFs).

Preferably, [Co$_2$(H$_4$-MTPPA)]·3NMP·H$_2$O of the invention is prepared solvothermically from the tetrahedral linker tetraphenylmethane tetrakis-4-phosphonic acid (H$_8$-MTPPA) and CoSO$_4$·7H$_2$O in N-methyl-2-pyrrolidone (NMP). Phosphonate and arsonate MOFs can be prepared hydrothermally, solvothermally and mechanochemically.

Other cobalt salts or metal salts can also be used to synthesize this MOF of the present invention. The synthesis can be carried under hydrothermal conditions as well. Another method of preparing would be using mechanochemistry methods without the presence of N-methyl-2-pyrrolidone in the structure holes. NMP and water is only present as solvent molecules in the structure of [Co$_2$(H$_4$-MTPPA)]·3NMP·H$_2$O. they are weakly associated to the original structure of the MOF. [Co$_2$(H$_4$-MTPPA)]·3NMP·H$_2$O can be activated and be available in solvent free forms as well.

Further preferred MOFs that can be used in semiconductive applications, for example as electrode material or material of other products or devices requiring semiconductive materials in the context of the invention, are disclosed in the example section.

In some embodiments, the band gap of the MOF of the electrodes of the invention may be varied, e.g., by changing the substituents about the linker/ligand core or extending the tether lengths of the linkers. Those of ordinary skill in the art will be aware of methods to determine the band gap of a material, for example, optically or through analytical techniques such as UV spectroscopy.

In some embodiments, the band gap of a MOF is preferably between about ~0 eV and about ~2.5 eV. Other ranges are possible. In embodiments, the MOF of the invention has a band gap of less than ~4 eV, such as about 3.9, 3.8, 3.6, 3.5, 3.4, 3.3, 3.2, 3.1, 3.0, 2.9, 2.8, 2.6, 2.5, 2.4, 2.3, 2.2, 2.1, 2.0, 1.9, 1.8, 1.6, 1.5, 1.4, 1.3, 1.2, 1.1, 1.0, 0.9, 0.8, 0.6, 0.5, 0.4, 0.3, 0.2, 0.1 eV. Preferably, the band gap of the MOF is below 2.5, more preferably below 2 eV. Preferred ranges of band gap values of a MOF of the invention include 1.0-1.7 eV.

Importantly, the phosphonate MOFs of the present invention have preferably band gap values in the range of 1.0-1.7 eV, as disclosed in the examples below. Band gap values in this range are particularly advantageous for photovoltaic applications of MOFs, such as in solar cells, and are completely unexpected from the prior art. Almost all conventional MOFs have band gaps above the semiconductive range and are therefore not suitable for the applications disclosed herein, with exception of some randomly reported low band gap MOFs.

For example, the band gap of [{Cu$_2$(4,4'-bpy)$_{0.5}$}(1,4-naphthalenediphosphonate (NDPA))] (TUB75) has been determined to be 1.4 eV using the UV spectroscopy. Further examples of MOFs to be used in the context of the invention with suitable band gap and conductivity values are disclosed in the examples. Based on the present disclosure, it is obvious to a skilled person to construct further examples of MOFs with suitable semiconductive properties. For example, the IBU could be further used to create conductive MOFs with the conjugated arylphosphonic acid and arylarsonic acid linkers as well. The different metal ions can be also used to produce molecular, one-dimensional, two-dimensional and three-dimensional building units with conductive properties.

As the molecular building blocks of the MOFs of the invention can be changed by synthetic manipulations and/or by changing the metal precursor, the MOFs described herein have variable electrical conductivity that can be tuned to be suitable for one or more of the applications described herein. Those of ordinary skill in the art will be aware of methods to determine the conductivity of an MOF. For example, as described in the examples, the electrical conductivity of an MOF may be measured in polycrystalline pellet form and/or in polycrystalline film form. In some cases, a pellet of an MOF may be compressed between two steel rods and subjected to a two-probe direct current measurement.

Preferably, the MOFs of the invention have a high conductivity. Preferably, the MOFs to be used as electrode material in the context of the invention have conductivity of at least 1 S/cm. However, a MOF of the invention can also have a conductivity of less than 1 S/cm. Other conductivity ranges are possible. It is particularly preferred to use MOFs with high conductivities.

In some embodiments of the present invention, the conductivity of a MOF, for example MOF in pellet form or MOF in film having an average thickness of about 500 nm, is at least about 0.1 S/cm, or at least about 0.2 S/cm, or at least about 0.3 S/cm, or at least about 0.4 S/cm, or at least about 0.5 S/cm, or at least about 0.6 S/cm, or at least about 0.8 S/cm, or at least about 1.0 S/cm, or at least about 1.2 S/cm, or at least about 1.5 S/cm, or at least about 1.8 S/cm, or at least about 2 S/cm, or at least about 2.5 S/cm, or at least about 5 S/cm, or at least about 7.5 S/cm, or at least about 10 S/cm, or at least about 12.5 S/cm, or at least about 15 S/cm, or at least about 17.5 S/cm, or at least about 20 S/cm, or at least about 22.5 S/cm, or at least about 25 S/cm, or at least about 30 S/cm, or at least about 35 S/cm, or at least about 40 S/cm, or at least about 45 S/cm, or at least about 50 S/cm, or at least about 60 S/cm, or at least about 70 S/cm, or at least about 80 S/cm, or at least about 90 S/cm, or at least about 100 S/cm, or between about 0.1 S/cm and about 100 S/cm, or between about 0.2 S/cm and about 80 S/cm, or between about 0.3 S/cm and about 50 S/cm, or between about 0.4 S/cm and about 40 S/cm, or between about 0.5 S/cm and about 30 S/cm, or between about 0.1 S/cm and about 20 S/cm. In some cases, the conductivity is measured at room temperature (e.g., about 25° C.). In some cases, the conductivity may have a linear dependence with temperature.

In embodiments, MOFs as disclosed herein can have conductivities of more than 100 S/m (=1 S/cm). For example, the MOF TUB40 has a conductivity of more than 100 S/m, in certain measurements up to 1000 S/m has been determined. MOF TUB75 exhibits directional conductivity ranging between 1000 S/m and 10$^{-3}$ S/m depending on the crystal orientation between the gold relays.

Furthermore, the invention also relates to an electrochemical double layer capacitor comprising an electrode of the invention. Also, the invention comprises a supercapacitor comprising an electrode as described herein.

The features of the MOFs described herein relate to the MOFs as such as well as to the MOFs in the context of a semiconductive application or device, such as an electrode suitable for constructing an electrochemical double layer capacitor and/or supercapacitor or the MOFs of an electrochemical double layer capacitor comprising an electrode of the invention or the MOFs of a supercapacitor comprising an electrode as described herein.

Embodiments of the Invention Relating to Photovoltaic Devices and Semiconductive Applications In a further aspect, the present invention relates to the use of a MOF as disclosed herein as a semiconductor and/or in semiconductive applications. This includes the use of the MOFs in optoelectronic applications and in particular photovoltaic and solar cell applications.

Herein it is reported for the first time that the MOFs described in the present application, in particular the phosphonate MOFs described herein, have properties of semiconductors and can therefore be used as semiconductors in semiconductive applications. Accordingly, the supercapacitors of the invention as well as the photovoltaic devices of the invention are linked by the general concept of using a MOF as disclosed herein as a semiconductive material in the respective device or application.

In the context of the present invention, a semiconductive or semiconductor material has an electrical conductivity value falling between that of a conductor, such as metallic copper, and an insulator, such as glass. Its resistance falls as its temperature rises; metals are the opposite. Its conducting properties may be altered in useful ways by introducing impurities ("doping") into the crystal structure. Where two differently doped regions exist in the same crystal, a semiconductor junction is created. The behavior of charge carriers which include electrons, ions and electron holes at these junctions is the basis of diodes, transistors and all modern electronics. Some examples of semiconductors are silicon, germanium, gallium arsenide, and elements near the so-called "metalloid staircase" on the periodic table. After silicon, gallium arsenide is the second most common semiconductor and is used in laser diodes, solar cells, microwave-frequency integrated circuits and others. Silicon is a critical element for fabricating most electronic circuits.

In embodiments of the invention, the MOFs can even reach conductivities above 1000 S/cm, which is sometimes referred to as metallic conductance. Materials having below $10^{-8}$ S/cm conductance are considered to be insulators. Semiconductive material have conductivity in the range of 1000 S/cm to $10^{-8}$ S/cm. Semiconductive MOFs as well as MOFs with conductivities above 1000 S/cm are suitable for supercapacitor applications.

As used herein, a semiconductive application relates to the use of a material as a semiconductor in a device or process. A semiconductor device is an electronic component that relies on the electronic properties of a semiconductor material, such as silicon, germanium, and gallium arsenide, and in case of the present inventions the MOFs described herein, for its function. For example, semiconductor devices have replaced vacuum tubes in most applications. They use electrical conduction in the solid state rather than the gaseous state or thermionic emission in a vacuum.

Semiconductor materials are useful because their behavior can be easily manipulated by the deliberate addition of impurities, known as doping. Semiconductor conductivity can be controlled by the introduction of an electric or magnetic field, by exposure to light or heat, or by the mechanical deformation of a doped monocrystalline silicon grid; thus, semiconductors can make excellent sensors. Semiconductor devices can display a range of useful properties, such as passing current more easily in one direction than the other, showing variable resistance, and sensitivity to light or heat. Because the electrical properties of a semiconductor material can be modified by doping, or by the application of electrical fields or light, devices made from semiconductors can be used for amplification, switching, and energy conversion.

Current conduction in a semiconductor occurs due to mobile or "free" electrons and electron holes, collectively known as charge carriers. Doping a semiconductor with a small proportion of an atomic impurity, such as phosphorus or boron, greatly increases the number of free electrons or holes within the semiconductor. When a doped semiconductor contains excess holes, it is called a p-type semiconductor (p for positive electric charge); when it contains excess free electrons, it is called an n-type semiconductor (n for negative electric charge). A majority of mobile charge carriers have negative charge. The manufacture of semiconductors controls precisely the location and concentration of p- and n-type dopants. The connection of n-type and p-type semiconductors form p-n junctions.

Another measurement of semiconductivity is the band gap value. Materials that have a band gap value between 0 eV and 2.5 eV may be considered to be semiconductors. Materials that have bigger than 4 eV band gap value are considered to be insulators.

Furthermore, the invention relates to optoelectronic devices comprising as an electronic material sensitive to quantum mechanical effects of light a MOF, wherein the MOF comprises an inorganic building unit comprising
  a. metal atoms selected from group 1 to group 12 elements, and
  b. functional groups of organic linkers comprising oxygen (O) and one or more atoms selected from the group comprising phosphorus (P), arsenic (As), antimony (Sb), silicon (Si), selenium (Se) and bismuth (Bi).

Preferably, the functional groups of the organic linkers are selected from the group comprising phosphonate, arsonate, phosphonic acid, phosphinic acid, arsonic acids and/or arsenic acids, monoester and/or diester forms thereof, preferably phosphonate and/or arsonate and/or monoester and/or diester forms thereof.

All features of the MOFs described in the present application in the context of any aspect of the invention also relate to the MOFs as such as well as to the MOFs in the context of a semiconductive application or device, including optoelectronics, photovoltaic cells and solar cells.

As used herein, the term "optoelectronics" relates to applications and electronic devices and systems that source, detect and control light, usually considered a sub-field of photonics. In this context, light often includes invisible forms of radiation such as gamma rays, X-rays, ultraviolet and infrared, in addition to visible light. Optoelectronic devices are electrical-to-optical or optical-to-electrical transducers, or instruments that use such devices in their operation. Optoelectronics is based on the quantum mechanical effects of light on electronic materials, especially semiconductors, sometimes in the presence of electric fields. In the context of the invention, MOFs and in particular phosphonate and arsonate MOFs comprising phosphonic acid and arsenic acid groups as part of the IBU are use as electronic (semiconductive) material of such devices. Optoelectronic devices in the sense of the invention comprise devices exploiting a photoelectric or photovoltaic effect, such as photodiodes (including solar cells), phototransistors, photomultipliers, optoisolators, integrated optical circuit (IOC) elements; devices using photoconductivity, such as photoresistors, photoconductive camera tubes, charge-coupled imaging devices; devices using stimulated emission, such as injection laser diodes, quantum cascade lasers; devices using the Lossev effect or radiative recombination, such as lightemitting diodes or LED or OLEDs; devices using photoemissivity, such as photoemissive camera tubes.

In embodiments, the invention relates to a photovoltaic device, such as a photovoltaic cell, comprising as a photoactive material a MOF as disclosed herein. In embodiments, the invention relates to a solar cell comprising as a photoactive material a MOF as disclosed herein.

The use in optoelectronic applications, such as in particular photovoltaic cells, of the MOFs described herein, in particular of phosphonate MOFs comprising phosphonic acid groups, and of arsonate MOFs, is particularly advantageous for several reasons. For example, phosphonate-MOFs are the most structurally diverse MOF family and enable customization of material properties based on application-specific requirements; surprisingly, they can create wide range of conductivities above 1000 S/m; they have transparent crystallinity; they have extreme thermal and chemical stabilities (Perovskites are not as stable); they are easy to produce; and they are environmentally safe compared to the Perovskites (Perovskites have toxic lead in the structure).

The phosphonate MOFs disclosed herein have extremely rich metal binding modes, making them a structurally diverse MOF family. Structural richness and flexibility is advantageous for optimizing surface areas (electron holding potential) and conductivities in the context of photovoltaic applications. Furthermore, the described phosphonate MOFs exhibit exceptional thermal, which is advantageous due to the significant heat development in solar cells, and chemical stabilities, which is useful working in the presence of electrolytes; and they have excellently suitable band gaps within the light harvesting range.

The principle of photovoltaic devices is transducing optical signals into electronic circuits. The most straightforward strategy to utilize MOFs in photovoltaic applications is using them as the photoactive materials. Generally, a photovoltaic cell consists of charge-collecting electrodes, charge-transporting layers (CTLs), and the photoactive material, and the photo-active material is sandwiched between the respective CTL and electrodes. When the photoactive materials absorb solar radiation, photoexcitons are sequentially generated, followed by dissociation into free carriers enabled by the built-in voltage in the device and collected by the respective electrodes.

The MOFs should possess decent light-harvesting capability in the region from visible light to near-infrared (NIR) because most of the photons incident on the earth surface were contributed from this region.

Besides suitable $E_g$ to cover the solar spectrum (discussed above), the semiconducting properties of MOFs also play a pivotal role to make them suitable for photovoltaic applications, since sufficient dissociation of the photoexcitons generated in the MOFs is required to produce a reasonable photocurrent. The fact that there are only few suitable MOFs with semiconductive properties described in the art, imposes critical barriers to use MOFs as the photoactive materials directly and impedes its progress in photovoltaic applications to date.

In embodiments, the MOFs described herein are used as functional additives or interlayers of photovoltaic devices to improve the performance and stability of the derived solar cell devices.

In embodiments, the MOFs disclosed herein, such as phosphonate MOFs, can be used as charge-transporting layers in solar cells.

It is a great advantage for semiconductive applications of the MOFs disclosed herein, that they are transparent. This can, for example, prevent overheating when used in the context of a solar cell.

A solar cell, or photovoltaic cell, is an electrical device that converts the energy of light directly into electricity by the photovoltaic effect, which is a physical and chemical phenomenon. It is a form of photoelectric cell, defined as a device whose electrical characteristics, such as current, voltage, or resistance, vary when exposed to light. Solar cells are described as being photovoltaic, irrespective of whether the source is sunlight or an artificial light. In addition to producing energy, they can be used as a photodetector (for example infrared detectors), detecting light or other electromagnetic radiation near the visible range, or measuring light intensity. The operation of a photovoltaic (PV) cell requires three basic attributes: (i) The absorption of light, generating either electron-hole pairs or excitons. (ii) The separation of charge carriers of opposite types. (iii) The separate extraction of those carriers to an external circuit.

The solar cell works in several steps: Photons in sunlight hit the solar panel and are absorbed by semiconducting materials, such as doped silicon, or—in embodiments of the invention—a semiconductive MOF with suitable band gap as disclosed herein. Electrons are excited from their current molecular/atomic orbital. Once excited an electron can either dissipate the energy as heat and return to its orbital or travel through the cell until it reaches an electrode. Current flows through the material to cancel the potential and this electricity is captured. The chemical bonds of the material are vital for this process to work, and usually the semiconductor is used in two layers, one layer being doped with boron, the other phosphorus. These layers have different chemical electric charges and subsequently both drive and direct the current of electrons. An array of solar cells converts solar energy into a usable amount of direct current (DC) electricity. An inverter can convert the power to alternating current (AC).

Solar cells are typically named after the semiconducting material they are made of. These materials must have certain characteristics in order to absorb sunlight. Cells can be designed to handle sunlight that reaches the Earth's surface, or can be optimized for use in space. Solar cells can be made of only one single layer of light-absorbing material (single-junction) or use multiple physical configurations (multi-junctions) to take advantage of various absorption and charge separation mechanisms.

Dye-sensitized solar cells (DSSCs) are made of low-cost materials and do not need elaborate manufacturing equipment. In bulk it should be significantly less expensive than older solid-state cell designs. DSSC's can be engineered into flexible sheets and although its conversion efficiency is less than the best thin film cells, its price/performance ratio may be high enough to allow them to compete with fossil fuel electrical generation.

Dye-sensitized solar cells (DSSCs) have attracted considerable attention due to their advantages of low cost, easy fabrication, and relatively high efficiency for the conversion of sunlight into electricity. Generally, a DSSC consists of a photoanode, a counter electrode (CE), and a redox electrolyte. The photoanode is usually composed of a thin film of a porous semiconducting metal oxide deposited on a conducting and transparent substrate; TiO2 is the most commonly used metal oxide for the photoanode. The metal oxide thin film is sensitized with a photosensitizing dye. Under illumination, the dye molecule absorbs photons from sunlight, which causes electron injection into the conduction band of the semiconducting metal oxide. The electron can flow through the outer circuit towards the CE. The CE consists of a layer of an electrocatalyst deposited on another conducting substrate; a thin film of platinum is usually used as the electrocatalyst. The gap between the photoanode and the CE is filled with an electrolyte solution containing a redox couple; iodide/triiodide ($I/I_3$) is the most commonly used redox couple in the electrolyte. By utilizing the electrocatalyst deposited on the CE side, electrochemical reduction of the oxidized form of the redox component, i.e., $I_3$, happens on the surface of the CE to generate I. Therefore, the dye molecule in the excited state on the photoanode can be reduced back to its ground state by receiving an electron from I coming from the electrolyte solution.

Due to their interconnected porosity, ultrahigh specific surface area and periodic intra-framework functionality, MOFs have been considered as attractive candidates for electrode materials for a range of electrochemical applications, and the MOFs disclosed herein, in particular those comprising phosphonic acid functional groups, are particularly suited for those applications. In embodiments, the MOFs as described herein can be used as thin films in DSSCs. Therefore, embodiments of the invention relate to DSSCs comprising thin films of MOFs as described herein.

Furthermore, the disclosed MOFs with photosensitizing organic linkers represent a promising material for the photoanode in a DSSC to replace the metal oxide. In embodiments, the invention relates to DSSCs comprising a MOF as described in the context of the present invention as a photoanode material.

Also, in embodiments, the invention relates to a DSSC comprising a MOF as described herein as a CE material. Due to the semiconductive properties of the MOFs of the invention, such DSSC will have improved performance in comparison to DSSCs comprising other MOFs that have been described for this purpose in the art.

In embodiments, the invention relates to a DSSC comprising a MOF as described herein as an additive to the electrolytes of the DSSC.

Perovskite solar cells (PVSCs) are solar cells that include a perovskite-structured material as the active layer. Most commonly, this is a solution-processed hybrid organic-inorganic tin or lead halide-based material. Perovskite materials have excellent optoelectronic properties. However, issues concerning long-term stability of PVSCs prevent large scale commercialization. Because of the polycrystalline nature limited by the solution-based fabrication processes, the prepared perovskite film usually possesses lots of defects and grain boundaries, which will destabilize the devices' performance. Therefore, the PVSCs are prone to degrade in the exposure of moisture, oxygen, heat, and light. Chemically and thermally stable nanostructure MOFs have attracted increasing attention for applications in PVSCs to improve the performance and stability. Besides the good stability, MOFs also possess the advantages of simple synthetic procedures and decent solution-processability. This allows the nanoscale suspension of MOFs to transform into microporous films/scaffolds through the spin-coating process or by blending with other precursors involved in the device fabrication. Due to their excellent electronic/conductive properties and accessibility to modification, the MOFs described herein are particularly suited as components of PVSCs, providing enhanced stability of the perovskites. The optoelectronic properties of example phosphonate MOFs described herein can be manipulated, for example by controlling the constituent metal ions and organic linkers to provide different functionalities in device applications.

Accordingly, in embodiments, the invention relates to a PVSC comprising a MOF as described herein. The MOF can be included at the CTL/perovskite interface; serving as the CTL or embedded inside the CTL; and/or embedded inside the perovskite layer. For the interlayer applications, the motivations of using MOFs commonly involve building a microporous scaffold to regulate the growth of perovskite layers. This provides an improved contact at the perovskite interface resulting in enhanced perovskite crystallinity and film quality, whereas blending MOFs into the CTLs holds diverse functionalities, but the common point is to facilitate the band alignment at the associated interface and to improve the film quality of the employed CTL.

Organic solar cells and polymer solar cells are built from thin films (typically 100 nm) of organic semiconductors including polymers, such as polyphenylene vinylene and small-molecule compounds like copper phthalocyanine (a blue or green organic pigment) and carbon fullerenes and fullerene derivatives such as PCBM. In embodiments, the invention relates to an organic solar cell comprising a MOF of the invention.

DETAILED DESCRIPTION OF THE INVENTION

All cited documents of the patent and non-patent literature are hereby incorporated by reference in their entirety.

The present invention is directed to an electrode suitable for constructing an electrochemical double layer capacitor and/or supercapacitor and comprising as an electrode material a metal organic framework (MOF), wherein the MOF comprises an inorganic building unit comprising metal atoms selected from group 1 to group 12 elements, and functional groups of organic linkers comprising oxygen (O) and one or more atoms selected from the group comprising phosphorus (P), arsenic (As), antimony (Sb), silicon (Si), selenium (Se) and bismuth (Bi).

As used herein, a supercapacitor (also called a supercap, ultracapacitor or Goldcap) is a high-capacity capacitor with capacitance values much higher than other capacitors (but lower voltage limits) that bridge the gap between electrolytic capacitors and rechargeable batteries. They typically store 10 to 100 times more energy per unit volume or mass than electrolytic capacitors, can accept and deliver charge much faster than batteries, and tolerate many more charge and discharge cycles than rechargeable batteries. Supercapacitors are used in applications requiring many rapid charge/discharge cycles rather than long term compact energy storage: within cars, buses, trains, cranes and elevators, where they are used for regenerative braking, short-term energy storage or burst-mode power delivery. Smaller units are used as memory backup for static random-access memory (SRAM). Unlike ordinary capacitors, supercapacitors do not use the conventional solid dielectric, but rather, they use electrostatic double-layer capacitance and electrochemical pseudocapacitance, both of which contribute to the total capacitance of the capacitor, with a few differences:

Electrochemical or electrostatic double-layer capacitors (EDLCs) usually use carbon electrodes or derivatives with much higher electrostatic double-layer capacitance than electrochemical pseudocapacitance, achieving separation of charge in a Helmholtz double layer at the interface between the surface of a conductive electrode and an electrolyte. The separation of charge is of the order of a few ångströms (0.3-0.8 nm), much smaller than in a conventional capacitor.

Electrochemical pseudocapacitors usually use metal oxide or conducting polymer electrodes with a high amount of electrochemical pseudocapacitance additional to the double-layer capacitance. Pseudocapacitance is achieved by Faradaic electron charge-transfer with redox reactions, intercalation or electrosorption.

Hybrid capacitors, such as the lithium-ion capacitor, use electrodes with differing characteristics: one exhibiting mostly electrostatic capacitance and the other mostly electrochemical capacitance.

The electrolyte forms an ionic conductive connection between the two electrodes which distinguishes them from conventional electrolytic capacitors where a dielectric layer always exists, and the so-called electrolyte (e.g., MnO2 or conducting polymer) is in fact part of the second electrode (the cathode, or more correctly the positive electrode). Supercapacitors are polarized by design with asymmetric electrodes, or, for symmetric electrodes, by a potential applied during manufacture.

Supercapacitors (SCs) consist of two electrodes separated by an ion-permeable membrane (separator), and an electrolyte ionically connecting both electrodes. When the electrodes are polarized by an applied voltage, ions in the electrolyte form electric double layers of opposite polarity to the electrode's polarity. For example, positively polarized electrodes will have a layer of negative ions at the electrode/electrolyte interface along with a charge-balancing layer of positive ions adsorbing onto the negative layer. The opposite is true for the negatively polarized electrode. Additionally, depending on electrode material and surface shape, some ions may permeate the double layer becoming specifically adsorbed ions and contribute with pseudocapacitance to the total capacitance of the supercapacitor.

Supercapacitors use the double-layer effect to store electric energy; however, this double-layer has no conventional solid dielectric to separate the charges. There are two storage principles in the electric double-layer of the electrodes that contribute to the total capacitance of an electrochemical capacitor: Double-layer capacitance and Pseudocapacitance.

The main drawback of carbon electrodes of double-layer SCs is small values of quantum capacitance which act in series with capacitance of ionic space charge. Therefore, further increase of density of capacitance in SCs can be connected with increasing of quantum capacitance of carbon electrode nanostructures. The amount of charge stored per unit voltage in an electrochemical capacitor is primarily a function of the electrode size, which can be enlarged by using highly porous electrode material or active electrode material. The electrostatic storage of energy in the double-layers is linear with respect to the stored charge, and correspond to the concentration of the adsorbed ions. Also, while charge in conventional capacitors is transferred via electrons, capacitance in double-layer capacitors is related to the limited moving speed of ions in the electrolyte and the resistive porous structure of the electrodes.

Supercapacitor electrodes are generally thin coatings applied and electrically connected to a conductive, metallic current collector. In the context of the invention, the electrodes comprise as a material or an active material which contributes to or represents the this coatings a MOF of the invention. Supercapacitor or ELC electrodes must preferably have good conductivity, high temperature stability, long-term chemical stability (inertness), high corrosion resistance and high surface areas per unit volume and mass, which is provided by the MOFs described herein. Other requirements include environmental friendliness and low cost. The amount of double-layer as well as pseudocapacitance stored per unit voltage in a supercapacitor is predominantly a function of the electrode surface area. Therefore, supercapacitor electrodes are typically made of porous, spongy material with an extraordinarily high specific surface area, such as activated carbon. Additionally, the ability of the electrode material to perform faradaic charge transfers enhances the total capacitance. Generally the smaller the electrode's pores, the greater the capacitance and specific energy. However, smaller pores increase equivalent series resistance (ESR) and decrease specific power. Applications with high peak currents require larger pores and low internal losses, while applications requiring high specific energy need small pores.

The most commonly used electrode material for EDLC supercapacitors is carbon in various manifestations such as activated carbon (AC), carbon fibre-cloth (AFC), carbide-derived carbon (CDC), carbon aerogel, graphite (graphene), graphane and carbon nanotubes (CNTs).

In the context of the invention, the term "metal organic framework (MOF)" refers to a molecular, one-, two- or three-dimensional coordination polymer including metal ions and ligands which function as organic structural units and are also referred to as "organic linkers" or "organic ligands", wherein a portion of the metal ions are each chemically bonded to at least one bi-, tri-, tetra- or poly-dentate organic linker. The metal ions, in addition to being coordinated with at least one organic linker, may also be bound to one or more auxiliary ligands, as described in more detail herein.

Metal organic frameworks (MOFs), also known as porous coordination polymers, are crystalline coordination networks comprising inorganic building units, which may also be called metal ion clusters, or metal-based inorganic groups, such as one dimensional and two-dimensional inorganic building units. The inorganic building units are mostly formed by metal atoms or ions and the functional groups of the organic linkers. MOFs are made by linking metal atoms or ions with organic building units which comprise organic linkers and optionally auxiliary linkers, through chemical bonds such as coordination bonds, covalent bonds or ionic bonds.

The inorganic building units can be, without limitation, one-dimensional chains or two-dimensional sheets or three-dimensional structures. The inorganic building units can also be referred to as secondary building units (SBUs).

In general, the organic linkers of MOFs can be, without limitation, carboxylates, or other organic anions, such as phosphonate, sulfonate, and heterocyclic compounds.

MOFs are composed of two major components: a metal ion or cluster of metal ions or molecular or one-dimensional inorganic building units or two-dimensional inorganic building units which are present in the inorganic building units and an organic molecule called organic linker or organic ligand or ligand or organic strut. For clarification, in the context of the present invention, the metal-based inorganic groups/inorganic building units are composed of the metal ions/atoms and the functional groups of the organic linkers comprising O and one or more atoms selected from the group comprising phosphorus (P), arsenic (As), antimony (Sb), silicon (Si), selenium (Se) and bismuth (Bi). Besides the functional groups, the organic linkers comprise an organic core or geometrical (organic) core, forming at least a part of the organic structure of a MOF. For this reason, the materials are often referred to as hybrid organic-inorganic materials. The organic units are typically mono-, di-, tri-, or tetravalent, hexavalent ligands and the choice of metal and linker dictates the structure and hence properties of the MOF. For example, the metal's coordination preference influences the size and shape of pores by dictating how many ligands can bind to the metal and in which orientation.

Furthermore, MOFs may comprise auxiliary linkers (also called auxiliary ligands), which are mostly organic molecules with a functional group that can also interact with the metal of the inorganic building unit through a covalent, coordinate and/or ionic bond. The organic part of the auxiliary linker can also form part of the organic unit of the MOF.

To describe and organize the structures of MOFs, a system of nomenclature has been developed. The inorganic building units (also called secondary building units (SBUs) or metal-based inorganic groups) can be described by topologies common to several structures. Each topology, also called a net, is assigned a symbol, consisting of three lower-case letters in bold. MOF-5, for example, has a pcu net. The database of net structures can be found at the Reticular Chemistry Structure Resource (Tranchemontagne D J, Mendoza-Cortés J L, O'Keeffe M, Yaghi O M (May 2009). "Secondary building units, nets and bonding in the chemistry of metal-organic frameworks" (PDF). Chemical Society Reviews. 38 (5): 1257-83.). Attached to the SBUs are bridging ligands. For MOF's, typical bridging ligands are di- and tricarboxylic acids. These ligands typically have rigid backbones. Examples are benzene-1,4-dicarboxylic acid (BDC or terephthalic acid, biphenyl-4,4'-dicarboxylic acid (BPDC), and the tricarboxylic acid trimesic acid.

MOFs are often porous, and the porosity can be modified and directed by using post-synthetic modifications. In the context of the invention it is preferred that the MOFs are porous and have a high surface to mass ratio, which is a common measure for measuring porosity. Porosity (or void fraction) is a measure of the void (i.e. "empty") spaces in a material, and is a fraction of the volume of voids over the total volume, between 0 and 1, or as a percentage between 0% and 100%. Porosity can be influenced by modifying the organic unit of the MOF, including the organic core of the organic linker or the organic part of the auxiliary linker.

For purposes of this invention, the chemical elements and groups of elements of the periodic table are identified in accordance with the Periodic Table of the Elements, CAS version, Handbook of Chemistry and Physics, 75th inside cover, and specific functional groups are generally defined as described therein. Additionally, general principles of organic chemistry, as well as specific functional moieties and reactivity, are described in Organic Chemistry, Thomas Sorrell, University Science Books, Sausalito: 1999, the entire contents of which are incorporated herein by reference.

Coordination of an organic linker to the metal ions or metal clusters of a MOF occur through functional groups of the organic linker. Accordingly, in the context of the invention such functional groups of the organic linker are called (metal-binding) functional groups of the organic linker. These functional groups of the organic linker are arranged about an organic core (or geometrical core) of the organic linker.

The organic core of the organic linker can be of any geometrical shape suitable for use in the context of a MOF, as known to the person skilled in the art, such as for example V-shaped, L-shaped, T-shaped, X-shaped, Y-shaped, or hexagonal. Examples of suitable structures are displayed in FIGS. 2 and 3 disclosed herein. The tether lengths of the organic linkers can be shorter or longer. The n factor in FIG. 2 describes the number of possible phenyl groups to extend the tether length of the organic linker. The angle between the tethers of the organic linker could be between 0 to 180 degrees. Commonly observed angles include, without limitation, about 90 degrees for porphyrine and phthalocyanine core, about 120 degrees for Y-shaped geometrical core, ca. 108 degrees for tetrahedral core (tetrahedral core angle could be flexible due to the presence of sigma bonds), about 180 degrees for linear geometries.

Planar Y- and X-shaped core geometries in general form hexagonal or rectangular void channels with one-dimensional inorganic building units. Tetrahedral methane and silane cores usually form MOFs with molecular and one-dimensional building units. T-shaped linkers are not known in the MOF literature yet. Once their MOFs are synthesized, they could form rectangular or cubic void spaces. V-shaped and linear linkers are more flexible and they can form different forms of void spaces with molecular, one-dimensional and two-dimensional inorganic building units. As the phosphonates and arsonates prove extremely rich metal binding modes, different combinations and formation of void spaces in different geometries are possible.

As disclosed herein, functional groups of the organic linkers of the MOFs of the invention comprise oxygen (O) and one or more atoms selected from the group comprising phosphorus (P), arsenic (As), antimony (Sb), silicon (Si), selenium (Se) and bismuth (Bi).

Preferably, the functional groups of the organic linkers of the MOFs of the invention comprise phosphonate, arsonate, phosphonic acid, phosphinic acid, phosphinate, phosphates, arsonic acids, and/or as arsenic acid. Furthermore, monoesters and/or diesters of these can be comprised by the functional groups. According to embodiments of the invention, the organic linkers can comprise or consist of organophosphorus compounds.

Phosphonates and phosphonic acids are organophosphorus compounds containing C—PO(OH)2 or C—PO(OR)2 groups (where R=alkyl, aryl). Organophosphorus compounds are organic compounds containing phosphorus. Organophosphorus chemistry is the corresponding science of the properties and reactivity of organophosphorus compounds. Phosphorus, like nitrogen, is in group 15 of the periodic table, and thus phosphorus compounds and nitrogen compounds have many similar properties. According to one definition of organophosphorus compounds used herein, an organophosphorus compound need contain only an organic substituent, but need not have a direct phosphorus-carbon (P—C) bond. A large group of organophosphorus compounds is known to the skilled person. For example, phosphonates are esters of phosphonic acid and have the general formula RP($=$O)(OR')2; phosphate esters have the general structure P($=$O)(OR)3 feature P(V); Phosphine oxides (designation $\sigma^4\lambda^5$) have the general structure $R_3P=O$ with formal oxidation state V; Compounds with the formula $[PR_4^+]X^-$ comprise the phosphonium salts; Phosphites, sometimes called phosphite esters, have the general structure $P(OR)_3$ with oxidation state +3; intermediate between phosphites and phosphines are phosphonites (P(OR)$_2$R') and phosphinite (P(OR)R'$_2$); the parent compound of the phosphines is PH3 or phosphane elsewhere, replacement of one or more hydrogen centers by an organic substituents (alkyl, aryl), gives PH3-xRx, an organophosphine, generally referred to as phosphines; compounds with carbon phosphorus(III) multiple bonds are called phosphaalkenes ($R_2C=PR$) and phosphaalkynes (RC≡P). further example of organophohsphorus compounds are known to the skilled person.

Hypophosphorous acid (HPA), or phosphinic acid, is a phosphorus oxyacid and a powerful reducing agent with molecular formula $H_3PO_2$. The formula for this acid is generally written H3PO2, but a more descriptive presentation is HOP(O)H$_2$, which highlights its monoprotic character. Salts derived from this acid are called hypophosphites. Organophosphinic acids have the formula R$_2$PO$_2$H. The two hydrogen atoms directly bound to phosphorus in phosphinic acid are replaced by organic groups. For example, formaldehyde and H3PO2 react to give (HOCH2)2PO2H. Similarly, phosphinic acid adds to Michael acceptors, for example with acrylamide it gives H(HO)P(O)CH$_2$CH$_2$C(O)NH$_2$. The Cyanex family of dialkylphosphinic acids are used in hydrometallurgy to extract metals from ores.

Phosphinates or hypophosphites are a class of phosphorus compounds conceptually based on the structure of hypophosphorous acid. IUPAC prefers the term phosphinate in all cases, however in practice hypophosphite is usually used to describe inorganic species (e.g. sodium hypophosphite), while phosphinate as used herein also refers to organophosphorus species. Organophosphinates are organophosphorus compounds with the formula OP(OR)R$_2$, with the simplest example being methylphosphinic acid. Phosphinites P(OR)R$_2$ can be oxidized into phosphinates. Dialkylphosphinic acids are organophosphorus compounds with the formula R$_2$PO$_2$H, where R is any alkyl group. They are phosphorus(V) compounds with tetrahedral molecular geometry. Under the brand names Aerophine and Cyanex, they are used in extraction and separation, i.e., hydrometallurgy, of metal salts from ore extracts. Characteristically the organic substituents are branched to confer solubility and preclude crystallization. The dithiodialkyphosphinic acids (R$_2$PS$_2$H) are related to the diorganodithiophosphates with the formula (RO)$_2$PS$_2$H, which are also used as complexing agents in the purification of metals. The phosphates are more prone to hydrolysis owing to the greater lability of the RO-P linkage vs the direct C—P bond.

Arsonic acids are a subset of organoarsenic compounds defined as oxyacids where a pentavalent arsenic atom is bonded to two hydroxyl groups, a third oxygen atom (this one with a double bond), and an organic substituent. The salts/conjugate bases of arsonic acids are called arsonates. Arsonic acid refers to H$_3$AsO$_3$, the case where the substituent is a single hydrogen atom. The other arsonic acids can simply be viewed as hydrocarbyl derivatives of this base case. Arsenic acid results when the substituent is a hydroxyl group. Methylarsonic acid results when the substituent is a methyl group. Phenylarsonic acid results when the substituent is a phenyl group.

Arsenic acid is the chemical compound with the formula H$_3$AsO$_4$. More descriptively written as AsO(OH)$_3$, this colorless acid is the arsenic analogue of phosphoric acid. Arsenate and phosphate salts behave very similarly. Arsenic acid as such has not been isolated, but is only found in solution, where it is largely ionized. Its hemihydrate form (H$_3$AsO$_4$·½H$_2$O) does form stable crystals.

Furthermore, the organic linkers of the invention can comprise auxiliary organo-imine groups forming coordinate, covalent or ionic bonds with metal atoms. Auxiliary linker preferably include 1,4-pyridine, 4,4'-bipyridine, 4,4'-(1,4-phenylene)bispyridine, and longer versions. Auxiliary linkers can be charged or in a neutral state. Different positioning of nitrogen atom is also possible such as 2,2'-bipyridine, 3,3'-bipyridine, and others. Metal-binding solvent molecules, such as water, ethanol, DMF, DMSO, THF, or any polar protic and polar aprotic solvents can also be considered as auxiliary linkers. Conjugate bases from salts of metals such as sulfates, nitrates, carbonates etc. and halogens F, Cl, Br, I are also considered as auxiliary ligands. Auxiliary ligands can be any Lewis base.

A Lewis base, then, is any species that has a filled orbital containing an electron pair which is not involved in bonding but may form a dative bond with a Lewis acid to form a Lewis adduct. For example, NH3 is a Lewis base, because it can donate its lone pair of electrons. A Lewis acid is a chemical species that contains an empty orbital which is capable of accepting an electron pair from a Lewis base to form a Lewis adduct. Trimethylborane (Me$_3$B) is a Lewis acid as it is capable of accepting a lone pair. In a Lewis adduct, the Lewis acid and base share an electron pair furnished by the Lewis base, forming a dative bond.

A Lewis base is an atomic or molecular species where the highest occupied molecular orbital (HOMO) is highly localized. Typical Lewis bases are conventional amines such as ammonia and alkyl amines. Other common Lewis bases include pyridine and its derivatives. Some of the main classes of Lewis bases are amines of the formula NH$_{3-x}$R$_x$ where R=alkyl or aryl. Related to these are pyridine and its derivatives; phosphines of the formula PR$_{3-x}$A$_x$, where R=alkyl, A=aryl; compounds of O, S, Se and Te in oxidation state −2, including water, ethers, ketones. The most common Lewis bases are anions. The strength of Lewis basicity correlates with the pK$_a$ of the parent acid: acids with high pK$_a$'s give good Lewis bases. As usual, a weaker acid has a stronger conjugate base. Examples of Lewis bases based on the general definition of electron pair donor include: simple anions, such as H$^-$ and F$^-$; other lone-pair-containing species, such as H$_2$O, NH$_3$, HO$^-$, and CH$_3^-$; complex anions, such as sulfate; electron rich λ-system Lewis bases, such as ethyne, ethene, and benzene.

As used herein, an imine is a functional group or chemical compound containing a carbon-nitrogen double bond. The nitrogen atom can be attached to a hydrogen (H) or an organic group (R). If this group is not a hydrogen atom, then the compound can sometimes be referred to as a Schiff base. The carbon atom has two additional single bonds. Usually imines refer to compounds with the connectivity R2C=NR, wherein the R attached to the N is the R$^3$. Imines in which R is one or more organic groups are called organoimine. In the older literature, imine refers to the aza analogue of an epoxide. Thus, ethyleneimine is the three-membered ring species C$_2$H$_4$NH. Imines are related to ketones and aldehydes by replacement of the oxygen with an NR group. When R=H, the compound is a primary imine, when R is hydrocarbyl, the compound is a secondary imine. Imines exhibit diverse reactivity and are commonly encountered throughout chemistry. When R$^3$ is OH, the imine is called an oxime, and when R$^3$ is NH$_2$ the imine is called a hydrazone. A primary imine in which C is attached to both a hydrocarbyl and a H is called a primary aldimine; a secondary imine with such groups is called a secondary aldimine (R$^3$ is attached to a hydrocabyl). A primary imine in which C is attached to two hydrocarbyls is called a primary ketimine; a secondary imine with such groups is called a secondary ketimine.

In the context of the invention, a metal-based inorganic group of a MOF can be a metal ion or a or a cluster of metal ions capable of bonding with the organic linkers.

In the context, the term "capable of bonding" refers to the formation of a chemical bond, preferably an ionic bond or a coordinate covalent bond, which is formed between the metal-based inorganic group and the organic linker of the MOF. A chemical bond is a lasting attraction between atoms, ions or molecules that enables the formation of chemical compounds. The bond may result from the electrostatic force of attraction between oppositely charged ions as in ionic bonds or through the sharing of electrons as in covalent bonds. The strength of chemical bonds varies considerably; there are "strong bonds" or "primary bonds" such as covalent, ionic and metallic bonds, and "weak bonds" or "secondary bonds" such as dipole—dipole interactions, the London dispersion force and hydrogen bonding.

Ionic bonding is a type of electrostatic interaction between atoms that have a large electronegativity difference. There is no precise value that distinguishes ionic from covalent bonding, but an electronegativity difference of over 1.7 is likely to be ionic while a difference of less than 1.7 is likely to be covalent. Ionic bonding leads to separate positive and negative ions. Ionic charges are commonly between −3e to +3e. Ionic bonding commonly occurs in metal salts such as sodium chloride. A typical feature of ionic bonds is that the species form into ionic crystals, in which no ion is specifically paired with any single other ion in a specific directional bond. Rather, each species of ion is surrounded by ions of the opposite charge, and the spacing between it and each of the oppositely charged ions near it is the same for all surrounding atoms of the same type. It is thus no longer possible to associate an ion with any specific other single ionized atom near it. This is a situation unlike that in covalent crystals, where covalent bonds between specific atoms are still discernible from the shorter distances between them, as measured via such techniques as X-ray diffraction.

Covalent bonding is a common type of bonding in which two or more atoms share valence electrons more or less equally. The simplest and most common type is a single bond in which two atoms share two electrons. Other types include the double bond, the triple bond, one- and three-electron bonds, the three-center two-electron bond and three-center four-electron bond. In non-polar covalent bonds, the electronegativity difference between the bonded atoms is small, typically 0 to 0.3. Bonds within most organic compounds are described as covalent. In $CH_4$/methane each hydrogen forms a covalent bond with the carbon. Molecules that are formed primarily from non-polar covalent bonds are often immiscible in water or other polar solvents, but much more soluble in non-polar solvents such as hexane. A polar covalent bond is a covalent bond with a significant ionic character. This means that the two shared electrons are closer to one of the atoms than the other, creating an imbalance of charge. Such bonds occur between two atoms with moderately different electronegativities and give rise to dipole—dipole interactions. The electronegativity difference between the two atoms in these bonds is 0.3 to 1.7.

The metal-based inorganic groups of the invention preferably comprise a metal from the groups 1-12 of the periodic table, comprising alkali metal (group 1), alkali earth metals (group 2) and transition metals (group 3-12).

The alkali metals are the series of elements in Group 1 of the periodic table (excluding hydrogen). The series comprises the elements lithium (Li), sodium (Na), potassium (K), rubidium (Rb), caesium (Cs), and francium (Fr). The alkaline earth metals are the series of elements in Group 2 of the periodic table. The series comprises the elements beryllium (Be), magnesium (Mg), calcium (Ca), strontium (Sr), barium (Ba) and radium (Ra).

Transition metals are the elements located in Groups 3-12 of the Periodic Table. All the transition metals have two electrons in their outermost shell, and all but zinc, cadmium, and mercury have an incompletely filled inner shell. Terms including multiple valences (because of their incomplete inner shells), high melting points, colored compounds, and the ability to form stable complex ions and alloys describe some of the properties of transition metals. The elements classed as transition metals generally have the following properties in common: Good conductors of heat and electricity; easily hammered or bent into shape; usually hard and tough; high densities; high melting points—but mercury is a liquid at room temperature; form coloured compounds. Transition Metals comprise scandium (Sc), titanium (Ti), vanadium (V), chromium (Cr), manganese (Mn), iron (Fe), cobalt (Co), nickel (Ni), copper (Cu), and zinc (Zn), yttrium (Y), zirconium (Zr), niobium (Nb), molybdenum (Mo), technetium (Tc), ruthenium (Ru), rhodium (Rh), palladium (Pd), silver (Ag), and cadmium (Cd), lanthanum (La), hafnium (Hf), tantalum (Ta), tungsten (W), rhenium (Re), osmium (Os), iridium (Ir), platinum (Pt), gold (Au), and mercury (Hg), actinium (Ac), rutherfordium (Rf), dubnium (Db), seaborgium (Sg), bohrium (Bh), hassium (Hs), meitnerium (Mt), darmstadtium (Ds), roentgenium (Rg), copernicium (Cn).

Furthermore, the metal atoms or ions of the invention are selected form the group comprising zinc (Zn), cadmium (Cd), copper (Cu), cobalt (Co), nickel (Ni), gold (Au) and silver (Ag), preferably Zn, Co, Cu and Ni, most preferably Zn and Cu.

Preferred inorganic building units are in the form of one-dimensional chains or two-dimensional sheets. Molecular/cluster type of inorganic building units are well separated in MOF structure, which makes the conductance mainly dependent on organic linkers. For example a molecular/cluster, or one-dimensional, or two-dimensional inorganic building unit of a phosphonate-MOF includes the elements Metal ion (M), P and O, when they are constructed using pyridine auxiliary linkers inorganic building unit includes the elements Metal ion (M), P and O and N, when the N of the functional group of the auxiliary linker is considered to be connected part of the inorganic building unit. For arsonate-MOFs, it includes the elements Metal ion (M), As and O; when they are constructed using pyridine auxiliary linkers inorganic building unit includes the elements Metal ion (M), As and O and N. The MOF can be comprise more than one kind of metal atom, and can therefore be for example bimetallic, trimetallic can comprise even more different metals.

Herein, the band gap, also called an energy gap or band gap, is an energy range in a solid where no electron states can exist. In graphs of the electronic band structure of solids, the band gap generally refers to the energy difference (in electron volts) between the top of the valence band and the bottom of the conduction band in insulators and semiconductors. It is the energy required to promote a valence electron bound to an atom to become a conduction electron, which is free to move within the crystal lattice and serve as a charge carrier to conduct electric current. If the valence band is completely full and the conduction band is completely empty, then electrons cannot move in the solid; however, if some electrons transfer from the valence to the conduction band, then current can flow (see carrier generation and recombination). Therefore, the band gap is a major factor determining the electrical conductivity of a solid. Substances with large band gaps are generally insulators, those with smaller band gaps are semiconductors, while conductors either have very small band gaps or none, because the valence and conduction bands overlap.

As used herein, electrical conductivity or specific conductance (which is the reciprocal of electrical resistivity) represents a material's ability to conduct electric current. It is commonly signified by the Greek letter σ (sigma), but κ

(kappa) (especially in electrical engineering) and γ (gamma) are sometimes used. The SI unit of electrical conductivity is siemens per metre (S/m).

The term "aliphatic," as used herein, includes both saturated and unsaturated, nonaromatic, straight chain (i.e., unbranched), branched, acyclic, and cyclic (i.e., carbocyclic) hydrocarbons, which are optionally substituted with one or more functional groups. As will be appreciated by one of ordinary skill in the art, "aliphatic" is intended herein to include, but is not limited to, alkyl, alkenyl, alkynyl, cycloalkyl, cycloalkenyl, and cycloalkynyl moieties. Thus, as used herein, the term "alkyl" includes straight, branched and cyclic alkyl groups. An analogous convention applies to other generic terms such as "alkenyl", "alkynyl", and the like. Furthermore, as used herein, the terms "alkyl", "alkenyl", "alkynyl", and the like encompass both substituted and unsubstituted groups. In certain embodiments, as used herein, "aliphatic" is used to indicate those aliphatic groups (cyclic, acyclic, substituted, unsubstituted, branched or unbranched) having 1-20 carbon atoms or more. Aliphatic group substituents include, but are not limited to, any of the substituents described herein, that result in the formation of a stable moiety (e.g., aliphatic, alkyl, alkenyl, alkynyl, heteroaliphatic, heterocyclic, aryl, heteroaryl, acyl, oxo, imino, thiooxo, cyano, isocyano, amino, azido, nitro, hydroxyl, thiol, halo, aliphaticamino, heteroaliphaticamino, alkylamino, heteroalkylamino, arylamino, heteroarylamino, alkylaryl, arylalkyl, aliphaticoxy, heteroaliphaticoxy, alkyloxy, heteroalkyloxy, aryloxy, heteroaryloxy, aliphaticthioxy, heteroaliphaticthioxy, alkylthioxy, heteroalkylthioxy, arylthioxy, heteroarylthioxy, acyloxy, and the like, each of which may or may not be further substituted).

As used herein, the term "alkyl" is given its ordinary meaning in the art and refers to the radical of saturated aliphatic groups, including straight-chain alkyl groups, branched-chain alkyl groups, cycloalkyl (alicyclic) groups, alkyl substituted cycloalkyl groups, and cycloalkyl substituted alkyl groups. In some cases, the alkyl group may be a lower alkyl group, i.e., an alkyl group having 1 to 10 carbon atoms (e.g., methyl, ethyl, propyl, butyl, pentyl, hexyl, heptyl, octyl, nonyl, or decyl). In some embodiments, a straight chain or branched chain alkyl may have 30 or fewer carbon atoms in its backbone, and, in some cases, 20 or fewer. In some embodiments, a straight chain or branched chain alkyl may have 12 or fewer carbon atoms in its backbone (e.g., C1-C12 for straight chain, C3-C12 for branched chain), 6 or fewer, or 4 or fewer. Likewise, cycloalkyls may have from 3-10 carbon atoms in their ring structure, or 5, 6 or 7 carbons in the ring structure. Examples of alkyl groups include, but are not limited to, methyl, ethyl, propyl, isopropyl, cyclopropyl, butyl, isobutyl, t-butyl, cyclobutyl, hexyl, and cyclochexyl.

The term "alkylene" as used herein refers to a bivalent alkyl group. An "alkylene" group is a polymethylene group, i.e., —(CH2)z-, wherein z is a positive integer, e.g., from 1 to 20, from 1 to 10, from 1 to 6, from 1 to 4, from 1 to 3, from 1 to 2, or from 2 to 3. A substituted alkylene chain is a polymethylene group in which one or more methylene hydrogen atoms are replaced with a substituent. Suitable substituents include those described herein for a substituted aliphatic group.

Generally, the suffix "-ene" is used to describe a bivalent group. Thus, any of the terms defined herein can be modified with the suffix "-ene" to describe a bivalent version of that moiety. For example, a bivalent carbocycle is "carbocyclylene", a bivalent aryl ring is "arylene", a bivalent benzene ring is "phenylene", a bivalent heterocycle is "heterocyclene", a bivalent heteroaryl ring is "heteroarylene", a bivalent alkyl chain is "alkylene", a bivalent alkenyl chain is "alkenylene", a bivalent alkynyl chain is "alkynylene", a bivalent heteroalkyl chain is "heteroalkylene", a bivalent heteroalkenyl chain is "heteroalkenylene", a bivalent heteroalkynyl chain is "heteroalkynylene", and so forth.

The terms "alkenyl" and "alkynyl" are given their ordinary meaning in the art and refer to unsaturated aliphatic groups analogous in length and possible substitution to the alkyls described above, but that contain at least one double or triple bond respectively.

In certain embodiments, the alkyl, alkenyl and alkynyl groups employed in the invention contain 1-20 aliphatic carbon atoms. In certain other embodiments, the alkyl, alkenyl, and alkynyl groups employed in the invention contain 1-10 aliphatic carbon atoms. In yet other embodiments, the alkyl, alkenyl, and alkynyl groups employed in the invention contain 1-8 aliphatic carbon atoms. In still other embodiments, the alkyl, alkenyl, and alkynyl groups employed in the invention contain 1-6 aliphatic carbon atoms. In yet other embodiments, the alkyl, alkenyl, and alkynyl groups employed in the invention contain 1-4 carbon atoms. Illustrative aliphatic groups thus include, but are not limited to, for example, methyl, ethyl, n-propyl, isopropyl, allyl, n-butyl, sec-butyl, isobutyl, t-butyl, n-pentyl, sec-pentyl, isopentyl, t-pentyl, n-hexyl, sec-hexyl, moieties and the like, which again, may bear one or more substituents. Alkenyl groups include, but are not limited to, for example, ethenyl, propenyl, butenyl, 1-methyl-2-buten-1-yl, and the like. Representative alkynyl groups include, but are not limited to, ethynyl, 2-propynyl (propargyl), 1-propynyl and the like.

The term "cycloalkyl," as used herein, refers specifically to groups having three to ten, preferably three to seven carbon atoms. Suitable cycloalkyls include, but are not limited to cyclopropyl, cyclobutyl, cyclopentyl, cyclohexyl, cycloheptyl and the like, which, as in the case of other aliphatic, heteroaliphatic, or hetercyclic moieties, may optionally be substituted with substituents including, but not limited to aliphatic; heteroaliphatic; aryl; heteroaryl; arylalkyl; heteroarylalkyl; alkoxy; aryloxy; heteroalkoxy; heteroaryloxy; alkylthio; arylthio; heteroalkylthio; heteroarylthio; —F; —Cl; —Br; —I; —OH; —NO2; —CN; —CF3; —CH2CF3; —CHCl2; —CH2OH; —CH2CH2OH; —CH2NH2; —CH2SO2CH3; —C(O)Rx; —CO2(Rx); —CON(Rx)2; —OC(O)Rx; —OCO2Rx; —OCON(Rx)2; —N(Rx)2; —S(O)2Rx; —NRx(CO)Rx, wherein each occurrence of Rx independently includes, but is not limited to, aliphatic, heteroaliphatic, aryl, heteroaryl, arylalkyl, or heteroarylalkyl, wherein any of the aliphatic, heteroaliphatic, arylalkyl, or heteroarylalkyl substituents described above and herein may be substituted or unsubstituted, branched or unbranched, cyclic or acyclic, and wherein any of the aryl or heteroaryl substituents described above and herein may be substituted or unsubstituted. Additional examples of generally applicable substituents are illustrated by the specific embodiments shown in the Examples that are described herein The term "heteroaliphatic," as used herein, refers to an aliphatic moiety, as defined herein, which includes both saturated and unsaturated, nonaromatic, straight chain (i.e., unbranched), branched, acyclic, cyclic (i.e., heterocyclic), or polycyclic hydrocarbons, which are optionally substituted with one or more functional groups, and that contain one or more oxygen, sulfur, nitrogen, phosphorus, or silicon atoms, e.g., in place of carbon atoms. In certain embodiments, heteroaliphatic moieties are substituted by independent replacement of one or more of the hydrogen atoms thereon with one or more substituents. As will be appreciated by one of ordinary skill in the art, "heteroaliphatic" is intended herein to include, but is not limited to, heteroalkyl, heteroalkenyl, heteroalkynyl, heterocycloalkyl, heterocycloalkenyl, and heterocycloalkynyl moieties. Thus, the term "heteroaliphatic" includes the terms "heteroalkyl," "heteroalkenyl", "heteroalkynyl", and the like. Furthermore, as used herein, the terms "heteroalkyl", "heteroalkenyl", "heteroalkynyl", and the like encompass both substituted and unsubstituted groups. In certain embodiments, as used herein, "heteroaliphatic" is used to indicate those heteroaliphatic groups (cyclic, acyclic, substituted, unsubstituted, branched or unbranched) having 1-20 carbon atoms. Heteroaliphatic group substituents include, but are not limited to, any of the substituents described herein, that result in the formation of a stable moiety (e.g., aliphatic, alkyl, alkenyl, alkynyl, heteroaliphatic, heterocyclic, aryl, heteroaryl, acyl, sulfinyl, sulfonyl, oxo, imino, thiooxo, cyano, isocyano, amino, azido, nitro, hydroxyl, thiol, halo, aliphaticamino, heteroaliphaticamino, alkylamino, heteroalkylamino, arylamino, heteroarylamino, alkylaryl, arylalkyl, aliphaticoxy, heteroaliphaticoxy, alkyloxy, heteroalkyloxy, aryloxy, heteroaryloxy, aliphaticthioxy, heteroaliphaticthioxy, alkylthioxy, heteroalkylthioxy, arylthioxy, heteroarylthioxy, acyloxy, and the like, each of which may or may not be further substituted).

The term "heteroalkyl" is given its ordinary meaning in the art and refers to an alkyl group as described herein in which one or more carbon atoms is replaced by a heteroatom. Suitable heteroatoms include oxygen, sulfur, nitrogen, phosphorus, and the like. Examples of heteroalkyl groups include, but are not limited to, alkoxy, alkoxyalkyl, amino, thioester, poly(ethylene glycol), and alkyl-substituted amino.

The terms "heteroalkenyl" and "heteroalkynyl" are given their ordinary meaning in the art and refer to unsaturated aliphatic groups analogous in length and possible substitution to the heteroalkyls described above, but that contain at least one double or triple bond respectively.

Some examples of substituents of the above-described aliphatic (and other) moieties of compounds of the invention include, but are not limited to aliphatic; heteroaliphatic; aryl; heteroaryl; alkylaryl; alkylheteroaryl; alkoxy; aryloxy; heteroalkoxy; heteroaryloxy; alkylthio; arylthio; heteroalkylthio; heteroarylthio; F; Cl; Br; I; —OH; —NO2; —CN; —CF3; —CHF2; —CH2F; —CH2CF3; —CHCl2; —CH2OH; —CH2CH2OH; —CH2NH2; —CH2SO2CH3; —C(O)Rx; —CO2(Rx); —CON(Rx)2; —OC(O)Rx; —OCO2Rx; —OCON(Rx)2; —N(Rx)2; —S(O)2Rx; —NRx(CO)Rx wherein each occurrence of Rx independently includes, but is not limited to, aliphatic, alycyclic, heteroaliphatic, heterocyclic, aryl, heteroaryl, alkylaryl, or alkylheteroaryl, wherein any of the aliphatic, heteroaliphatic, alkylaryl, or alkylheteroaryl substituents described above and herein may be substituted or unsubstituted, branched or unbranched, cyclic or acyclic, and wherein any of the aryl or heteroaryl substituents described above and herein may be substituted or unsubstituted. Additional examples of generally applicable substituents are illustrated by the specific embodiments shown in the Examples that are described herein.

The term "aryl" is given its ordinary meaning in the art and refers to aromatic carbocyclic groups, optionally substituted, having a single ring (e.g., phenyl), multiple rings (e.g., biphenyl), or multiple fused rings in which at least one is aromatic (e.g., 1,2,3,4-tetrahydronaphthyl, naphthyl, anthryl, or phenanthryl). That is, at least one ring may have a conjugated pi electron system, while other, adjoining rings can be cycloalkyls, cycloalkenyls, cycloalkynyls, aryls and/or heterocyclyls. The aryl group may be optionally substituted, as described herein. Substituents include, but are not limited to, any of the previously mentioned substituents, i.e., the substituents recited for aliphatic moieties, or for other moieties as disclosed herein, resulting in the formation of a stable compound. In some cases, an aryl group is a stable mono- or polycyclic unsaturated moiety having preferably 3-14 carbon atoms, each of which may be substituted or unsubstituted. "Carbocyclic aryl groups" refer to aryl groups wherein the ring atoms on the aromatic ring are carbon atoms. Carbocyclic aryl groups include monocyclic carbocyclic aryl groups and polycyclic or fused compounds (e.g., two or more adjacent ring atoms are common to two adjoining rings) such as naphthyl groups.

The terms "heteroaryl" is given its ordinary meaning in the art and refers to aryl groups comprising at least one heteroatom as a ring atom. A "heteroaryl" is a stable heterocyclic or polyheterocyclic unsaturated moiety having preferably 3-14 carbon atoms, each of which may be substituted or unsubstituted. Substituents include, but are not limited to, any of the previously mentioned substituents, i.e., the substitutes recited for aliphatic moieties, or for other moieties as disclosed herein, resulting in the formation of a stable compound. In some cases, a heteroaryl is a cyclic aromatic radical having from five to ten ring atoms of which one ring atom is selected from S, O, and N; zero, one, or two ring atoms are additional heteroatoms independently selected from S, O, and N; and the remaining ring atoms are carbon, the radical being joined to the rest of the molecule via any of the ring atoms, such as, for example, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like.

It will also be appreciated that aryl and heteroaryl moieties, as defined herein may be attached via an alkyl or heteroalkyl moiety and thus also include -(alkyl)aryl, -(heteroalkyl)aryl, -(heteroalkyl)heteroaryl, and -(heteroalkyl)heteroaryl moieties. Thus, as used herein, the phrases "aryl or heteroaryl moieties" and "aryl, heteroaryl, -(alkyl)aryl, -(heteroalkyl)aryl, -(heteroalkyl)heteroaryl, and -(heteroalkyl)heteroaryl" are interchangeable. Substituents include, but are not limited to, any of the previously mentioned substituents, i.e., the substituents recited for aliphatic moieties, or for other moieties as disclosed herein, resulting in the formation of a stable compound.

It will be appreciated that aryl and heteroaryl groups (including bicyclic aryl groups) can be unsubstituted or substituted, wherein substitution includes replacement of one or more of the hydrogen atoms thereon independently with any one or more of the following moieties including, but not limited to: aliphatic; alicyclic; heteroaliphatic; heterocyclic; aromatic; heteroaromatic; aryl; heteroaryl; alkylaryl; heteroalkylaryl; alkylheteroaryl; heteroalkylheteroaryl; alkoxy; aryloxy; heteroalkoxy; heteroaryloxy; alkylthio; arylthio; heteroalkylthio; heteroarylthio; F; Cl; Br; I; —OH; —NO2; —CN; —CF3; —CH2F; —CHF2; —CH2CF3; —CHCl2; —CH2OH; —CH2CH2OH; —CH2NH2; —CH2SO2CH3; —C(O)Rx; —CO2(Rx); —CON(Rx)2; —OC(O)Rx; —OCO2Rx; —OCON(Rx)2; —N(Rx)2; —S(O)Rx; —S(O)2Rx; —NRx(CO)Rx wherein each occurrence of Rx independently includes, but is not limited to, aliphatic, alicyclic, heteroaliphatic, heterocyclic, aromatic, heteroaromatic, aryl, heteroaryl, alkylaryl, alkylheteroaryl, heteroalkylaryl or heteroalkylheteroaryl, wherein any of the aliphatic, alicyclic, heteroaliphatic, heterocyclic, alkylaryl, or alkylheteroaryl substituents described above and herein may be substituted or unsubstituted, branched or unbranched, saturated or unsaturated, and wherein any of the aromatic, heteroaromatic, aryl, heteroaryl, -(alkyl)aryl or -(alkyl)heteroaryl substituents described above and herein may be substituted or unsubstituted. Additionally, it will be appreciated, that any two adjacent groups taken together may represent a 4, 5, 6, or 7-membered substituted or unsubstituted alicyclic or heterocyclic moiety. Additional examples of generally applicable substituents are illustrated by the specific embodiments described herein.

The terms "halo" and "halogen" as used herein refer to an atom selected from the group consisting of fluorine, chlorine, bromine, and iodine.

It will be appreciated that the above groups and/or compounds, as described herein, may be optionally substituted with any number of substituents or functional moieties. That is, any of the above groups may be optionally substituted. As used herein, the term "substituted" is contemplated to include all permissible substituents of organic compounds, "permissible" being in the context of the chemical rules of valence known to those of ordinary skill in the art. In general, the term "substituted" whether preceded by the term "optionally" or not, and substituents contained in formulas of this invention, refer to the replacement of hydrogen radicals in a given structure with the radical of a specified substituent. When more than one position in any given structure may be substituted with more than one substituent selected from a specified group, the substituent may be either the same or different at every position. It will be understood that "substituted" also includes that the substitution results in a stable compound, e.g., which does not spontaneously undergo transformation such as by rearrangement, cyclization, elimination, etc. In some cases, "substituted" may generally refer to replacement of a hydrogen with a substituent as described herein. However, "substituted," as used herein, does not encompass replacement and/or alteration of a key functional group by which a molecule is identified, e.g., such that the "substituted" functional group becomes, through substitution, a different functional group. For example, a "substituted phenyl group" must still comprise the phenyl moiety and cannot be modified by substitution, in this definition, to become, e.g., a pyridine ring. In a broad aspect, the permissible substituents include acyclic and cyclic, branched and unbranched, carbocyclic and heterocyclic, aromatic and nonaromatic substituents of organic compounds. Illustrative substituents include, for example, those described herein. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. Furthermore, this invention is not intended to be limited in any manner by the permissible substituents of organic compounds. The term "stable," as used herein, preferably refers to compounds which possess stability sufficient to allow manufacture and which maintain the integrity of the compound for a sufficient period of time to be detected and preferably for a sufficient period of time to be useful for the purposes detailed herein.

Examples of substituents include, but are not limited to, halogen, azide, alkyl, aralkyl, alkenyl, alkynyl, cycloalkyl, hydroxyl, alkoxyl, amino, nitro, sulfhydryl, imino, amido, phosphonate, phosphinate, carbonyl, carboxyl, silyl, ether, alkylthio, sulfonyl, sulfonamido, ketone, aldehyde, ester, heterocyclyl, aromatic or heteroaromatic moieties, —CF3, —CN, aryl, aryloxy, perhaloalkoxy, aralkoxy, heteroaryl, heteroaryloxy, heteroarylalkyl, heteroaralkoxy, azido, amino, halide, alkylthio, oxo, acylalkyl, carboxy esters, -carboxamido, acyloxy, aminoalkyl, alkylaminoaryl, alkylaryl, alkylaminoalkyl, alkoxyaryl, arylamino, aralkylamino, alkylsulfonyl, -carboxamidoalkylaryl, -carboxamidoaryl, hydroxyalkyl, haloalkyl, alkylaminoalkylcarboxy-, aminocarboxamidoalkyl-, cyano, alkoxyalkyl, perhaloalkyl, arylalkyloxyalkyl, and the like.

BRIEF DESCRIPTION OF THE DRAWINGS

The invention is further described by the following figures. These are not intended to limit the scope of the invention, but represent preferred embodiments of aspects of the invention provided for greater illustration of the invention described herein.

DESCRIPTION OF THE FIGURES

FIG. 1: (A) One dimensional ladder type IBU of [{Cu$_2$(4,4'-bpy)$_{0.5}$}(1,4-NDPA)] (1,4-NDPA is 1,4-naphthalenediphosphonate) (TUB-75) expanding. (B) The perspective view of rectangular void channels along with the top view of the one-dimensional IBU, where the band gap of the compound is 1.4 eV. (coloring; light blue is N, dark blue is Cu, yellow is P, red is O, black is C.) (C) The one dimensional inorganic building unit of [Co$_2$(H$_4$-MTPPA)]·3NMP·H$_2$O. The same pattern of IBU could be observed with other metal ions as well.

Figure 2:
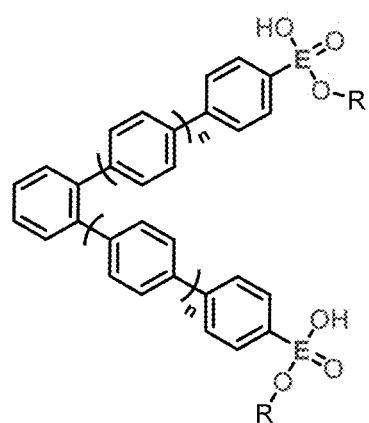
Figure 2:
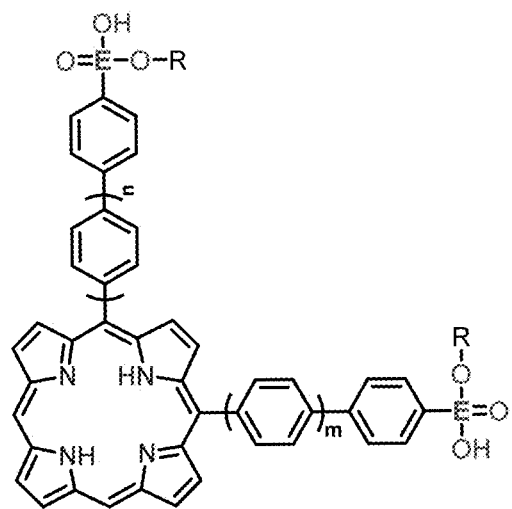
Figure 2:
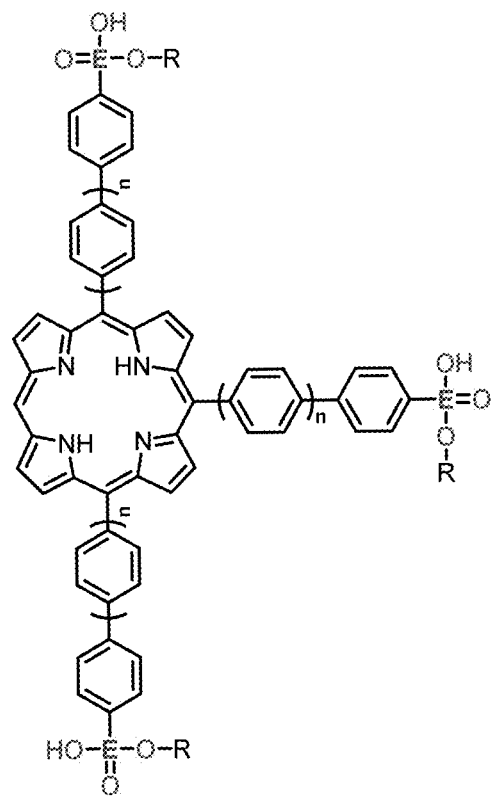
Figure 2:
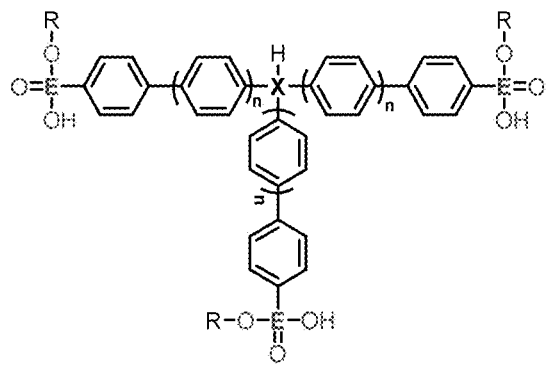
Figure 2:
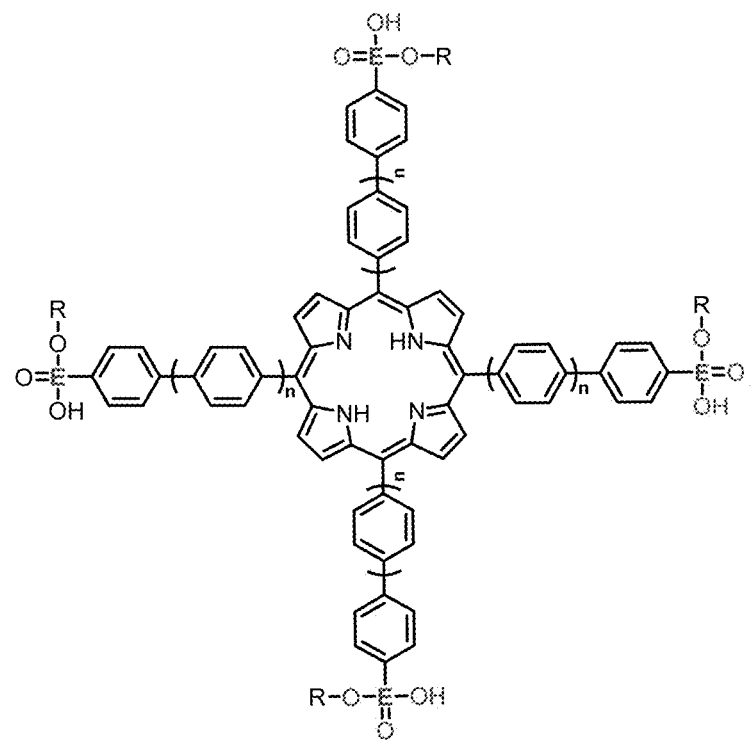
Figure 2:
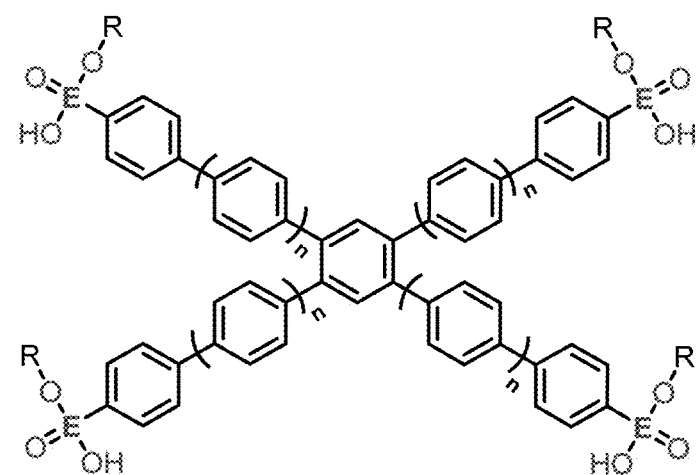
Figure 2:
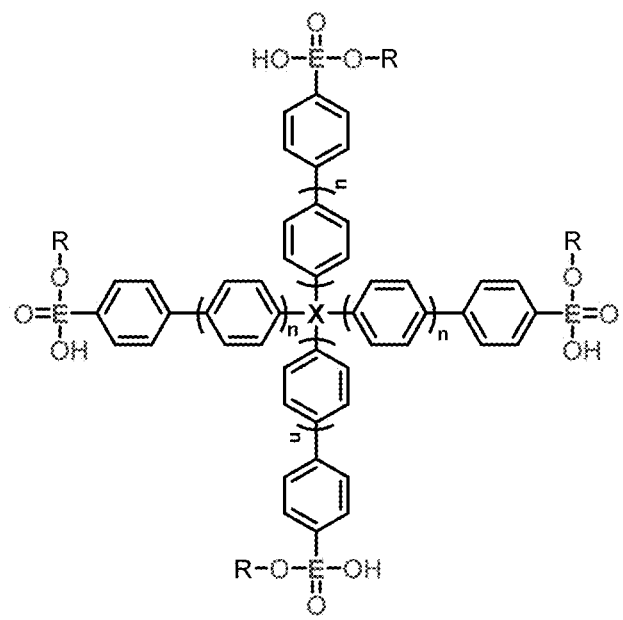
Figure 2:
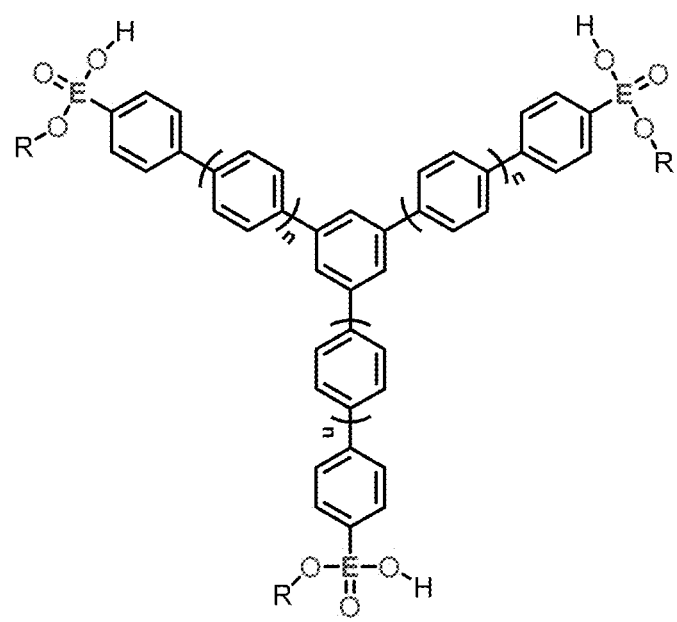
Figure 2:
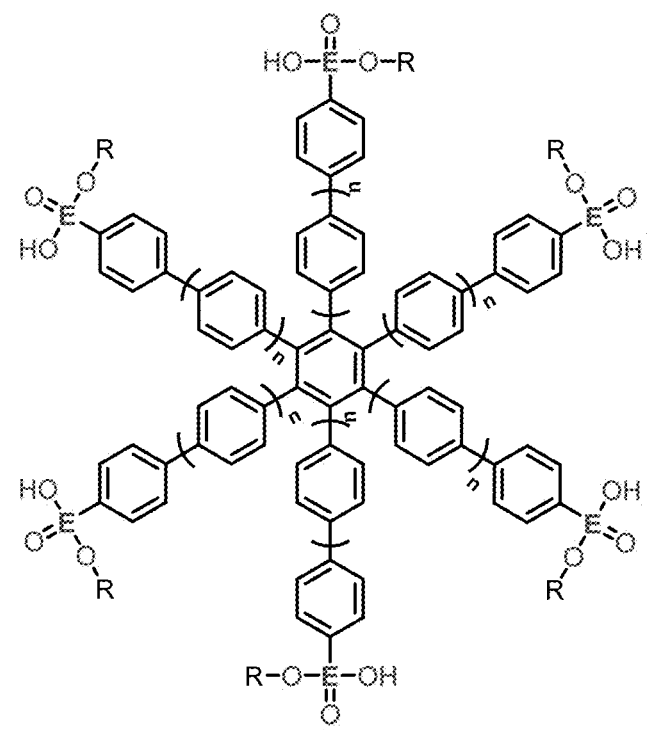

FIG. 2: Preferred examples of organic linkers of the MOFs of the invention comprising different geometrical cores. (A) V, (B) L, (C-D) T, (E-G) X, (H) Y shaped and (I) hexagonal linkers with extending tether arms, wherein X=C or Si; E=P or As; n=0,1,2 or 3; R=H, methyl, ethyl or isopropyl.

FIG. 3: (A) UV absorbance spectra and (B) tauc plot of [{Cu$_2$(4,4'-bpy)$_{0.5}$}(1,4-NDPA)] (1,4-NDPA is 1,4-naphthalenediphosphonate) (TUB-75) samples creating band gap value of 1.4 eV.

Figure 4:
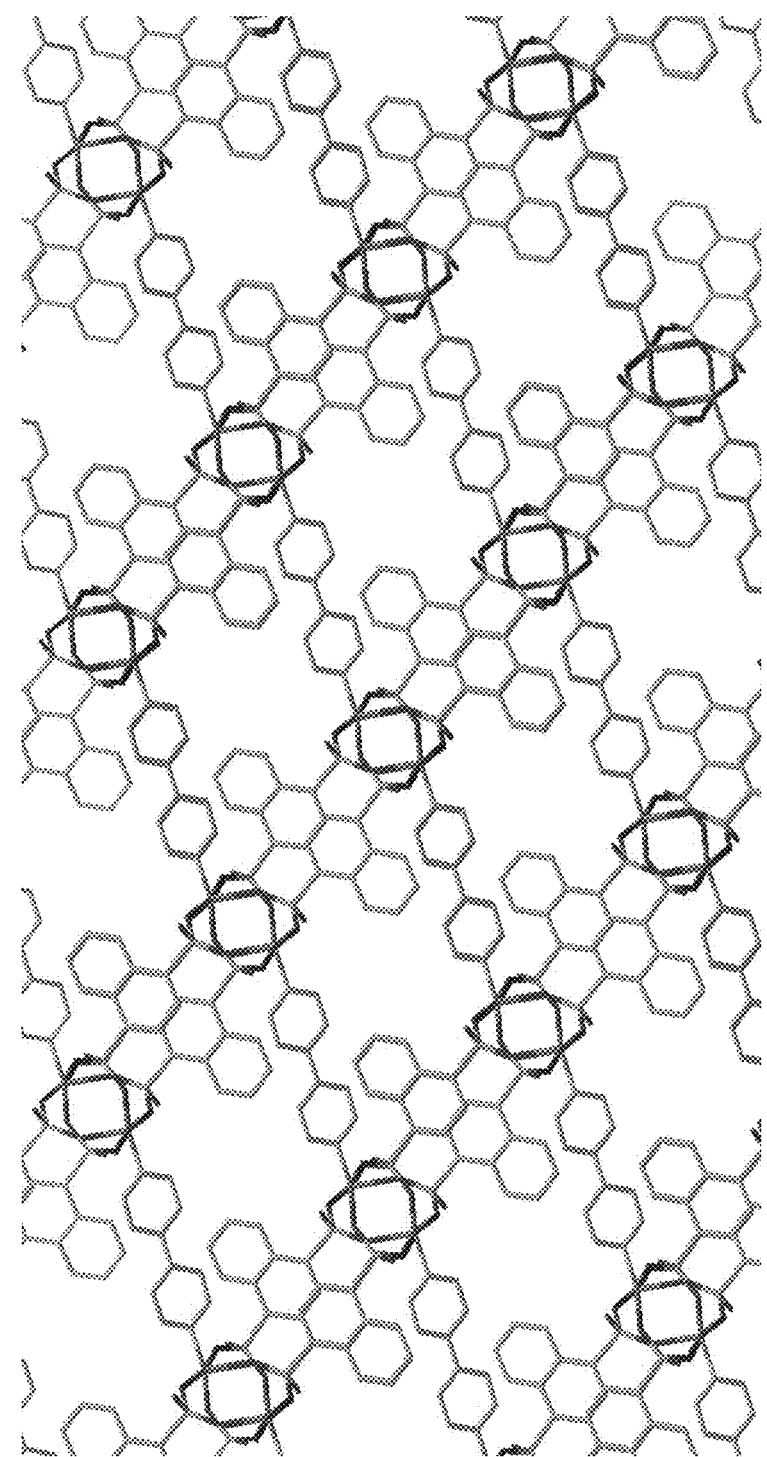

FIG. 4: The picture of a section of the crystal structure of [{Cu(4,4'-bpy)$_{0.5}$(1,4-NDPA-H$_2$)] where the one dimensional inorganic building unit composed of corner sharing Cu—O—P—O—Cu—O—P—O rings are connected by 1,4-napthalenediphosphonic acid and 4,4'-bipyridine. Hydrogen atoms are omitted for clarity.

Figure 5:
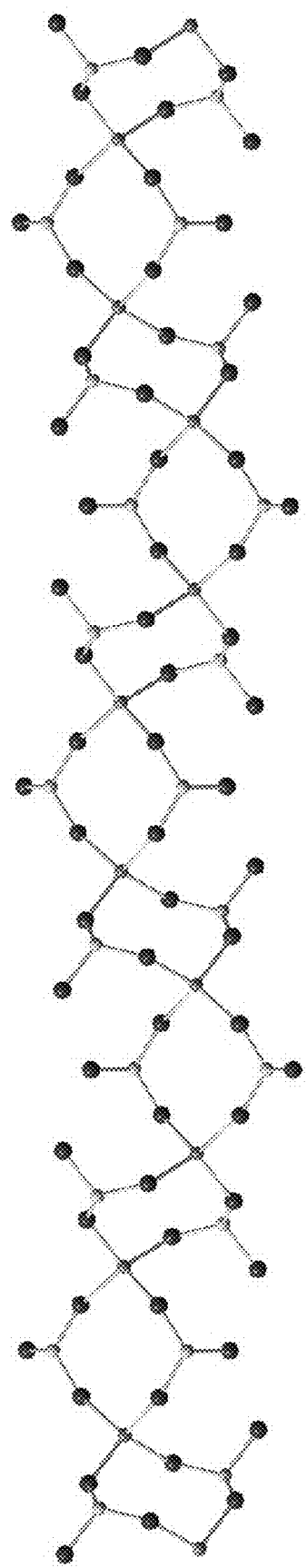

FIG. 5: One dimensional inorganic building unit of three dimensional Zn$_2$H$_4$MTPPA MOF.

Figure 6:
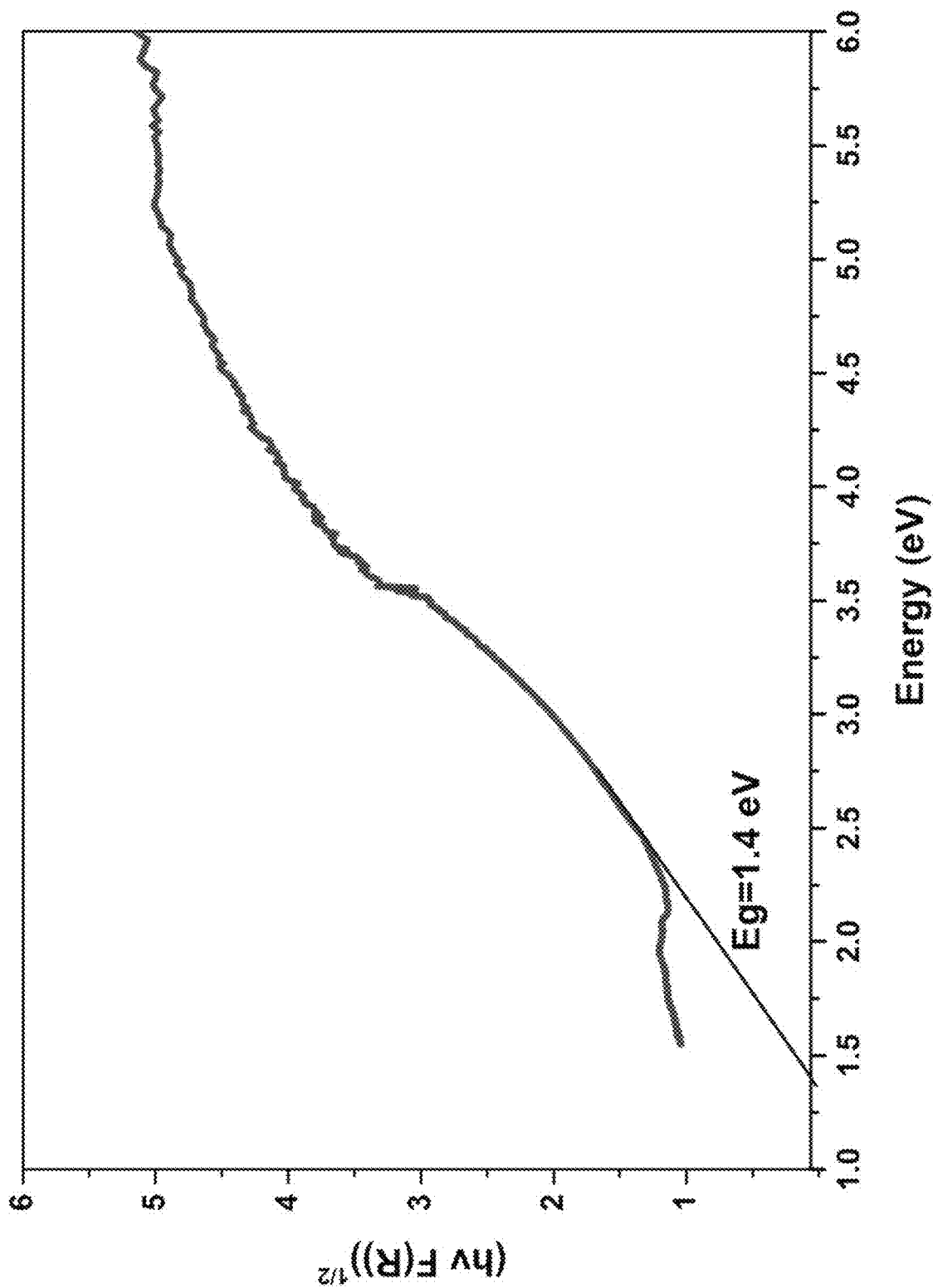

FIG. 6: Tauc Plot of [{Cu(H$_2$O)}(2,6-NDPA)$_{0.5}$], which has a band gap value of 1.4 eV.

Figure 7:
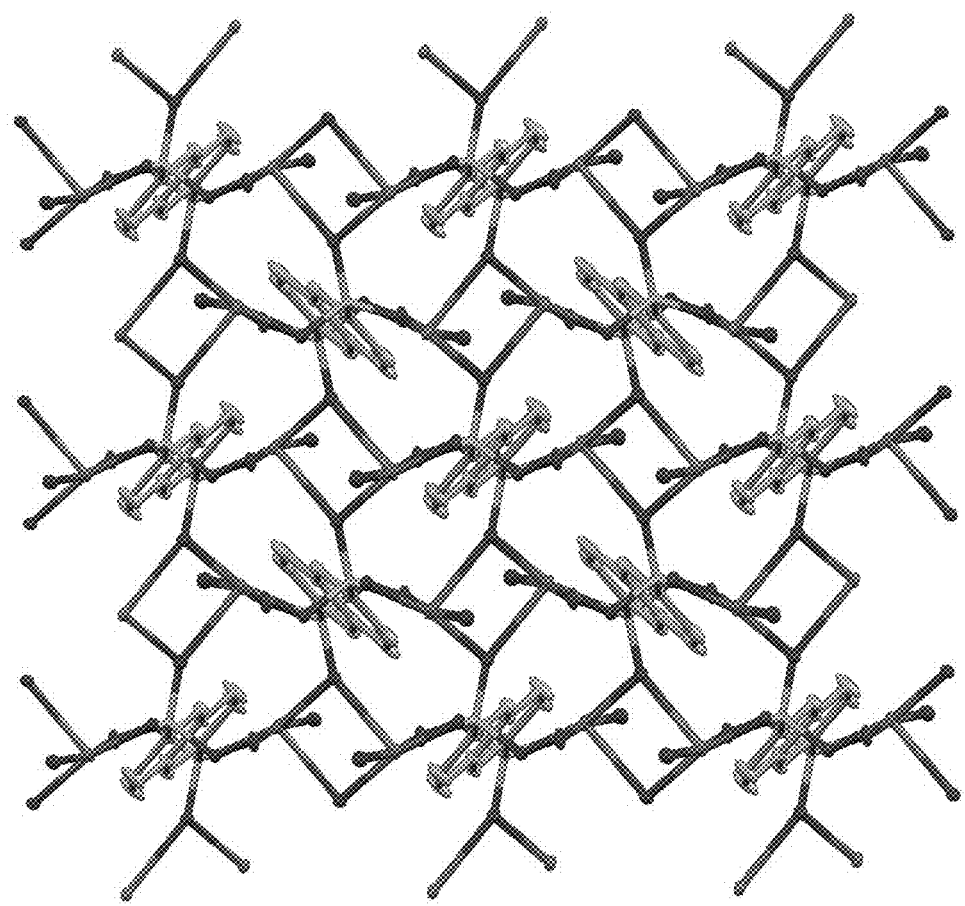

FIG. 7: Crystal structure of the two dimensional inorganic building of [{Cu(H$_2$O)}(2,6-NDPA)$_{0.5}$] and attached 2,6-napthalenediphosphonate linkers between the layers.

Figure 8:
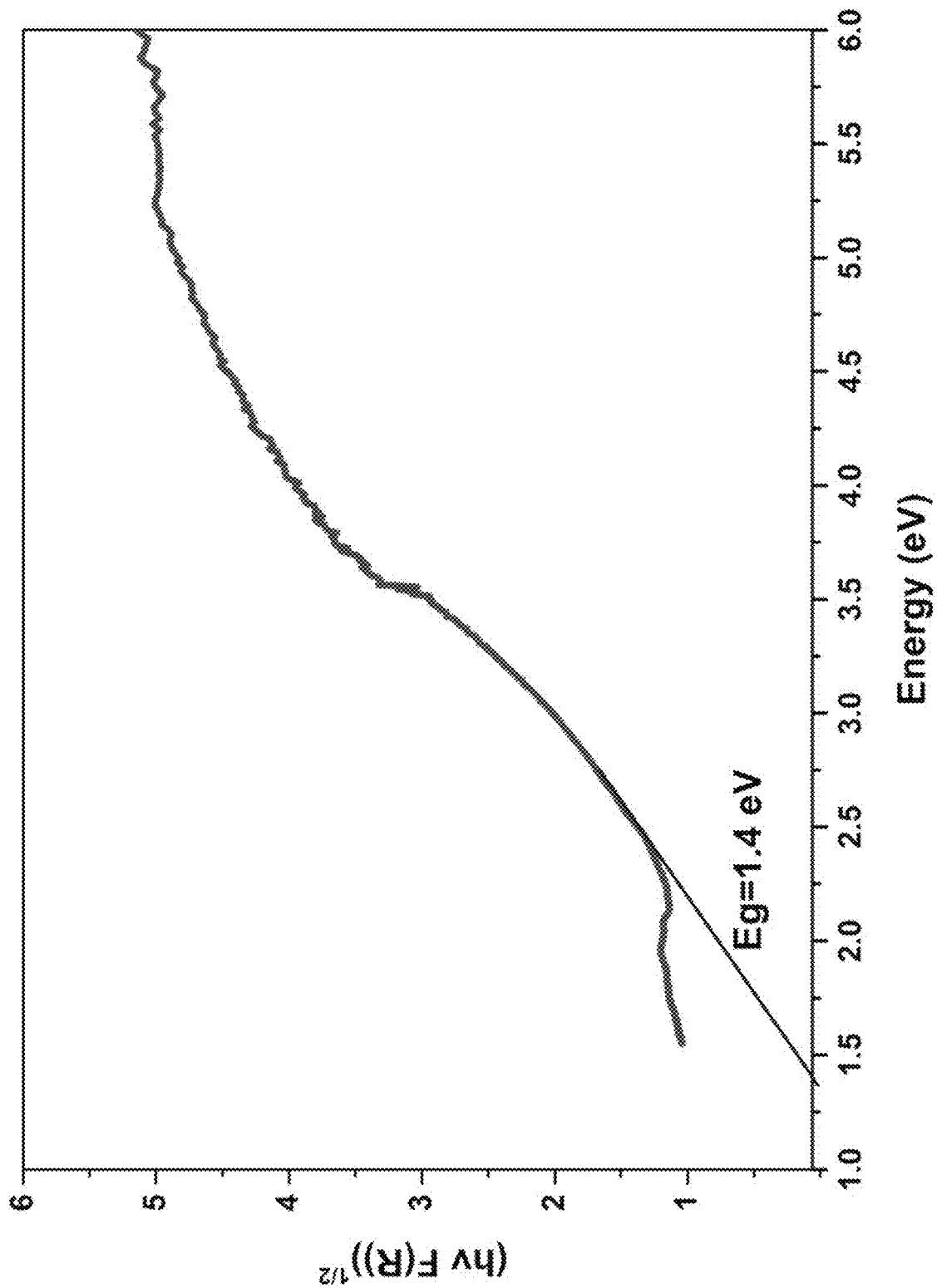

FIG. 8: The Tauc Plot of [Zn{N(CH$_3$)$_2$}(6-bromonapthalene-2-yl)phosphonate], which has a band gap value of 0.8 eV.

Figure 9:
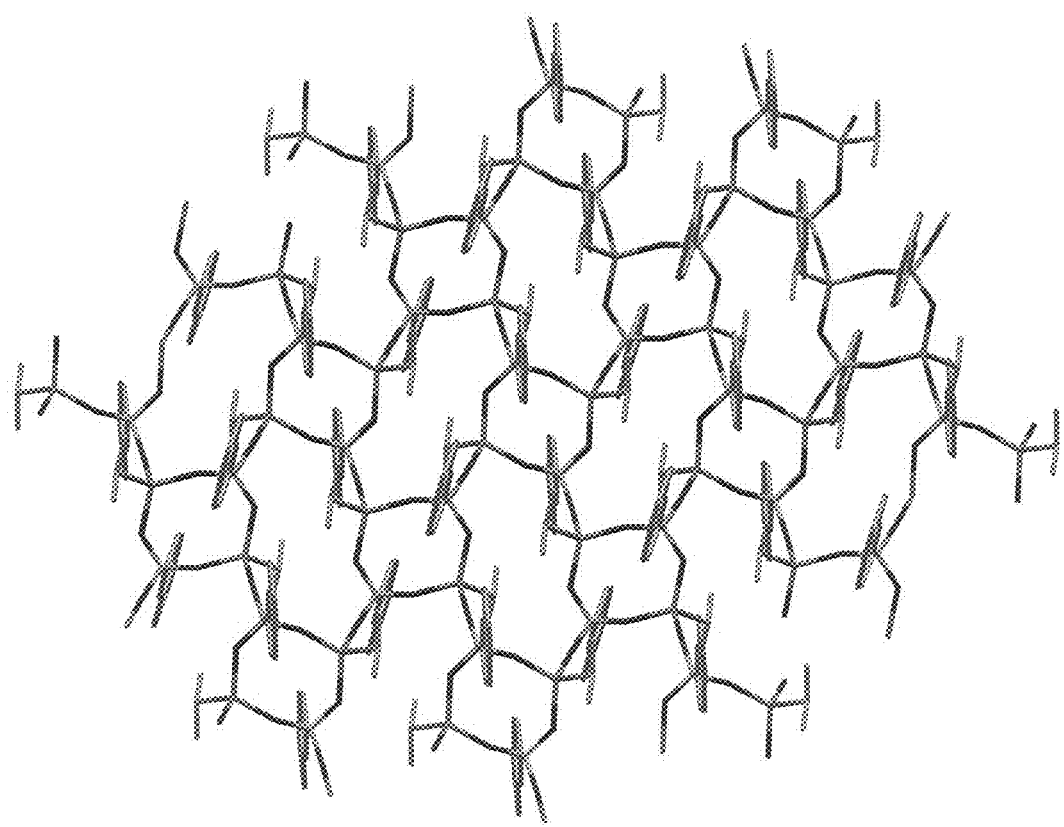

FIG. 9: Two dimensional inorganic building unit of [Zn{N(CH$_3$)$_2$}(6-bromonapthalene-2-yl)phosphonate] and orientation of its organic components.

Figure 10:
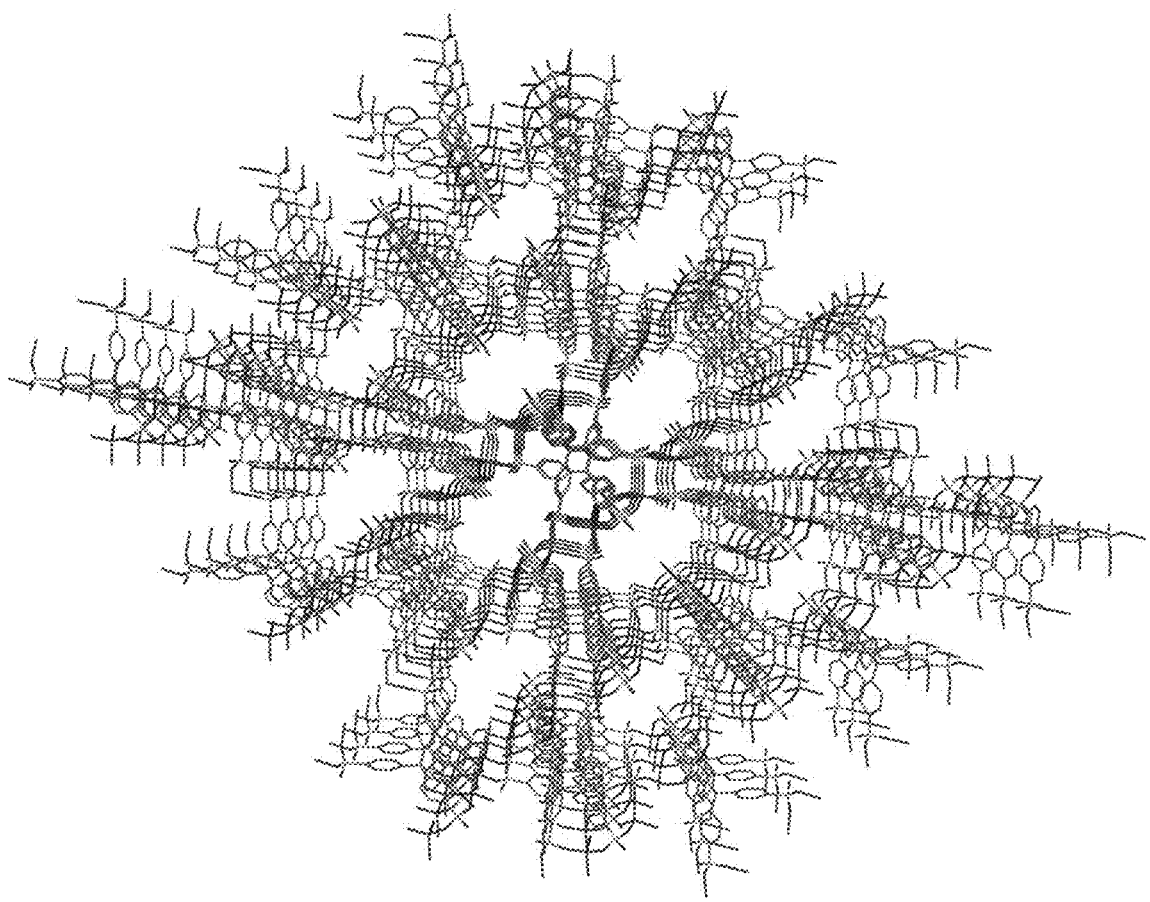

FIG. 10: Crystal structure and void channels of [Co$_2$(H$_4$-MTPPA)]·3 NMP·H$_2$O (NMP and water solvent molecules are omitted in the crystal structure).

Figure 11:
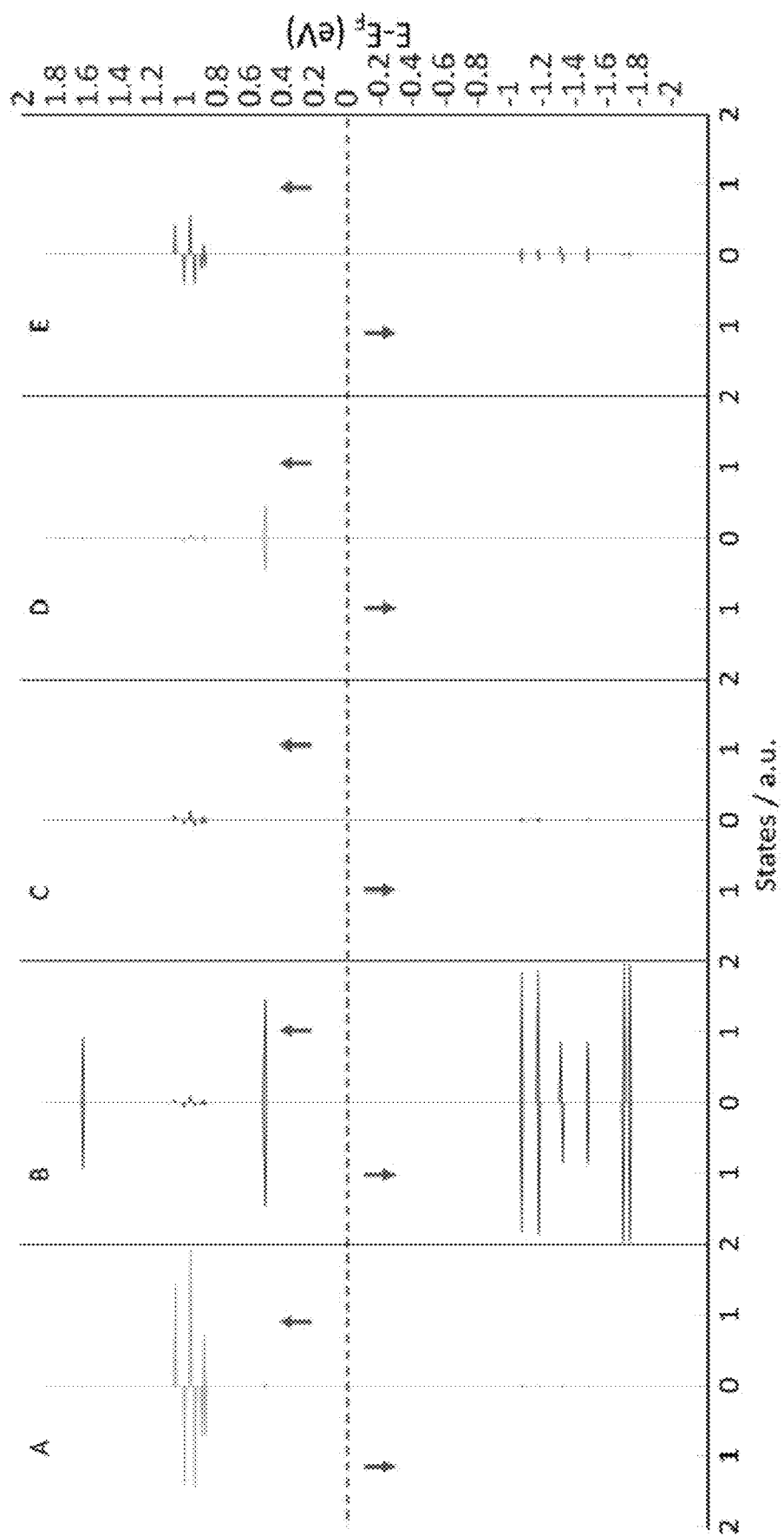

FIG. 11: Spin-up and spin-down projected density of states for TUB75 in the AFM configuration. A) Copper. B) Carbon. C) Nitrogen. D) Phosphorous. E) Oxygen.

Figure 12:
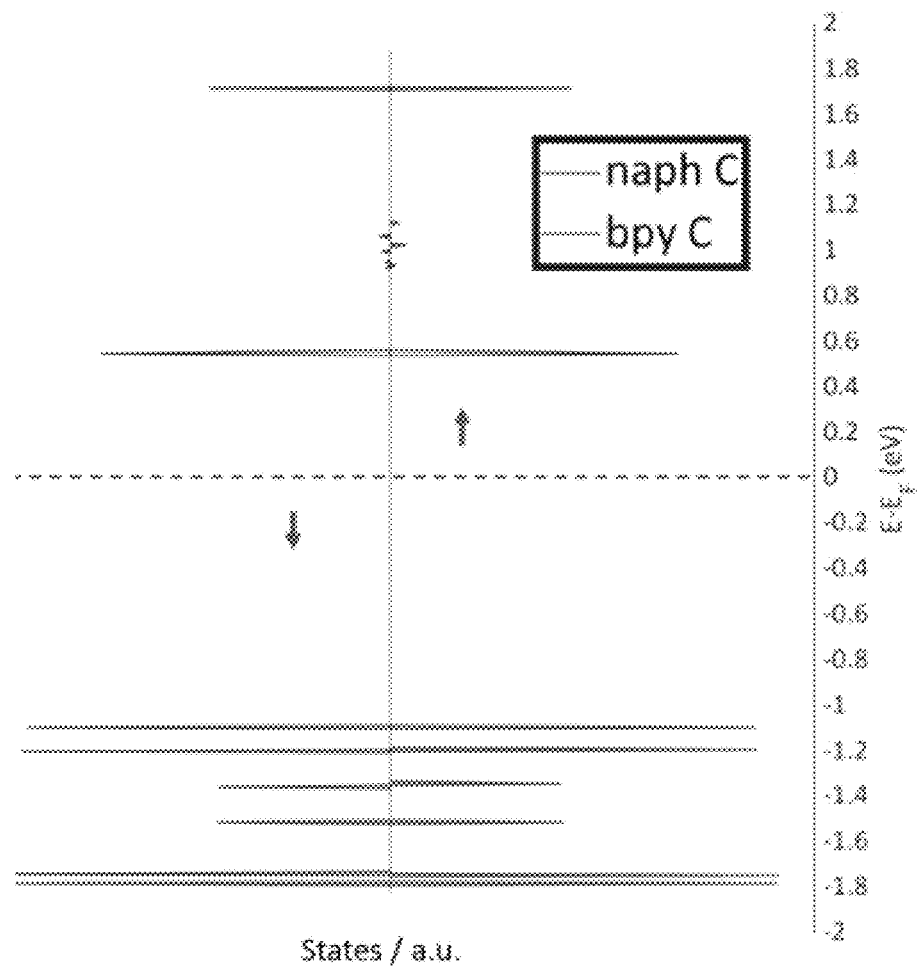

FIG. 12: Spin-up and spin-down projected density of states of the 1,4-NDPA and 4,4'-bpy carbons for TUB75 in the AFM configuration.

Figure 13:
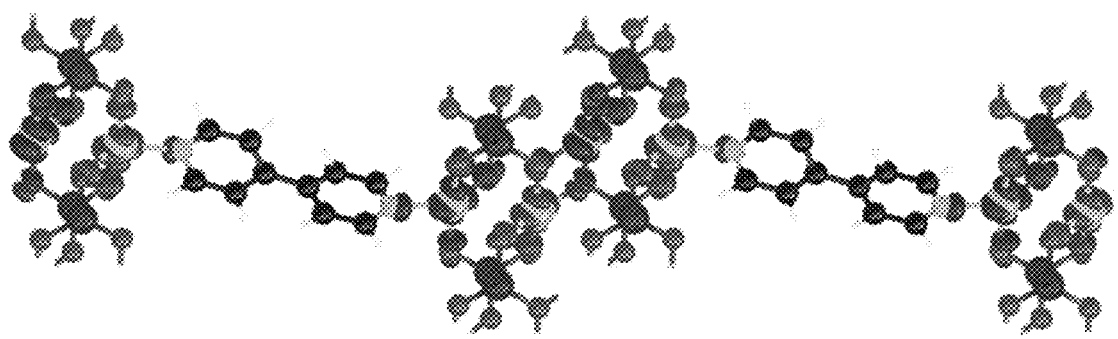

FIG. 13: Spin density isosurface of a portion of the IBU. beta/alpha spin density is shown in blue/red and corresponds to a difference between the spin-up and spin-down density of 0.005 electrons per Å$^3$. Color definitions: O—red; N—orange; Cu—cyan; C—black; P—blue; H—white.

Figure 14:
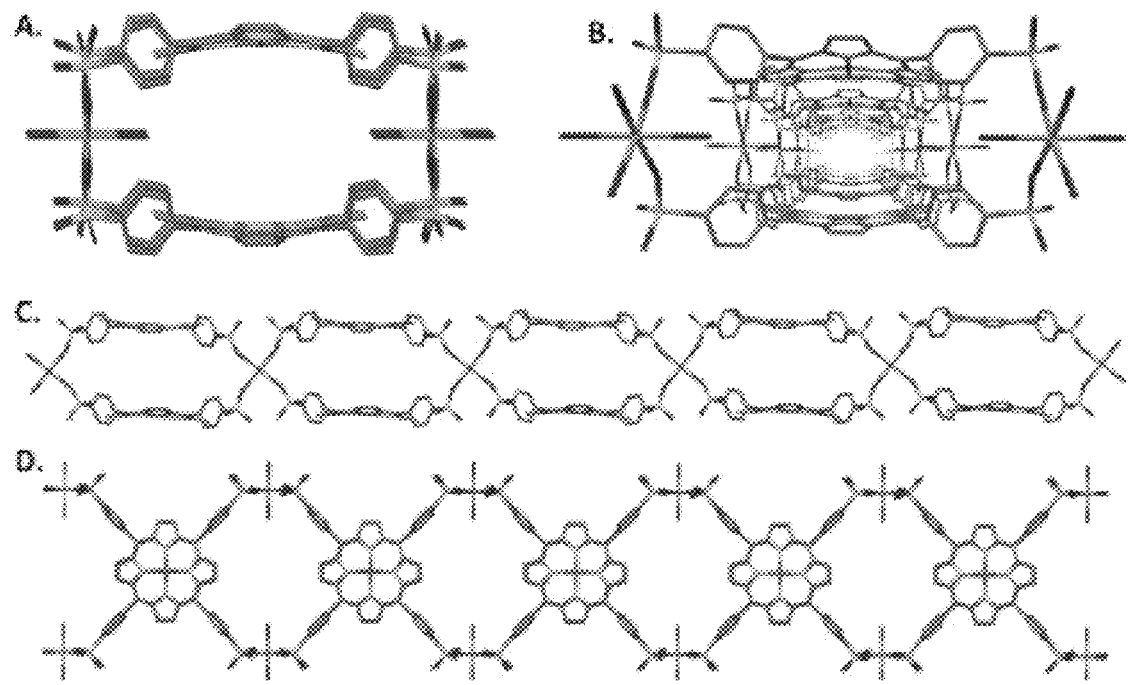

FIG. 14: a) Edge view of the rectangular void channel of GTUB-4. b) Perspective view of the rectangular void channel. c) Side-top view of tubular structure and its hexagonal sieves. d) Another side view facing the CuH$_4$TPPA$^{4-}$ building unit with square void channels.

FIG. 15: a) b) and d) contain different views of the cross-packed GTUB-4 tubes in the crystal lattice. c) Cu—H$_4$TPPA$^{4-}$ metal-binding modes with Ni.

Figure 16:
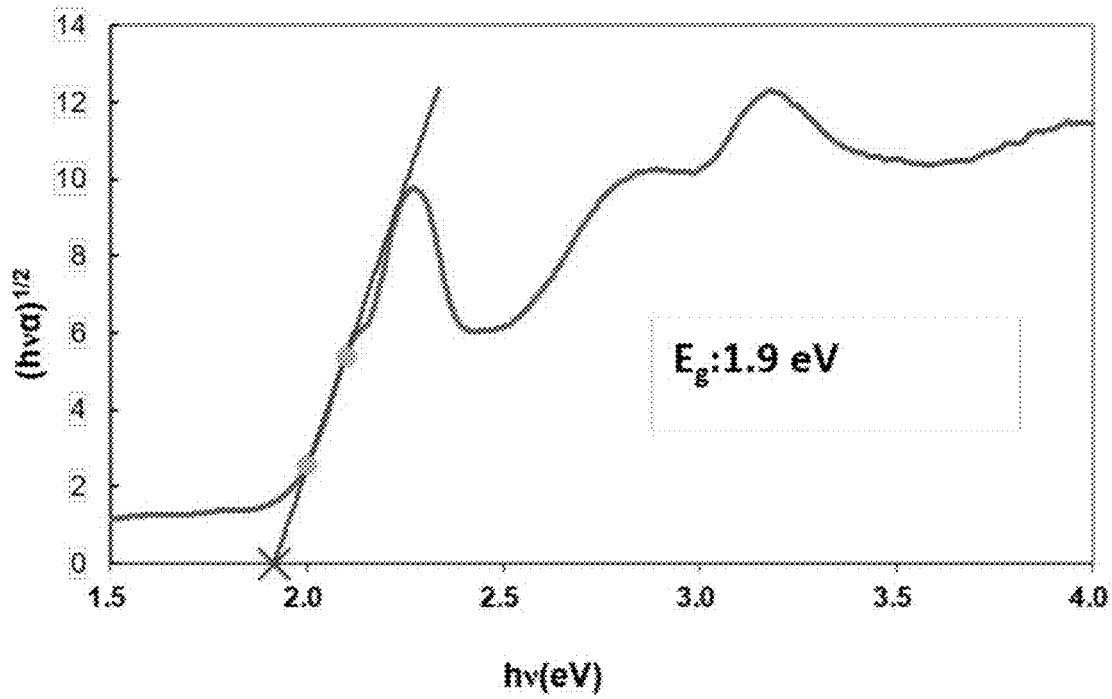

FIG. 16: Estimation of the indirect band gap of GTUB-4 via Tauc plotting of the DRS spectrum.

Figure 17:
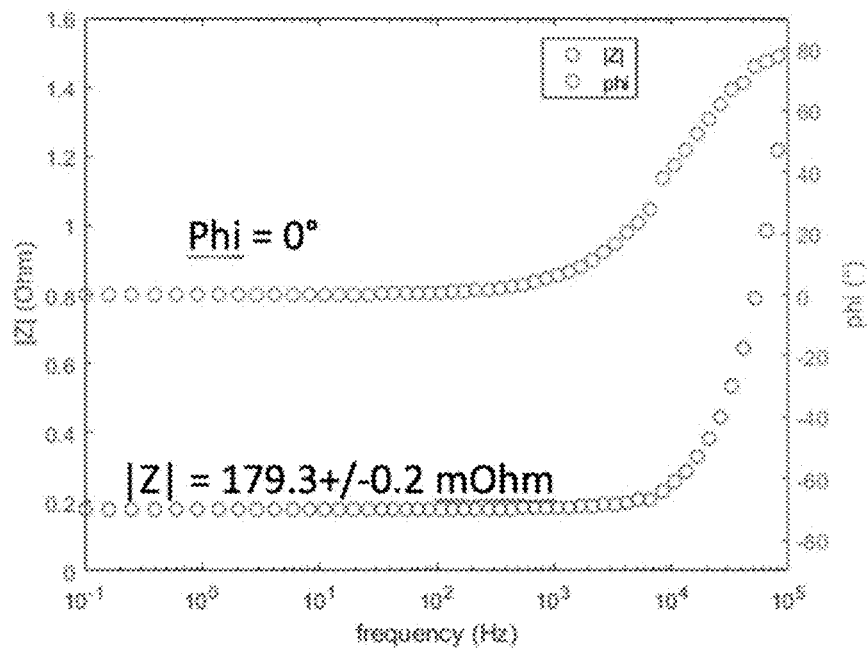

FIG. 17: Impedance spectrum of TUB40 revealing purely Ohmic behavior with |Z|=179.3±0.2 mΩ between 0.1 Hz and ~500 Hz. Above ~500 Hz, |Z| and φ increase due to the increasing parasitic contributions from the connectors and cables in the setup.

Figure 18:
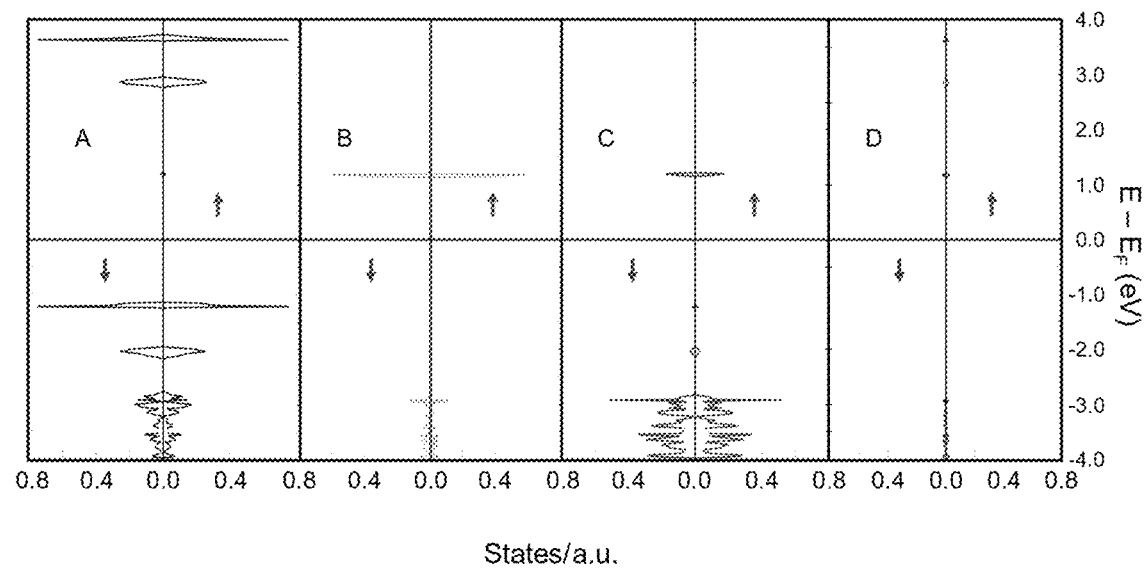

FIG. 18: Spin-up (red arrow) and spin-down (blue arrow) projected density of states for TUB40 in the AFM configuration. (A) Carbon, (B) Copper, (C) Oxygen, (D) Phosphorous.

Figure 19:
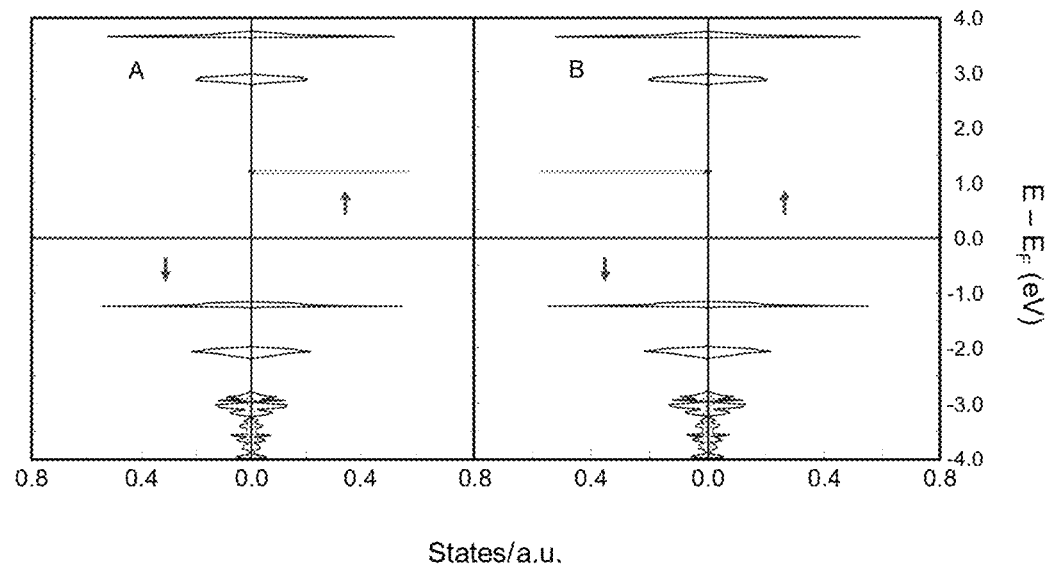

FIG. 19: Spin-up (red arrow) and spin-down (blue arrow) projected density of states for TUB40 in the AFM configuration, showing the contributions from p-orbitals of the carbon atoms (black) and d-orbitals of the copper atoms (cyan) with (A) an excess β-spin and (B) an excess α-spin.

Figure 20:
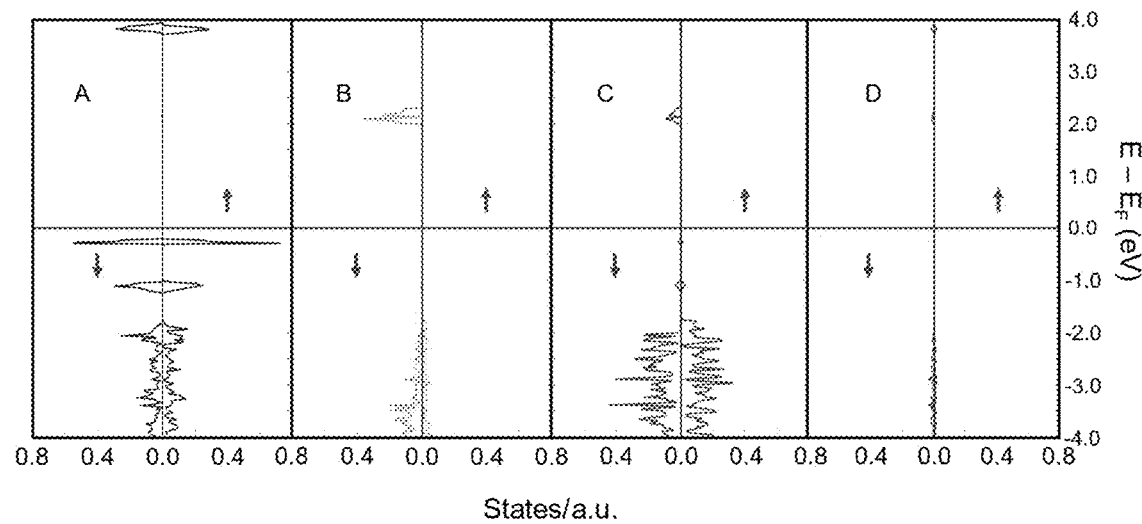

FIG. 20: Spin-up (red arrow) and spin-down (blue arrow) projected density of states for TUB40 in the FM configuration. (A) Carbon, (B) Copper, (C) Oxygen, (D) Phosphorous.

Figure 21:
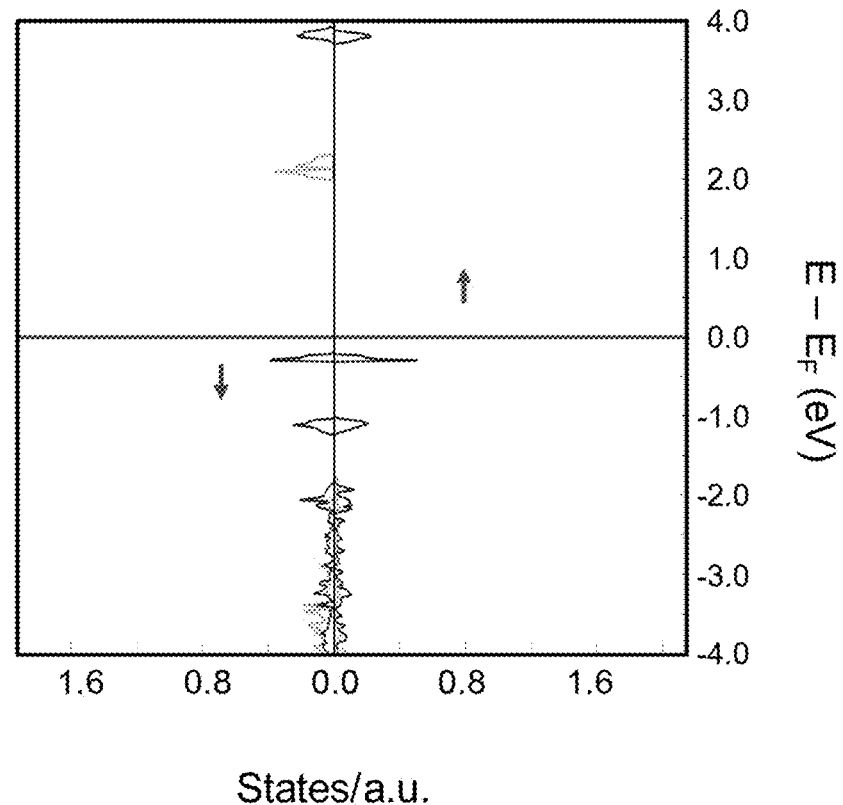

FIG. 21: Spin-up (red arrow) and spin-down (blue arrow) projected density of states for TUB40 in the FM configuration, showing the contributions from p-orbitals of the carbon atoms (black) and d-orbitals of the copper atoms (cyan) with an excess α-spin.

Figure 22:
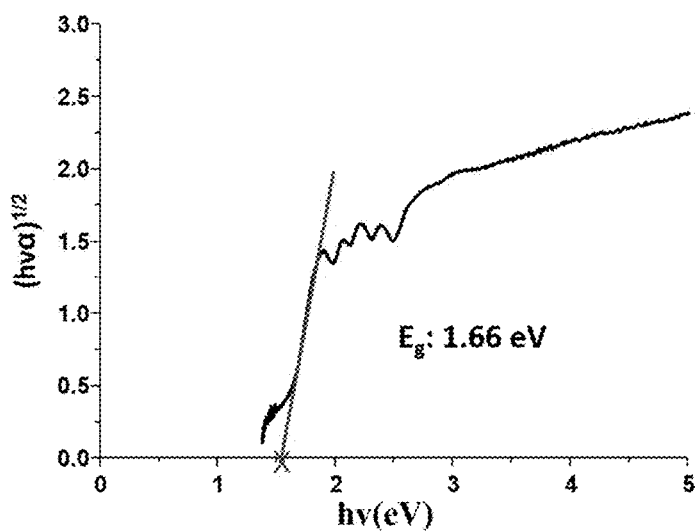
Figure 22:
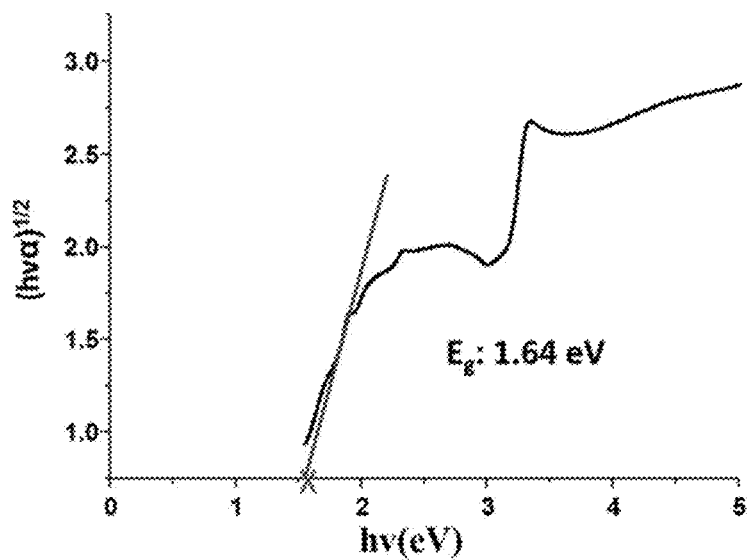

FIG. 22: Indirect band gaps of A) Zn$_2$(H$_4$TPPA) (GTUB2) and B) Zn$_2$(Cu—H$_4$TPPA) (GTUB3).

Figure 23:
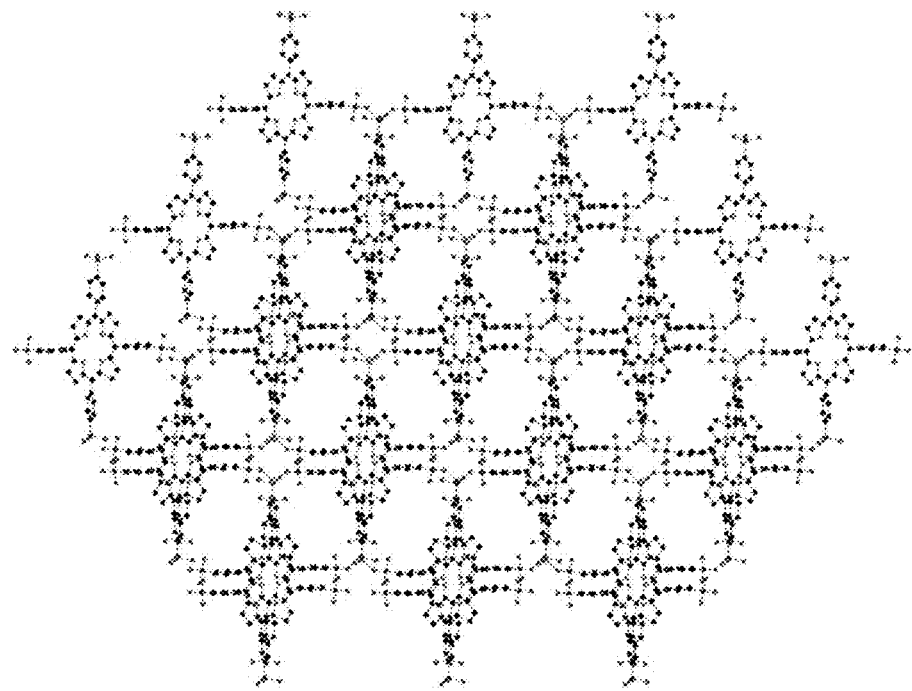
Figure 23:
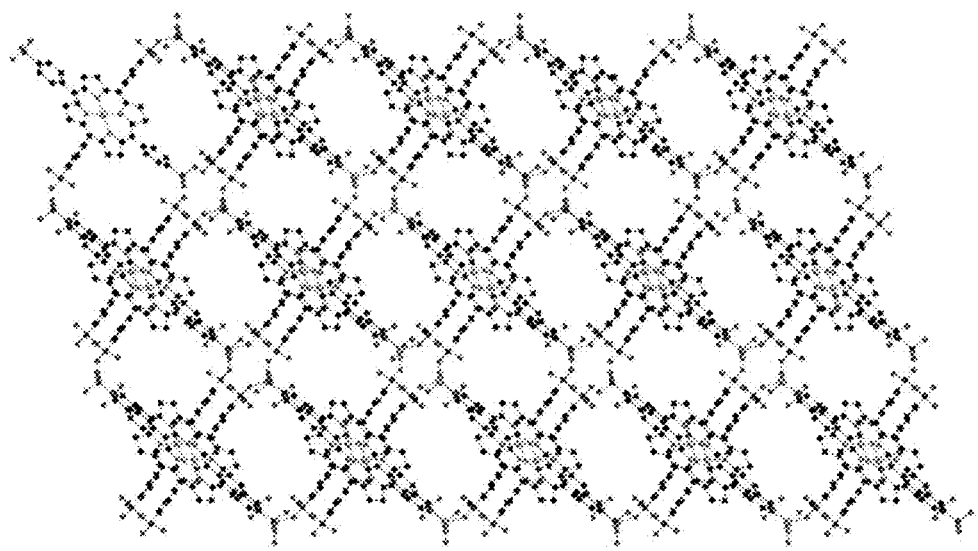

FIG. 23: Crystal Structures of A) GTUB2 and B) GTUB3 respectively

Figure 24:
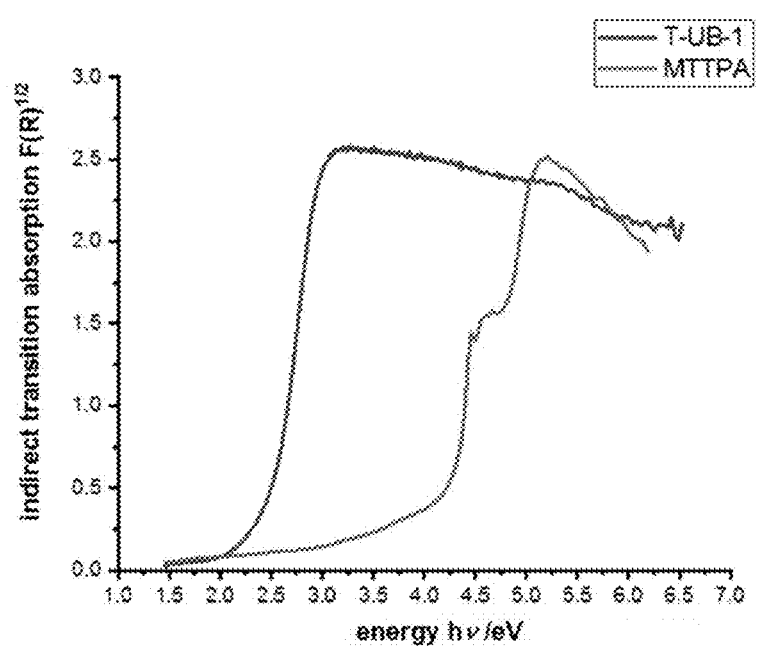
Figure 24:
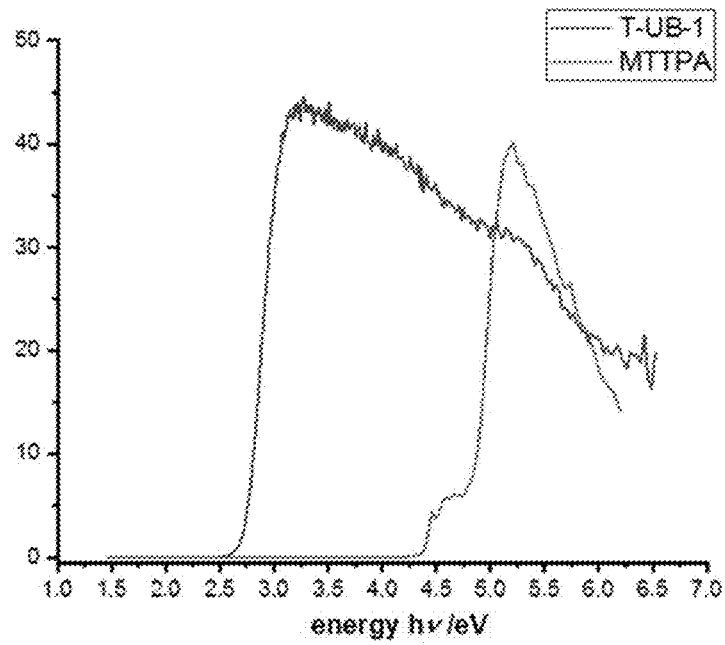

FIG. 24: A) Comparison of the indirect band gap measurement of Cu$_3$(H$_5$-MTPPA)$_2$ (black line) and the linker MTPPA (red line) via Tauc plotting of UV-Vis spectra. B) Comparison of the direct band gap measurement of Cu$_3$(H$_5$-MTPPA)$_2$ via and the linker MTPPA via Tauc plotting of UV-Vis spectra.

Figure 25A:
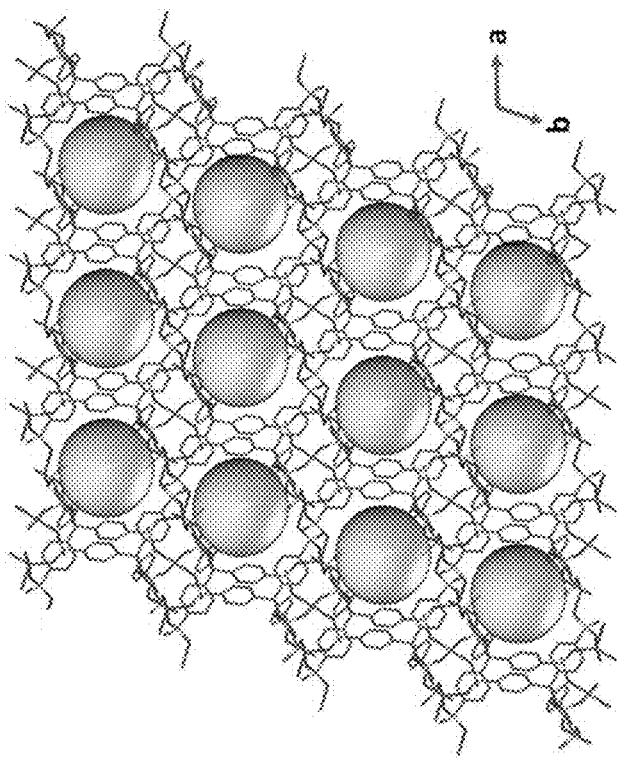
Figure 25B:
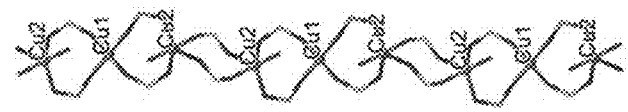
Figure 25C:
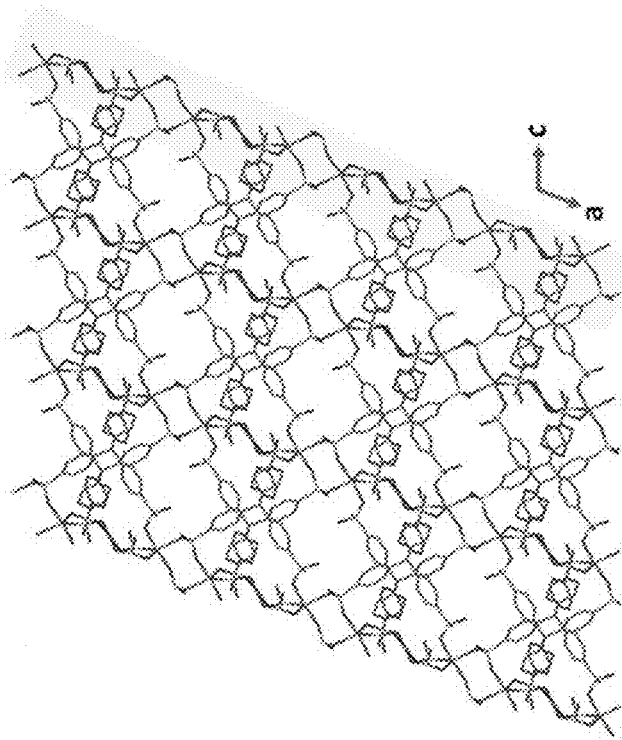

FIG. 25: a) The view of rectangular void channels in Cu$_3$(H$_5$-MTPPA)$_2$ on ac plane b) The structure of the one-dimensional IBU in Cu$_3$(H$_5$-MTPPA)$_2$ c) The view of parallelogram void channes on the ab plane.

Figure 26:
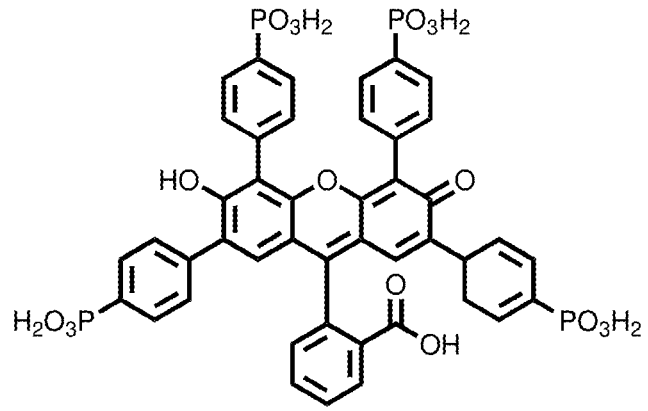
Figure 26:
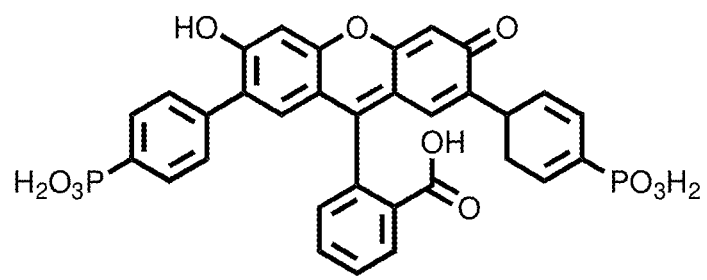

FIG. 26: Examples of phosphonic acid linkers with the fluorescein core. In these examples phenylphosphonic acids are linked to the fluorescein core.

Figure 27:
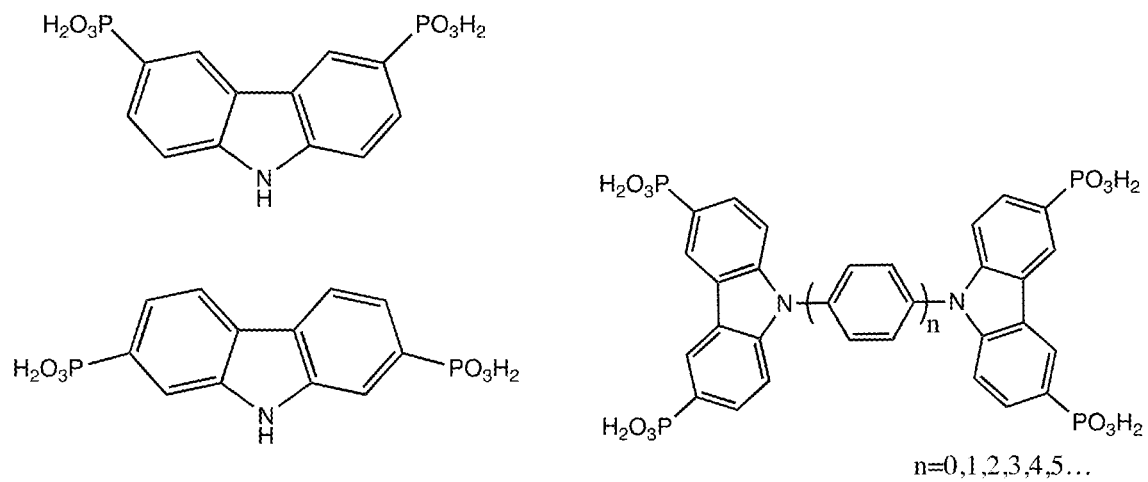

FIG. 27: Examples of phosphonic acid linkers with the carbazole core.

Figure 28:
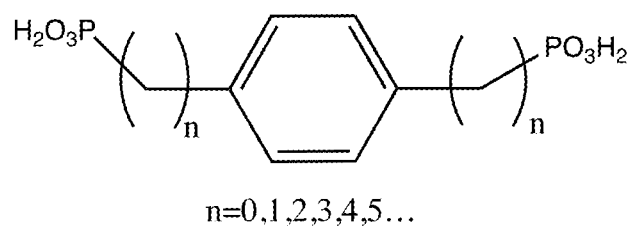

FIG. 28: Example phosphonic acid linkers with aliphatic linkage between the aromatic core and the metal binding unit.

Figure 29:
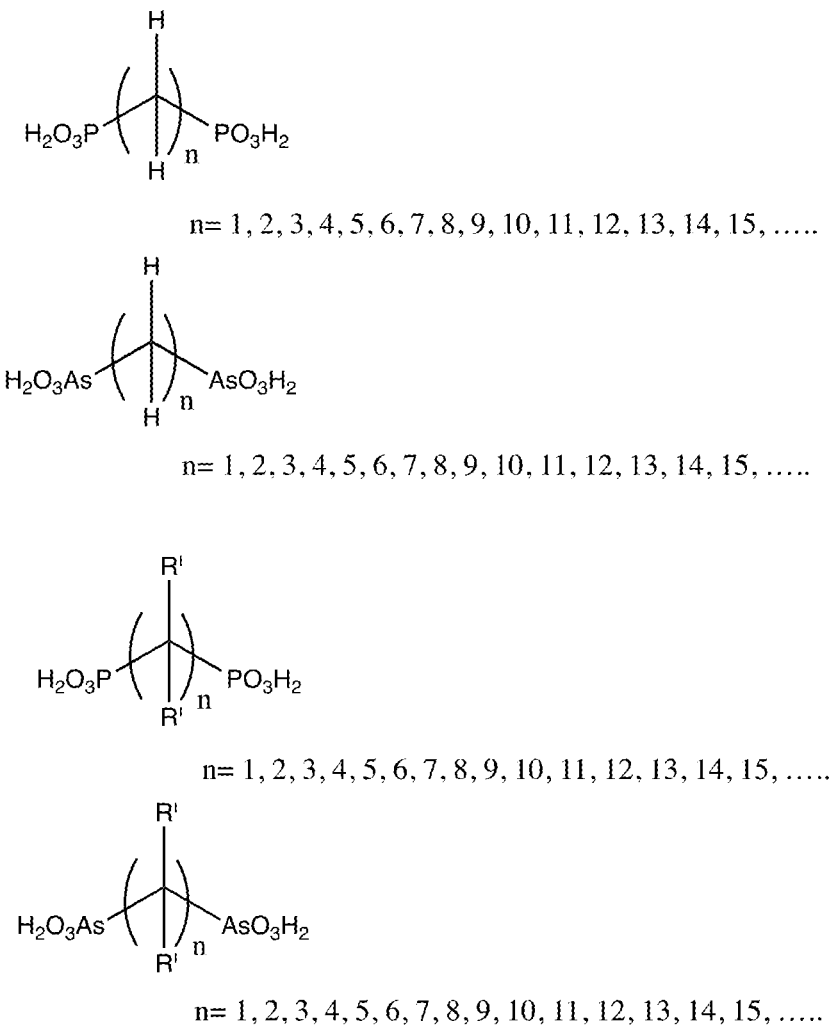

FIG. 29: Example of aliphatic or alkylene phosphonic acid and arsonic acid linkers, where R' can be H, F, Cl, Br, I, NO$_2$ and/or alkyl, aryl, phosphonic acid, alkyl phosphonic acids including methylphosphonic acid, ethylphosphonic acid, aryl-phosphonic acids, including phenylphosphonic acid, arsonic acids, alkyl arsonic acids including methylarsonic acid, ethylarsonic acid, aryl-arsonic acids, including phenylarsonic acid, phosphinates, aryl-phosphinates, and monoesters of the respective acid groups. Different R' can be the same or different within one of the disclosed formulas. n can be any of the indicated number 1-15 or more.

EXAMPLES

The invention is further described by the following examples. These are not intended to limit the scope of the invention but represent preferred embodiments of aspects of the invention provided for greater illustration of the invention described herein.

The MOFs can be synthesized using the arylphosphonic acid or arylarsonic acid linkers presented in FIG. 2 and Tables 1 and 2 and their monoester forms. Such MOFs could be synthesized using hydrothermal, solvothermal reactions, conventional MOF reactions and also mechanochemistry could be used to synthesize such MOFs. Extended tether lengths of the linkers could be used to optimize the pore sizes. Using extended tethers could create MOFs with surface areas larger than 2000 m$^2$/g. Using different metal ions could optimize the conductivity of the MOF while retaining the same framework structure.

The organic linkers presented in FIGS. 2 and Tables 1 and 2 can be synthesized via Suzuki Cross Coupling Method [*Synthesis of Some Di- and Tetraphosphonic Acids by Suzuki Cross-Coupling*, A. Schütrumph, A. Duthie, E. Lork, G. Yücesan and J. Beckmann, Z. Allgem. Anorg. Chem., 2018, 644 (19), 1134-1142]. The conventional, Pd and Ni catalyzed Arbuzov reactions can also be used to synthesize organophosphonic acid linkers. Arsonic acid analogues can also be synthesized using the same Suzuki Cross Coupline methodology and also using Bart Scheller Methods [*Substituted phenylarsonic acids; structures and spectroscopy*, N. C. Lloyd, H. W. Morgan, B. K. Nicholson, R. S. Ronimus, Journal of Organometallic Chemistry, 2008, 693, 2443-2450; *The Preparation of Aromatic Arsonic and Arsinic Acids by the Bart, Bechamp, and Rosenmund Reactions*, C. S. Hamilton, J. F. Morgan, In Organic Reactions; John Wiley & Sons, Inc., 2004; pages 415-454 (DOI:10.1002/0471264180. or002.10)].

We have measured the tauc plot of the compound [{Cu$_2$ (4,4'-bpy)$_{0.5}$}(1,4-NDPA)] (TUB75, example 2) (1,4-NDPA is 1,4-naphthalenediphosphonate) in FIGS. 3A and B, which indicates that band gap of to be 1.4 eV. The tauc plot of compound [{Cu(H$_2$O)}(2,6-NDPA)0.5] (TUB40, example 4) indicated that the band gap to be 1.4 eV. The Tauc Plot of compound [Zn{N(CH$_3$)$_2$}(6-bromonapthalene-2-yl)phosphonate] indicated a band gap value of 0.8 eV.

Example 1

Conductive phosphonate-MOFs and arsonate-MOFs can be constructed around the organic molecules having at least one phosphonic acid or arsonic acid units in any geometrical orientation on the aromatic organic linker core. The conductive MOFs can be also constructed using any organic linker having at least one phosphonic acid monoester or arsonic acid monoester in any geometrical orientation around the organic scaffolds. The conductive phosphonate and arsonate-MOFs can be thermally stable up to 620° C.

The conductive MOFs can be synthesized using non limiting monovalent metal ions, Na$^+$, Li$^+$, Cs$^+$, Cu$^+$, Au$^+$ and Ag$^+$, divalent Zn$^{2+}$, Cu$^{2+}$, Mg$^{2+}$, Ba$^{2+}$, Ca$^{2+}$, Co$^{2+}$, Ni$^{2+}$, $Cd^{2+}$ or trivalent $Co^{3+}$, $Al^{3+}$, $Fe^{3+}$, $Ti^{3+}$ or tetravalent $Ti^{4+}$, $Zr^{4+}$, $V^{4+}$, $Hf^{4+}$ with the organic linkers bearing phosphonic acid and arsonic acid metal binding groups.

Non-metal binding organic functional groups or elements such as halogens with different electronegativities can be covalently attached to the linker scaffold and such elements F, Cl, Br, I, or non-metal binding functional groups OH, $NO_2$, or non-metal binding alkyl groups can be influential in optimizing the conductive behavior of the MOF.

Mechanochemistry can be used to synthesize the phosphonate and arsonate-MOFs in larger quantities.

Example 2

Figure 1A:
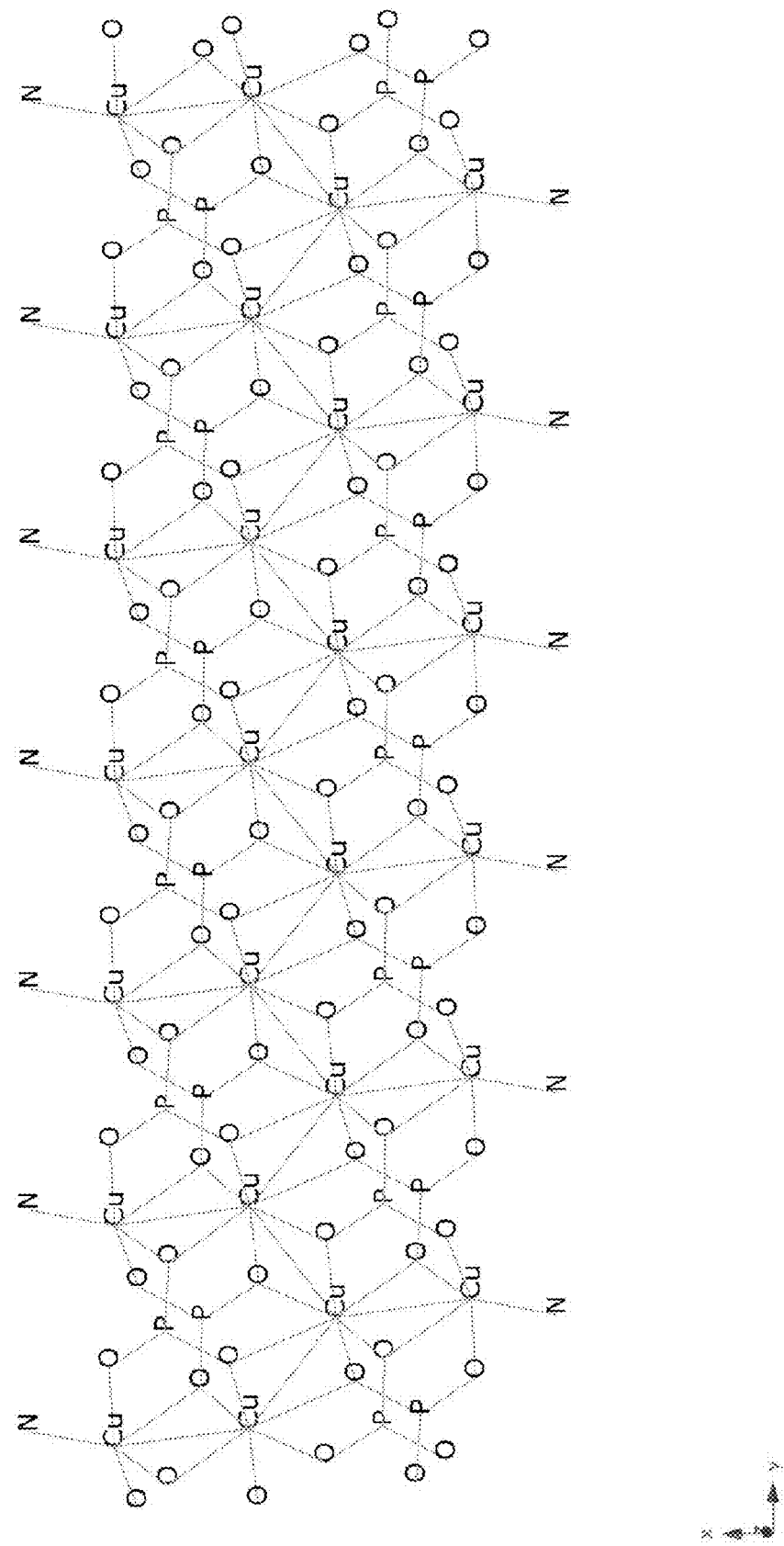

Phosphonate MOFs are known for their high structural diversity due to the multiple metal-binding modes and protonation states of the phosphonic acid group. They are known to contain complex molecular clusters and 1D/2D IBUs. Recently, Yücesan and co-workers synthesized the phosphonate MOF TUB75 (where TUB stands for Technische Universität Berlin) at temperatures above 180° C. and under hydrothermal reaction conditions [11]. As seen in FIG. 1a, the crystal structure of TUB75 shows the presence of copper dimer chains which were connected by fully deprotonated 1,4-naphthalenediphosphonic acid and 4,4'-bipyridine to give rectangular void channels. Full deprotonation leads to substantial electron delocalization within the 1D IBU. TUB75 has a calculated BET surface area of 132.1 $m^2/g$. The thermal decomposition patterns of phosphonate MOFs constructed using 4,4'-bipyridine as the auxiliary linker with 1,4-naphthalenediphosphonic acid, 2,6-naphthalendiphosphonic acid, and different aromatic phosphonic acids were also previously reported. [11] MOFs in this family have a general tendency to be thermally stable up to ~375° C., after which thermal decomposition begins. It was found for 2,6-naphthalendiphosphonic acid that removing the 4,4'-bipyridines to obtain pure metal phosphonates increases the thermal stability to ~400° C. TUB75 crystals are transparent green colored needles.

The following example describes the synthesis of TUB75 that has experimental band-gap value of 1.4 eV and theoretically calculated band gap of 1.77 eV via DFT calculations. Band gap values of MOF crystals are obtained via Tauc Plotting of the UV spectra. The solid-state diffuse reflectance Ultraviolet-Visible (UV-vis) spectra of the synthesized MOF crystals of TUB75 have been collected on Varian Cary 300 UV-Vis Spectrophotometer. Tauc Plotting has indicated that TUB75 has band gap value of 1.4 eV, making it a semiconductor (see FIG. 3). In addition, we find that TUB75 possesses an antiferromagnetic chain-type IBU.

The Synthesis of 1,4-napthalenediphosphonic Acid

The synthesis of 1,4-napthalenediphosphonic acid follows the similar synthetic route for 2,6-naphthalenediphosphonic acid. The starting materials were purchased from Aldrich, TCI, ABCR and Alfa Aesar companies, and used as received. Naphthalene-1,4-diyl-bis(phosphonic diisopropyl ester) was obtained using a $[Pd(PPh_3)_4]$-catalyzed Michaelis-Arbuzov reaction by conventional heating methods. A mixture of 1,4-dibromonaphthalene (1.0 g, 3.5 mmol), triisopropylphosphite (13.5 mL, 55 mmol) and $[Pd(PPh_3)_4]$ (38 mg, 0.016 mmol) was added in a 50 mL flask and heated to 200° C. under argon atmosphere (14 mL/min). After 1 h, reflux was started and the temperature was kept at 200° C. for 4 h. With the temperature constant at 200° C., triisopropylphosphite (4.0 mL, 16.2 mmol) and $[Pd(PPh_3)_4]$ (38 mg, 0.016 mmol) were added to the reaction flask as a second addition. After this addition, the temperature was increased to 220° C. and reaction was continued for 20 h. Upon fast cooling in a refrigerator, the white crystalline solid product was precipitated and filtered with a Gooch filter by washing with n-hexane.

Naphthalene-1,4-diylbis(phosphonic diisopropyl ester) (2.5 mmol) and 20 mL of HCl (37%) were added in a 50 mL flask and heated to 80° C. on a sand bath to synthesize 1,4-naphthalenediphosphonic acid. After 8 h, a white paste was obtained and this paste was treated with methanol to remove excess hydrochloric acid and isopropylchloride which is generated during acid-catalyzed hydrolysis. This methanol crude product mixture was evaporated under high vacuum and the solid final product was obtained as a white solid.

The Synthesis of $[\{Cu_2(4,4'\text{-bpy})_{0.5}\}(1,4\text{-NDPA})]$ (TUB75)

The hydrothermal reactions have been performed in 23 ml Teflon lined Parr Acid Digestion Vessels. The initial pH of the reaction mixture was recorded to be 2. 1,4-naphthalenediphosphonic acid (0.100 g, 0.35 mmol), $CuSO_4 \cdot 5H_2O$ (0.150 g, 0.60 mmol), 4,4'-bipyridine (4,4'-bpy) (0.040 g, 0.256 mmol) and water (10.084 g, 560 mmol) were mixed and this solution was maintained in closed 23 ml Teflon lined Parr Acid Digestion Vessel for 4 days at 200° C. under autogeneous pressure. After cooling to room temperature, the needle-shaped transparent green crystals were filtered, washed with acetone, and air-dried.

X-ray Data Collection and Structure Refinement Details

Figure 1B:
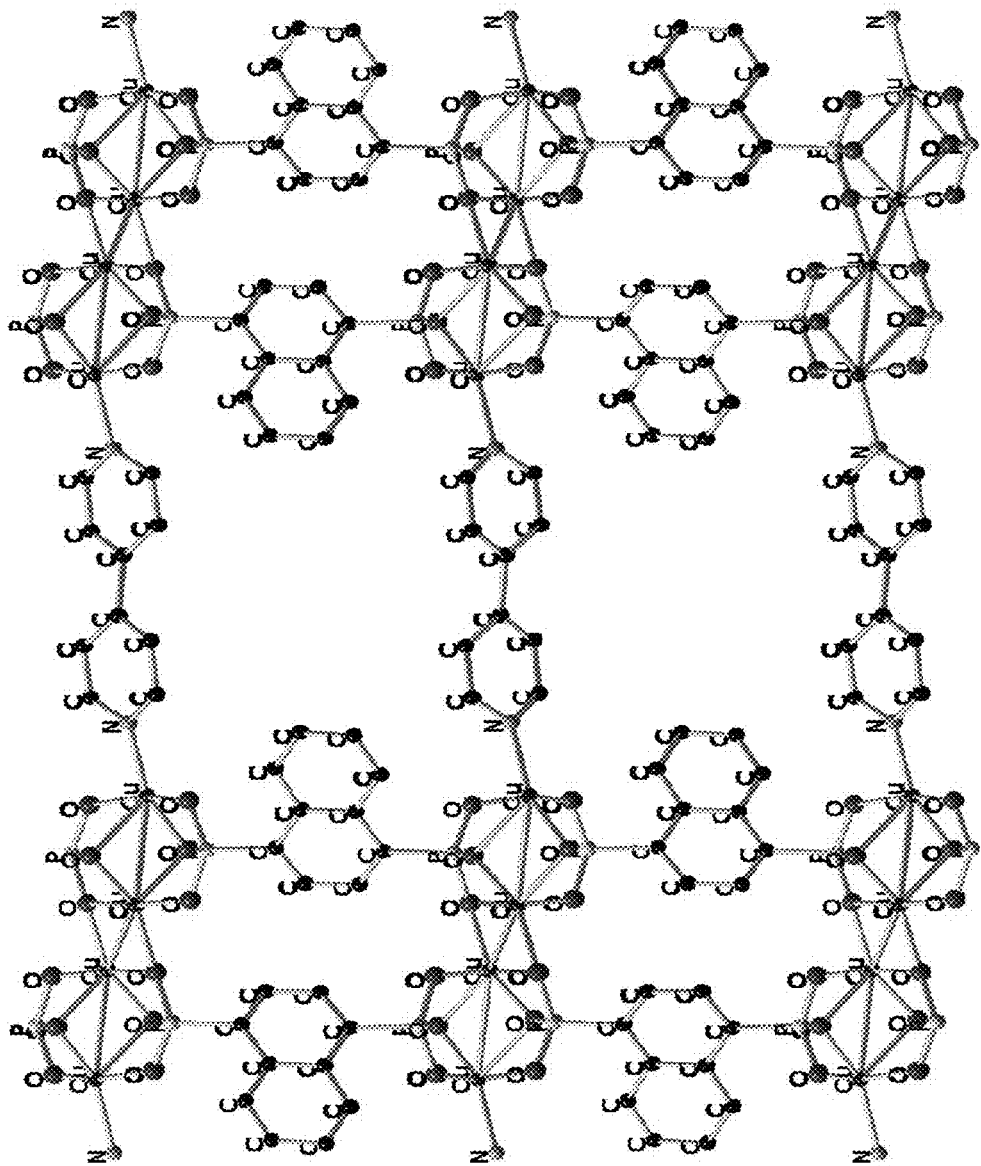

The crystal structure of TUB75 is shown in FIG. 1a and 1b. The solid-state structures of compound TUB75 was confirmed by X-ray diffraction analysis. The data was obtained with Bruker APEX II QUAZAR three-circle diffractometer. Indexing was performed using APEX2. Data integration and reduction were carried out with SAINT. TWINABS was used for absorption correction of TUB75. The structure was solved using Olex2, SHELXT and refined with the ShelXL refinement package using Least Squares minimization. CrystalMaker software was used to visualize the CIF file.

$N_2$ Adsorption Isotherms and BET Surface Areas

Grand canonical Monte Carlo (GCMC) simulations were performed to simulate the $N_2$ adsorption isotherms of TUB75 at 77K and up to 0.4 bar.

Conductive and Magnetic Properties of TUB75

Figure 3B:
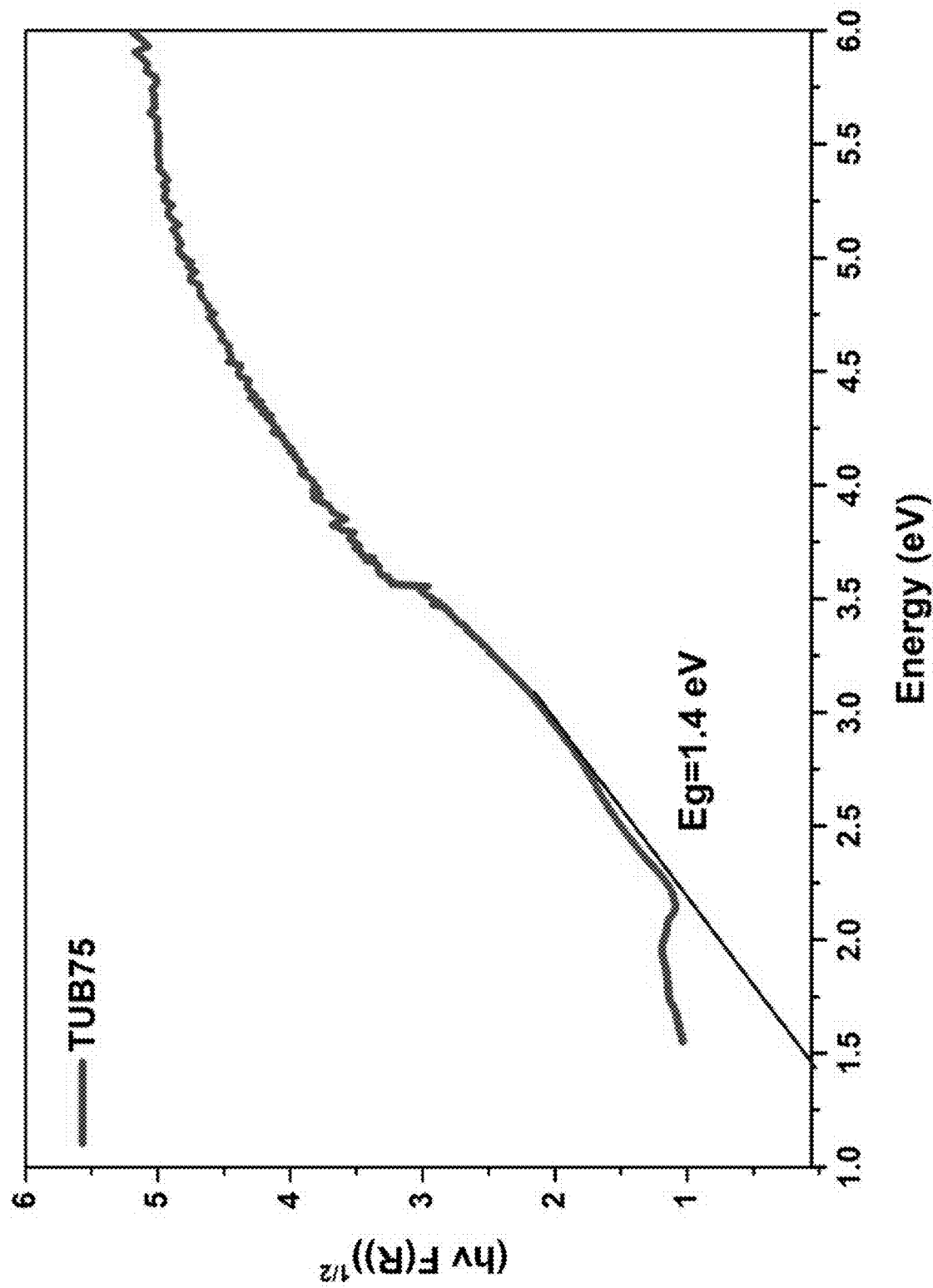

In FIG. 3B, an indirect Tauc plot derived from the UV-vis spectrum (shown in FIG. 3A) of a sample of pure hand-picked (under a microscope) TUB75 crystals (thin green needles with an average length of 0.5 mm) is presented. Linear extrapolation of this Tauc plot yields an estimate of the optical bandgap of 1.4 eV, indicative of a semiconductor. To shed light on the origin of the semiconductivity, we performed DFT calculations. The density of states calculation yielded a HOMO-LUMO gap of $E_g=1.77$ eV, which is in good agreement with the experimental bandgap of 1.4 eV. Based on the projected density of states (pDOS) in FIG. 11, we see that the HOMO-LUMO gap is predominantly due to atomic orbitals associated with the carbon atoms in the p-conjugated 1,4-naphthalenediphosphonic acid (1,4-NDPA) and 4,4'-bipyridine (4,4'-bpy) auxiliary linker groups. It also appears that there is some contribution from the nitrogen orbitals to the LUMO and a very small contribution from the oxygen orbitals to the HOMO. As for copper, there is effectively no contribution from the copper orbitals to the HOMO and LUMO. There is indication of spin dependence in the higher energy virtual orbitals, primarily associated with the copper atoms and smaller contributions coming from carbon, nitrogen, phosphorous, and oxygen. We further projected the carbon pDOS into the individual contributions from the 1,4-NDPA and the 4,4'-bpy carbons (FIG. 12). This projection reveals that the HOMO and LUMO are spatially separated, with the HOMO localized on the 1,4-NDPA carbons and the LUMO localized on the 4,4'-bpy carbons. In such a case, a photoexcited electron (in the LUMO) would be spatially separated from its hole (in the HOMO).

Electrical conductivity measurements on MOFs have been mainly based on polycrystalline pellets. However, such measurements may greatly underestimate the conductance of the MOF due to contact/grain boundary resistances and anisotropic electrical conduction. On the other hand, single-crystal measurements can provide much more accurate conductance values, provided that the crystals are large enough. Considering this, we carried out a number of single-crystal measurements on TUB75 by clamping the individual crystals between two gold surfaces of a relay. From room-temperature measurements, we obtained a range of resistances from 10Ω to 10 MΩ, depending on the orientation of the crystal with respect to the gold surfaces. Assuming that the TUB75 crystal makes perfect contact with the gold surfaces, these resistances yield a maximum conductance of ~$10^3$ S m$^{-1}$ and a minimum conductance of ~$10^{-3}$ S m$^{-1}$. However, since the TUB75 crystals do not make perfect contacts with the gold surfaces, the actual conductance could even be higher than our reported values. Nevertheless, our results show that TUB75 is a semiconductor and provide strong evidence of the directional nature of the electrical conductivity of TUB75.

Conclusion

Herein, the conductive and magnetic properties of the phosphonate MOF TUB75 have been disclosed. With an experimental bandgap of 1.4 eV and room-temperature (orientation-dependent) conductance ranging from ~$10^{-3}$ to ~$10^3$ S m$^{-1}$, TUB75 is the first semiconducting phosphonate MOF in the literature, paving the way for a new family of semiconductors with an extremely rich structural chemistry. The metal-binding modes of the phosphonic acid group in TUB75 support a 1D IBU composed of a zigzag copper dimer chain, which was found to be antiferromagnetically coupled. The temperature-dependent magnetic susceptibility data was well fit using a combination of a Heisenberg chain model at higher temperatures and Brillouin functions at very low temperatures. The experimental measurements were accompanied by DFT calculations, which yielded a bandgap of 1.77 eV in good agreement with the experimental one and support the AFM nature of the IBU. Given the high thermal/chemical stabilities of phosphonate MOFs and the numerous metal-binding modes of phosphonates, the disclose findings show that such MOFs can be used in next-generation electrodes and supercapacitors capable of withstanding harsh operating conditions. The vast structural diversity of phosphonate MOFs could lead to a new generation of porous materials with engineerable surface areas and magnetic/conductive properties.

Example 3

Arylphosphonic acid linkers could have intrinsic low band gap values. Once arylphosphonic acid linkers are connected with inorganic building units, they could form conductive MOFs. The following examples demonstrate the general formulation of phosphonate-MOFs constructed with one dimensional inorganic building unit composed of continuous corner or edge shared 8 membered M-O—P—O-M-O—P—O rings (M=a metal atom). M-O—P—O-M-O—P—O ring pattern can be present in two- and three-dimensional IBUs as well (See TUB40). For example, a one-dimensional IBU could be composed of tetrahedral Co atoms giving the one dimensional inorganic building unit as seen in FIG. 1c with Co—O—P—O—Co—O—P—O pattern. Changing the metal ion or organic linker identity could change the conformation of the one-dimensional IBU. Upon this conformational change, the surface area could change dramatically. For example, the 1034 m$^2$/g surface area of Co$_2$(H$_4$-MTPPA)]·3 NMP·H$_2$O is substantially larger compared to the isostructural Zn$_2$H$_4$MTPPA and Zn$_2$H$_4$STPPA (MTPPA=methane tetra-p-phenylphosphonic acid and STPPA=silane tetra-p-phenylphosphonic acid). Both isostructural Zn$_2$H$_4$MTPPA and Zn$_2$H$_4$STPPA have one dimensional inorganic building unit composed of continuous corner or edge shared 8 membered Zn—O—P—O—Zn—O—P—O rings. Likewise, keeping the organic linker identity of TUB75 the same but changing the one-dimensional inorganic building unit to Cu—O—P—O—Cu—O—P—O ring pattern with square pyramidal Cu centers increases the surface area from 132.1 m$^2$/g to 229.2 m$^2$/g in [{Cu(4,4'-bpy)$_{0.5}$(1,4-NDPA-H$_2$)] (1,4-NDPA-H$_2$=di deprotonated 1,4-naphthalenediphosphonic acid). Due to the presence of 1,4-napthalenediphosphonic acid and one-dimensional inorganic building unit composed of Cu—O—P—O—Cu—O—P—O corner sharing rings, [{Cu(4,4'-bpy)$_{0.5}$(1,4-NDPA-H$_2$)] is also expected to show conductive behavior. Therefore, this working example includes the MOFs synthesized with one-dimensional inorganic building units composed of corner sharing 8 membered M-O—P—O-M-O—P—O rings, where M represents a metal ion. Experimental band gap estimation of Co$_2$(H$_4$-MTPPA)]·3 NMP·H$_2$O (H$_4$-MTPPA is tetra deprotonated MTPPA linker) has given the 1.7 eV band gap value and initial DFT calculations gave an estimate of 1.15 eV band gap. As the MTPPA linker has a band gap value, which is above 4 eV, the formation of a one-dimensional IBU composed of continuous corner sharing 8 membered Co—O—P—O—Co—O—P—O rings is influential in generating low band gap MOF of Co$_2$(H$_4$-MTPPA)]·3 NMP·H$_2$O. The initial theoretical band gap calculations for MOFs Zn$_2$H$_4$MTPPA and Zn$_2$H$_4$STPPA (MTPPA=methane tetra-p-phenylphosphonic acid and STPPA=silane tetra-p-phenylphosphonic acid) also give an estimate of below 2 eV band gaps.

TGA analysis of [{Cu(4,4'-bpy)$_{0.5}$(1,4-NDPA-H$_2$)] is performed using, TA instruments SDT Q600 series. Thermal decomposition of [{Cu(4,4'-bpy)$_{0.5}$(1,4-NDPA-H$_2$)] starts at ca. 375° C. and decomposition continues until ca. 700° C.

The Synthesis of H$_8$MTPPA (Methane Tetra-P-Phenylphosphonic Acid)

Under argon atmosphere, a mixture of tetrakis(tetrabromophenyl)methane (1.00 g, 1.57 mmol), triisopropylphosphite (12 mL, 48.6 mmol) and [Pd(PPh$_3$)$_4$] (45 mg, 0.039 mmol) was heated under reflux for 4 h. After that time, another portion of triisopropylphosphite (4 mL, 16.2 mmol) and [Pd(PPh$_3$)$_4$] (45 mg, 0.039 mmol) were added. The mixture was heated to to 220° C. for 20 h. Upon slow cooling, the white crystalline solid product precipitated that was filtered with a Gooch filter and washed with n-hexane (Yield; 1.37 g, 1.41 mmol, 89%).

$^1$H-NMR (500 MHz, CDCl$_3$) δ 7.72 (d, J=12.9, 8.3 Hz, 8H), 7.29 (d, 8H), 4.78-4.72 (m, 8H), 1.72 (s, 1H), 1.39 (d, J=6.2 Hz, 8H), 1.28 (d, J=6.2 Hz, 8H).

Tetraphenylmethane(phosphonic tetraisopropyl ester) (1.11 g, 1.14 mmol) was treated with 20 mL HCl (37%) on a sand bath at 80° C. for 24 h. Upon cooling, a colorless precipitate formed that was filtered and washed with methanol (10 mL). Drying afforded a colorless solid of 5a (Yield; 720 mg, 1.12 mmol, 98%).

$^1$H NMR (500 MHz, CDCl$_3$) δ 7.76 (d, 8H), δ 7.29 (d, 8H), 4.96 (m, 8H).

Synthesis of [Co$_2$(H$_4$-MTPPA)]·3 NMP·H$_2$O

Methane tetra-p-phenylphosphonic acid (H$_8$-MTPPA) (0.100 g, 0.35 mmol), CoSO$_4$·7 H$_2$O (0.150 g, 0.60 mmol), and N-Methyl-2-pyrrolidone (NMP) (9 ml) were mixed and this solution was maintained in closed 23 ml teflon lined Parr acid digestion vessel for 24 hour at 165° C. under autogenous pressure. After cooling to room temperature, the dark blue block-shaped crystals were filtered, purified by hand picking under the microscope, washed with acetone, and air-dried.

X-Ray Data Collection and Structure Refinement Details for [Co$_2$(H$_4$-MTPPA)]·3 NMP·H$_2$O:

Data were obtained with Bruker APEX II QUAZAR three-circle diffractometer. Indexing was performed using APEX2. Data integration and reduction were carried out with SAINT. Absorption correction was performed by multi-scan method implemented in SADABS. The structure was solved using SHELXT and then refined by full-matrix least-squares refinements on F$^2$ using the SHELX in OLEX All non-hydrogen atoms were refined anisotropically using all reflections with I>2 σ(I). Aromatic and aliphatic C-bound H atoms were positioned geometrically and refined using a riding mode. The P—OH hydrogen atoms were idealized and refined using rigid group (AFIX 147 option of the SHELXL program). The H atoms of water molecules were located in a difference Fourier map and their positions were constrained to refine on their parent O atoms with Uiso(H)=1.5 Ueq(O). Mercury and CrystalMaker was used for visualization of the cif file. See FIG. 10. TGA of Co$_2$(H$_4$-MTPPA)]·3 NMP·H$_2$O indicate that organic components from MTPPA linker start decomposing at ca. 525 C indicating exceptional thermal stability. The total weight loss of MTPPA continues until 700 C. The initial ca. 20% (calculated 27%) of weight loss in the TGA curve corresponds to the solvent molecules of NMP and H$_2$O.

The BET surface area of Co$_2$(H$_4$-MTPPA)]·3 NMP·H$_2$O was derived from its simulated N$_2$ adsorption isotherm at 77 K obtained by grand canonical Monte Carlo simulations. Such calculations have been widely used for characterizing the surface area of MOF materials. The calculated BET surface area for Co$_2$(H$_4$-MTPPA)]·3 NMP·H$_2$O is 1034 m$^2$/g, which is 107 m$^2$/g higher than its isostructural zinc compound Zn$_2$H$_4$-MTPPA. BET surface area of Zn$_2$H$_4$-MTPPA was measured to be 927 m$^2$/g. The solvent molecules of NMP were omitted during the simulations.

Zn$_2$H$_4$MTPPA and Zn$_2$H$_4$STPPA are isostructural with Co$_2$H$_4$MTPPA with different bond lengths and angles in the inorganic building units.

Synthesis of Zn$_2$H$_4$MTPPA

A solution of ZnSO$_4$·7H$_2$O (200 mg, 0.69 mmol), H$_8$-MTTPA (800 mg, 1.47 mmol) in dimethylformamide (10.0 mL, 129.7 mmol) was stirred briefly and heated to 180 C for 72 h in a PTFE-lined Parr acid digestion vessel. Tiny colorless crystals Zn$_2$H$_4$MTPPA were cleaned with acetone and air dried.

X-Ray Crystallography:

Intensity data were collected on Bruker Venture D8 diffractometers at 100 K with graphite-monochromated Mo-Kα (0.7107 Å) radiation. All structures were solved by direct methods and refined based on F$^2$ by use of the SHELX program package as implemented in WinGX. All non-hydrogen atoms were refined using anisotropic displacement parameters. Hydrogen atoms attached to carbon atoms were included in geometrically calculated positions using a riding model. Hydrogen atoms attached to oxygen atoms were located in the last refinement cycle and refined isotropically. It should be noted that Platon/Squeeze procedure had to be used to account for diffuse electron density due to disordered solvent molecules. Crystal structure validations and geometrical calculations were performed using PLATON software. MERCURY and CrystalMaker softwares were used for visualization of the cif files. See FIG. 5.

BET surface area of 927 m$^2$/g was derived from N$_2$ adsorption isotherms at 77 K which were obtained by Monte Carlo simulations in the grand canonical ensemble.

Example 4

The following working example describes the synthesis of another phosphonate-MOF synthesized using 2,6-naphthalenediphosphonic acid (2,6-NDPA) as the linker. The band gap values of [{Cu(H$_2$O)}(2,6-NDPA)$_{0.5}$] have been measured to be 1.4 eV using the tauc Plot derived from the UV data. See FIG. 6. The MOF [{Cu(H$_2$O)}(2,6-NDPA)$_{0.5}$] is composed of a two dimensional inorganic building unit comprising copper dimers, which were connected to give the three dimensional structure of [{Cu(H$_2$O)}(2,6-NDPA)$_{0.5}$]. See FIG. 7.

SUMMARY

We report a conductive phosphonate metal-organic framework (MOF), [{Cu(H$_2$O)}(2,6-NDPA)$_{0.5}$] (TUB40) (NDPA=naphthalenediphosphonic acid), which contains a two-dimensional inorganic building unit (IBU) comprised of a continuous edge-sharing sheet of copper phosphonate polyhedra. The two-dimensional IBUs are connected to each other via polyaromatic 2,6-NDPA's, forming a three-dimensional pillared-layered MOF structure. This MOF, known as TUB40, has a narrow band gap of 1.4 eV and an average record high electrical conductivity of 200 S m$^{-1}$ measured for single crystals of three-dimensional MOFs at room temperature and relative humidity while the pellet measurements produced 142 S/m conductance. For single crystals a conductivity of up to 10$^3$ S m$^{-1}$ was obtained. DFT calculations reveal that the conductivity is due to an excitation from the HOMO on the naphthalene building unit to the LUMO on the copper atoms. Temperature-dependent magnetization measurements show that the copper atoms are antiferromagnetically coupled at very low temperatures (which is also confirmed by the DFT calculations). Due to its high conductance and thermal/chemical stability, TUB40 represents an excellently suited material for electrodes in supercapacitors. TUB40 crystals retain their transparent color at 300° C.

The Synthesis of 2,6-Naphthalenediphosphonic Acid

Napthalene-2,6-dylbis(phosphonic diisopropyl ester) was obtained with [Pd(PPh$_3$)$_4$] catalyzed Michaelis-Arbuzov reaction by conventional heating method. A mixture of 2,6-dibromonapthalene (1.0 g, 3.5 mmol), triisopropylphosphite (13.5 mL, 55 mmol) and [Pd(PPh$_3$)$_4$] (38 mg, 0.016 mmol) was added on a 50 mL flask and heated to 200° C. under argon atmosphere (14 mL/min). After 1 h, reflux was started and temperature was kept at 200° C. for 4 h. While temperature was stable, triisopropylphosphite (4.0 mL, 16.2 mmol) and [Pd(PPh$_3$)$_4$] (38 mg, 0.016 mmol) were added to the reaction flask as second addition. After this addition, temperature was increased to 220° C. and reaction was continued for 20 h. Upon fast cooling on refrigerator, the white crystalline solid product was precipitated and filtered with a Gooch filter by washing with n-hexane (Yield; 1.44 g, 91%). Spectral data: $^1$H NMR (500 MHz, CDCl$_3$) δ 8.47 (d, J=15.3 Hz, 5H), 8.00 (dd, J=8.4, 3.9 Hz, 5H), 7.89-7.80 (m, 5H), 7.27 (s, 2H), 4.99-4.62 (m, 12H), 1.76 (s, 6H). 1.15 g naphthalene-2,6-dylbis(phosphonic diisopropyl ester) (2.5 mmol) and 20 mL of HCl (37%) were added on a 50 ml flask and heated to 80° C. on a sand bath to synthesize naphthalene-2,6-dylbis(phosphonic acid). After 8 h, a white, paste-like mixture was obtained and this mixture was treated with methanol to remove excess hydrochloric acid and isopropylchloride which shows up during acidic hydrolysis reaction. This methanol-crude product mixture was evaporated under high vacuum and the solid final product was obtained as a white solid (Yield; 720 mg, 99%). Spectral data: $^1$H NMR (500 MHz, CDCl$_3$) δ 7.49 (s, 4H), 7.31 (d, J=19.1 Hz, 2H), 7.25 (s, 6H), 1.43 (s, 5H).

The Synthesis of [{Cu(H$_2$O)}(2,6-NDPA)$_{0.5}$] (TUB40)

A mixture of CuSO$_4$·5H$_2$O (0.129 g, 0.52 mmol), napthalene-2,6-dylbis(phosphonic acid) (0.100 g, 0.35 mmol), and water (10.084 g, 560 mmol) were stirred gently and heated to 180° C. in a 23 ml Parr teflon lined stainless steel container under autogeneous pressure for 92 h. pH of the mixture was adjusted to 2 by adding sufficient amount of HNO$_3$ After the reaction, the vessel was cooled to room temperature slowly and precipitate was filtered out by washing with distilled water and acetone. Green crystals of rectangular plates were air dried. Alternatively, it can be also synthesized at 200° C. using a mixture of CuSO$_4$·5H$_2$O (0.129 g, 0.52 mmol), napthalene-2,6-dylbis(phosphonic acid) (0.100 g, 0.35 mmol), and water (10.084 g, 560 mmol).

TGA analysis is performed using, TA instruments SDT Q600 series. Thermal decomposition of [{Cu(H$_2$O)}(2,6-NDPA)$_{0.5}$] starts at ca. 400° C. and decomposition continues until ca. 850° C.

Experiments

We revisit the previously published MOF TUB40,[12] which is composed of two-dimensional sheets of corner-sharing copper and phosphorus polyhedra and explore its conductive and magnetic properties. In particular, we perform pellet conductivity, solid-state diffuse reflectance (to estimate the band gap via Tauc plotting), and temperature-dependent magnetization measurements.

Given the conductive nature of phosphorous and presence of d orbitals in P, it is presumed that the introduction of phosphonate groups throughout the copper oxide IBU promotes the semiconductivity in the two-dimensional IBUs. In addition, the use of organophosphonates with rich metal binding modes in the IBUs allows for optimizable surface areas, which could expand the range of semiconductor applications. Therefore, we sought to estimate the band gap of TUB40 from the UV-Vis diffuse reflectance spectrum of handpicked crystals of TUB40. As seen in FIG. 6, indirect Tauc plotting of the reflectance data reveals a band gap of 1.4 eV, which lies in the semiconductive range. Given the narrow bandgap, we then used impedance spectroscopy to measure the resistance of a 5 mm (diameter)×0.5 mm (thickness) TUB40 pellet at room temperature and calculated the resulting conductivity σ. This was done using a Zahner ZENNIUM impedance measurement unit in the potentiostatic mode (with 20 mV amplitude between 100 mHz and 100 kHz). To reduce the influence of contact resistance between the pellet surface and electrodes (stainless steel cylinders), the impedance measurement was done under a mechanical load of 1 MPa. In FIG. 17, the complex-valued impedance is displayed in the Bode representation in terms of the magnitude of the impedance, |Z|, and the phase shift, φ, between the input potential wave and measured current wave (NB: φ=0 for ohmic resistors and φ≠0 for serial or parallel combinations of capacitive, inductive, and resistive elements). From 0.1 Hz to ~500 Hz, we see that |Z| and φ remain constant at 179.3±0.2 mΩ and 0°, respectively. This frequency independence is characteristic of pure ohmic resistors. Above ~500 Hz, the plot exhibits a common feature of an impedance measurement setup, namely φ increases with increasing frequency towards 90° (here, 80° at 100 kHz). This artifact is caused by parasitic contributions from the connectors and cables, which lead to measurable inductances due to mutual induction or object- and wiring-inductance. Thus, frequencies with φ values higher than 1° were not considered in the calculation of the resistance, R, i.e., R was calculated from the mean |Z| between 0.1 Hz and 200 Hz. Finally, the conductivity, σ, was calculated to be σ=l/RA=5·10$^{-4}$m/0.1793Ω·(0.25·π·(5·10$^{-3}$m)$^2$)=142 S m$^{-1}$.

As measurements on polycrystalline pellets may greatly underestimate the conductance of the MOF due to contact/grain boundary resistances and anisotropic electrical conduction. The single crystal conductivity measurements of TUB40 yield a maximum conductance of ~10$^3$ S/m with an average of 200 S m$^{-1}$. The averaged value might still rather underestimate the real conductivity as crystals might have smaller contact surface area than actual crystal surface area when they contact the gold relays.

Density functional theory (DFT) calculations of the density of states (DOS), projected density of states (pDOS), band gap, band structure, and partial charges of TUB40 were also carried out.

The HOMO-LUMO gap was calculated to be 2.320 eV and, as seen in the pDOS (FIG. 18), the HOMO is predominantly dictated by the carbon orbitals of the naphthalenes and the LUMO by the orbitals on the copper and, to a lesser extent, the oxygen atoms. These results suggest that the AFM configuration has a spatially separated HOMO-to-LUMO transition. Further insight into the HOMO-LUMO gap is provided by the pDOSs in FIG. 19, which show the contributions from the p-orbitals of the carbons and the d-orbitals of the coppers with excess β- (FIG. 19A) and α-spins (FIG. 19B). As can be seen, the spin orientations of the copper d-orbitals contributing to the LUMO depend on the copper atom under consideration (i.e., a copper with an excess β-spin or α-spin). Specifically, for the coppers with the excess β/α-spins, spin-up/down electrons may populate the copper d-orbitals of the LUMO. Due to the electronic transition selection rule that ΔS=0 (i.e., the spin of the electron cannot change), the results suggest the possibility of excitations of spin-up/down electrons from the naphthalene π orbitals to the empty d-orbitals of copper atoms with unpaired spin-down/up electrons, i.e., a copper with an unpaired spin-up electron will only accept an excited spin-down electron into its empty d-orbitals and vice versa.

We next present and discuss the HOMO-LUMO gaps and pDOSs of the FM configuration. Based on the spin-up and spin-down band gaps, band structure, total DOS, and pDOS (FIG. 20), we see that the FM configuration's HOMO-LUMO gap is spin-dependent. More specifically, the spin-down states have a band gap of 2.195 eV, in the semiconductor regime, while the spin-up states have a band gap of 3.913 eV, which is closer to that of an insulator. This situation may be contrasted with that of a half-metal, where one spin orientation has a zero band gap and the other has a non-zero band gap. The HOMO is spin-independent while the LUMO is spin-dependent. To understand how the various atoms contribute to the spin-dependent HOMO-LUMO gap, we calculated the pDOS for carbon, copper, oxygen, and phosphorous shown in FIG. 20. The figure reveals that the HOMO of TUB40 in the FM configuration is predominantly dictated by the carbon orbitals of the naphthalenes (as in the case of the AFM configuration). On the other hand, the spin-down contribution to the LUMO is mainly composed of copper orbitals with a small contribution from the oxygen orbitals (as in the case of the AFM configuration), while the spin-up contribution is due to carbon orbitals. Based on these results, we see that the spin-down states have a spatially separated HOMO-to-LUMO transition (as in the case of the AFM configuration), while that of the spin-up states is localized on the naphthalene carbons. Further insight into the HOMO-LUMO gap is provided by the pDOS in FIG. 21, which shows the contributions from the p-orbitals of the carbons and the d-orbitals of the coppers with excess a-spins. As can be seen, spin-down electrons may populate the copper d-orbitals of the LUMO. Due to the electronic transition selection rule that ΔS=0, this figure suggests the possibility of excitations of spin-down electrons from the naphthalene π orbitals to the empty d-orbitals of the coppers, i.e., a β-spin π-d transition with a 2.195 eV gap.

Our smallest calculated HOMO-LUMO gaps (viz., 2.320 eV and 2.195 eV) are somewhat larger than the experimental estimate of the band gap (viz., 1.4 eV). This may indeed be the case as our gaps were calculated at 0 K, while the experimental gap was extracted from a UV-Vis spectrum obtained at room temperature. Moreover, given the low exchange energy at 0 K (viz., −1.50 meV), there may exist a mix of FM and AFM domains at higher temperatures. Finally, the results of the electronic population analyses show that the oxygens surrounding each copper atom have excess electron density (viz., for every three oxygens there is approximately an excess electron), pointing to high electron delocalization within the 2D IBU. The spin density isosurface of the AFM configuration shows that the spin density is delocalized onto the coppers and oxygens, suggesting that both of these atoms contribute to the magnetic behaviour of TUB40.

Example 5

This example is a two dimensional phosphonate-MOF [Zn{N(CH$_3$)$_2$}(6-bromonapthalene-2-yl)phosphonate].

[Zn{N(CH$_3$)$_2$}(6-bromonapthalene-2-yl)phosphonate] has a two dimensional inorganic building unit. [N(CH$_3$)$_2$]$^{1-}$ is the auxiliary ligand. [Zn{N(CH$_3$)$_2$}(6-bromonapthalene-2-yl) phosphonate] forms white colorless transparent crystals. The band gap measurements from Tauc Plot curve has indicated that [Zn{N(CH$_3$)$_2$}(6-bromonapthalene-2-yl)phosphonate] has a 0.8 eV band gap value. See FIG. 8. As seen in FIG. 9. [Zn{N(CH$_3$)$_2$}(6-bromonapthalene-2-yl)phosphonate] has the eight membered Zn—O—P—O—Zn—O—P—O ring motifs connected to form the two dimensional IBU. Zn atoms are tetrahedral in the IBU.

(6-bromonapthalene-2-yl)phosphonic acid was synthesized following similar procedure to synthesize 2,6-napthalenediphosphonic acid via reducing the reaction time by half.

[Zn{N(CH$_3$)$_2$}(6-bromonapthalene-2-yl)phosphonate] was synthesized after the solvothermal reaction of A solution of ZnSO$_4$·7H$_2$O (200 mg, 0.69 mmol), 6-bromonapthalene-2-yl)phosphonic acid (100 mg, 0.41 mmol) in dimethylformamide (10.0 mL, 129.7 mmol). White crystals of [Zn{N (CH$_3$)$_2$}(6-bromonapthalene-2-yl)phosphonate] was washed with acetone and air dried.

X-ray diffraction data was obtained with Bruker APEX II QUAZAR three-circle diffractometer. Indexing was performed using APEX2. Data integration and reduction were carried out with SAINT. Absorption correction was performed by multi-scan method implemented in SADABS. The structure was solved using SHELXT and then refined by full-matrix least-squares refinements on F$^2$ using the SHELX in OLEX All non-hydrogen atoms were refined anisotropically using all reflections with I>2σ(I). Aromatic and aliphatic C-bound H atoms were positioned geometrically and refined using a riding mode. The P—OH hydrogen atoms were idealized and refined using rigid group (AFIX 147 option of the SHELXL program). The H atoms of water molecules were located in a difference Fourier map and their positions were constrained to refine on their parent O atoms with Uiso(H)=1.5 Ueq(O). Mercury was used for visualization of the cif file (FIG. 9).

Example 6

A conjugated tetratopic linker, 5,10,15,20-tetrakis [p-phenylphosphonic acid]porphyrin (H$_8$-TPPA), was used to synthesize a narrow band gap phosphonate MOF, namely [Ni (Cu—H$_4$TPPA)]·2(CH$_3$)$_2$NH$_2$$^+$ (GTUB-4), which has a unique one-dimensional microporous tubular structure with a very high geometric accessible surface area of 1102 m$^2$/g and low indirect band gap of 1.90 eV.

The Synthesis of GTUB-4

The aim was to attain the simplest metal-binding modes with the tetratopic, structurally rigid, and planar phosphonic acid H$_8$-TPPA (which contains a conjugated porphyrin core), whose phosphonic acid moieties are separated by ~90° from one other. Thus, when H$_8$-TPPA is coordinated to molecular IBUs in the simplest 1.100 mode (in Harris notation), they are expected to create square or rectangular void spaces. In this connection, the goal was to create H$_4$TPPA$^{4-}$ (in which each phosphonate arm is mono-deprotonated) to achieve the 1.100 metal-binding mode. In addition, the aim was to create an extended one-dimensional conjugated system that facilitates the conduction of electrons. To achieve this, a low-temperature synthesis in DMF was performed to promote the formation of molecular IBUs, as a high-temperature hydrothermal synthesis could provide enough energy to form one-dimensional or two-dimensional IBUs. Furthermore, in a square planar coordination environment, the high energy $d^9$ electrons of Cu(II) can support conductive behavior in MOFs. Inside a porphyrin core, Cu(II) usually adopts a square planar coordination environment. Therefore, the Pd-catalyzed Arbuzov reaction was adapted to synthesize metal-free $H_8$-TPPA. Due to the large ionic radius of the Pd atom, it does not readily incorporate into the porphyrin ring, allowing one to incorporate other metal atoms into the porphyrin core. Later, square planar Cu(II) was introduced into $H_8$-TPPA's pyrole ring to synthesize Cu-$H_8$TPPA (the deprotonated pyrole hydrogens are omitted in this formula). GTUB-4 was synthesized in a DMF/$H_2O$ and phenylphosphonic acid (modulator) mixture at 80° C. for 24 h, giving rise to long dark red needle-like crystals in high yield. These carefully controlled conditions were required to achieve the simplest 1.100 phosphonate metal-binding modes.

The structure of GTUB-4 was solved using X-ray crystallography. As seen in FIG. 14, GTUB-4 has a one-dimensional tubular structure. Each tube consists of a central rectangular void channel (see FIGS. 15a and 15b) and two different hexagonal voids on the sides, top, and bottom of the tube (see FIGS. 1c and 1d). The phosphonate metal-binding groups in GTUB-4 have 1.100 metal-binding modes (the simplest type of metal-binding mode), where a Ni(II) atom forms two coordinate covalent bonds and two ionic bonds with the phosphonate groups of the $H_8$TPPA linker. As mentioned earlier, this was achieved under well-controlled pH, temperature, and solvent conditions—the three variables that can be tuned to explore the large structural space of phosphonate MOFs. The presence of dimethylammonium cations and the acidic nature of GTUB-4 suggest that increasing the basicity of GTUB-4's environment could lead to further deprotonation of the phosphonic acids and, in turn, variations in the structure and properties. The crystal structure of GTUB-4 reveals that it contains a simple IBU, namely octahedral nickel metal centers coordinated to the four phosphonic acid metal-binding groups of $H_8$-TPPA. As seen in FIGS. 15A and 15B, the basal plane of octahedral Ni exclusively connects the Cu—$H_4$TPPA$^{4-}$ linkers, while the apical positions of Ni are occupied by two water molecules. Furthermore, as seen in FIGS. 16A, B and C, GTUB-4's nanotubes are held together via hydrogen bonds with the water molecules located at the apical positions of the octahedral Ni(II). Therefore, GTUB-4 can also be viewed as a three-dimensional hydrogen-bonded framework constructed from one-dimensional MOF nanotubes. FIG. 15D shows that the two distinct MOF nanotubes are packed at 41.87° relative to each other, leading to growth in two different directions. As the tubular structure of GTUB-4 is composed of three distinct pore sites (see FIGS. 16A, 16C, and 16D), the textural properties of GTUB-4 were characterized with molecular simulations. The calculations yielded a specific pore volume of 0.425 cm$^3$/g, a geometric accessible surface area of 1102 m$^2$/g, and pores of ~5 Å in diameter.

The structure of GTUB-4 shown in FIG. 14D suggests that $H_8$-TPPA's conjugation extends over the mono-deprotonated tetrahedral phosphonate metal-binding unit R—P=O(OH)O$^{-1}$, in which the phosphonate electrons could delocalize over the tetrahedral geometry. In light of these results, solid-state diffuse reflectance spectroscopy (DRS) were used to estimate the optical band gap of GTUB-4 (see FIG. 16). The indirect optical band gap of GTUB-4 was found to be 1.9 eV. The narrowness of the band gap is likely due to the extended conjugation mediated by the mono-deprotonated phosphonate metal-binding unit.

The presence of metal ions typically increases the thermal stability of MOFs compared to that of the linkers due to the additional covalent and ionic bonding opportunities in MOFs. Thus, we studied the thermal behaviors of $H_8$-TPPA, Cu—$H_8$TPPA, and GTUB-4 via thermogravimetric analysis (TGA). The TGA curve obtained under $N_2$ from the hand-picked GTUB-4 crystals indicates that the solvent and water molecules evaporate from GTUB-4 until 100° C. The second step of −11.1% weight loss corresponds to the evaporation of dimethylammonium cations in the crystal lattice (12.3% calculated). The third step of −28.8% weight loss between −400° C. and −650° C. corresponds to the evaporation of nearly half of the organic components of $H_8$TPPA (52% calculated). The decomposition of GTUB-4 continues above 900° C., suggesting that GTUB-4 might be converted into thermally stable phosphides above 650° C.

Conclusion

GTUB-4 is a nanotubular MOF, which was constructed using the highly conjugated $H_8$-TPPA linker. The strict pH and temperature control enabled the formation of a one-dimensional tubular structure with a geometric accessible surface area of 1102 m$^2$/g. The conjugated porphyrin core and electron delocalization around the phosphonate metal-binding unit are enhances the conjugation along the 1D structure. This results in a narrow band gap of 1.9 eV identifies GTUB-4 as a semiconductor. We were able to selectively introduce square planar Cu(II) with high energy electrons into the porphyrin core of GTUB-4, where the linker connectivity is achieved via octahedral Ni centers. The thermal decomposition pattern of GTUB-4 indicates that it is thermally stable up to 400° C., after which the organic components of the porphyrin core decompose. The presence of water at the apical position of the octahedral Ni site suggests the possibility of post-synthetic modifications of GTUB-4. Due to its narrow band gap and high surface area, GTUB-4 is ideally suited as an electrode material in the next generation of supercapacitors.

An isostructural cobalt version of GTUB4 has been synthetized and highly similar properties as reported here for GTUB-4 could be confirmed.

Example 7

Two further three-dimensional zinc metal organic frameworks have been constructed using $H_8$TPPA linkers and Cu($H_8$TPPA) linkers (copper atom is located in the pyrolle ring of $H_8$TPPA), respectively. Crystals of Zn$_2$($H_4$TPPA) (GTUB2) and Zn$_2$(Cu—$H_4$TPPA) (GTUB3) have indirect bandgaps with in the semiconductive region of ca. 1.66 eV and 1.64 eV respectively, as evident from the measurements and results depicted FIG. 22. The inorganic building unit of these two zinc MOFs comprise tetrahedral zinc atoms, as shown in the crystal structures of FIG. 23.

Example 8

This example discloses another Cu-MOF: Cu$_3$(H$_5$-MTPPA)$_2$. Cu$_3$(H$_5$-MTPPA)$_2$ is synthesized with the MTPPA (methane-p-tetraphenylphosphonic acid) linker producing one dimensional inorganic building unit composed of edge sharing 8 membered Cu—O—P—O—Cu—O—P—O rings (see FIG. 24). As it can be seen in direct and indirect band gap figures the organic components MTPPA has above 4 eV band gap but as the copper MOF is formed, the band gap is reduced below 2.5 eV within the semiconductive regime. It seems like presence of an 8 membered Cu—O—P—O—Cu—O—P—O ring or 8 membered M-O—P—O-M-O—P—O rings (where M is a metal ion) in 1D, 2D and 3D IBUs enhance the semiconductive behaviour.

The presence of an unpaired electron in the square-planar $d^9$ CuII centers indicates the presence of high energy electrons in the one-dimensional IBU of $Cu_3(H_5\text{-MTPPA})_2$. Therefore, we have further decided to follow up the conductive nature of this novel phosphonate-MOF. The initial band gap measurements obtained from indirect and direct Tauc plot graphs, which were derived from the UV-Vis spectra generates a typical semiconductor jump at 2.4 eV and 2.7 eV respectively. The center of the $H_5MTPPA$ has an insulating $sp^3$ methane core, which could inhibit the conductive behavior. As seen in FIG. 24, we have further tested the band gap of $H_8MTPPA$ to be 4.2 eV, which is not close to the semiconductive region and this band is not seen in $Cu_3(H_5\text{-MTPPA})_2$'s Tauc plot as a second jump. Therefore, the low band gap of $Cu_3(H_5\text{-MTPPA})_2$ is associated with the resulting MOF structure or the presence of 1D IBU composed of 8 membered Cu1-O—P—O—Cu1-O—P—O and Cu2-O—P—O—Cu2-O—P—O rings with the presence of high energy square planar Cu(II) $d^9$ electrons. The presence of square planar copper centers in the IBU of $Cu_3(H_5\text{-MTPPA})_2$ could further help the semiconductive band gap observed in the indirect Tauc plot.

The crystal structure of $Cu_3(H_5\text{-MTPPA})_2$ (FIG. 25) indicates two different type of square shaped and parallelogram shape void channels. The Monte Carlo simulations predict the surface area of $Cu_3(H_5\text{-MTPPA})_2$ to be 766.2 $m^2/g$.

Synthesis of $Cu_3(H_5\text{-MTPPA})_2$

Methane-p-tetraphenylposphonic acid (MTTPA) (40 mg, 0.062 mmol), $CuSO_4 \cdot 5H_2O$ (30 mg, 0.120 mmol) and N-Methyl-2-pyrrolidone (NMP) (8 mL) were mixed and sonicated. Then this mixture was heated up in closed PTFE vessel for 24 hours at 168° C. under autogenous pressure. After slowly cooling to room temperature, the transparent light blue/green block-shaped crystals were filtered and washed with acetone. A pure single crystal phase was collected.

REFERENCES

1. Conway, B. E. Electrochemical Supercapacitors: Scientific Fundamentals and Technological Applications. Plenum Press, 1999.
2. Robust and conductive two-dimensional metal-organic frameworks with exceptionally high volumetric and areal capacitance. Feng, D.; Lei, T.; Lukatskaya, M. R.; Park, J.; Huang, Z.; Lee, M.; Shaw, L.; Chen, S.; Yakovenko, A. A.; Kulkarni, A.; Xiao, J.; Fredrickson, K.; Tok, J. B.; Zou, X.; Cui, Y.; Bao, Z. Nat Energy 2018, 3, 30-36.
3. Materials for electrochemical capacitors. Simon, P.; Gogotsi, Y. Nat Mater 2008, 7, 845-854.
4. Carbons and electrolytes for advanced supercapacitors. Béguin, F.; Presser, V.; Balducci, A.; Frackowiak, E. Adv Mater 2014, 26, 2219-2251.
5. Review of nanostructured carbon materials for electrochemical capacitor applications: advantages and limitations of activated carbon, carbide-derived carbon, zeolite-templated carbon, carbon aerogels, carbon nanotubes, onion-like carbon, and graphene. Gu, W.; Yushin, G. WIREs Energy Environ 2014, 3, 424-473.
6. Energy storage applications of activated carbons: supercapacitors and hydrogen storage. Sevilla, M.; Mokaya, R. Energy Environ Sci 2014, 7, 1250-1280.
7. The Chemistry and Applications of Metal-Organic Frameworks. Furukawa, H.; Cordova, K. E.; O'Keeffe, M.; Yaghi, O. M. Science 2013, 341, 974.
8. Supercapacitors of Nanocrystalline Metal-Organic Frameworks. Choi, K. M.; Jeong, H. M.; Park, J. H.; Zhang, Y.-B.; Kang, J. K.; Yaghi, O. M. ACS Nano 2014, 8, 7451-7457.
9. Conductive MOF electrodes for stable supercapacitors with high areal capacitance. Sheberla, D.; Bachman, J. C.; Elias, J. S.; Sun, C.-J.; Shao-Horn, Y.; Dinca, M. Nat Mater 2017, 16, 220.
10. Metal-organic solids derived from arylphosphonic acids. Yücesan, G.; Zorlu, Y.; Stricker, M.; Beckmann, J. Coordin Chem Rev 2018, 369, 105-122.

The invention claimed is:

1. An electrode suitable for constructing an electrochemical double layer capacitor and/or supercapacitor comprising as an electrode material a metal organic framework (MOF), wherein the MOF comprises an inorganic building unit comprising:
   metal atoms selected from group 1 to group 12 elements, and
   functional groups of organic linkers comprising oxygen (O) and one or more atoms selected from the group consisting of: phosphorus (P), arsenic (As), antimony (Sb), silicon (Si), selenium (Se) and bismuth (Bi).

2. The electrode according to claim 1, wherein the metal atoms are selected form the group consisting of: zinc (Zn), cadmium (Cd), copper (Cu), cobalt (Co), nickel (Ni), gold (Au) and silver (Ag).

3. The electrode according to claim 1, wherein the functional groups of the organic linkers are selected from the group consisting of: phosphonate, arsonate, phosphonic acid, phosphinic acid, arsonic acids and/or arsenic acids, monoester and/or diester forms thereof.

4. The electrode according to claim 1, wherein the MOFs comprise auxiliary linkers.

5. The electrode according to claim 1, wherein the functional groups of the organic linkers comprise arsonate and are synthetized using p-dimethylarsenato-phenylboronic acid.

6. The electrode according to claim 1, wherein the metal atoms and the functional groups of the organic linkers are bound to each other through covalent bonding, coordinate covalent bonding and/or an ionic bonding.

7. The electrode according to claim 1, wherein the MOF is porous.

8. The electrode according to claim 1, wherein metal atoms comprise Cu, Ni, Fe, Cd, Zn, Zr, Ti, V, Cr and/or Co and the functional groups comprise phosphonate and/or arsonate.

9. The electrode according to claim 1, wherein the MOF is [{Cu2 (4,4'-bpy)$_{0.5}$} (1,4-naphthalenediphosphonate (NDPA))], [Co$_2$(H$_4$-MTPPA)]0.3NMP·H$_2$O, [{Cu(H$_2$O)} (2,6-NDPA)$_{0.5}$], [Zn{N(CH$_3$)$_2$}(6-bromonapthalene-2-yl) phosphonate], Zn$_2$H$_4$MTPPA, Zn$_2$H$_4$STPPA, [Ni(Cu-H$_4$TPPA)]·2(CH$_3$)$_2$NH$^{2+}$, Zn$_2$(H$_4$TPPA), Zn$_2$(Cu-H$_4$TPPA), Cu$_3$(H$_5$-MTPPA)$_2$, K$_6$ (m-H$_2$-TPPA)·2H$_2$O, or [{Ca$_2$(DMF)} (2,6-NDPA)].

10. The electrode according to claim 9, wherein [Co$_2$(H$_4$-MTPPA)]·3NMP·H$_2$O was prepared solvothermically from the tetrahedral linker tetraphenylmethane tetrakis-4-phosphonic acid (H8-MTPPA) and CoSO$_4$·7H$_2$O in N-methyl-2-pyrrolidone (NMP).

11. An electrochemical double layer capacitor or a supercapacitor comprising an electrode according to claim 1.

12. The electrode according to claim 2, wherein the metal atoms are at least one of Co, Cu and Ni.

13. The electrode according to claim 2, wherein the metal atoms are at least one of Zn and Cu.

14. The electrode according to claim 3, wherein the functional groups of the organic linkers are phosphonate and/or arsonate and/or monoester and/or diester forms thereof.

15. The electrode according to claim 4, wherein the auxiliary linkers comprise organoimine groups.

16. The electrode according to claim 15, wherein the organoimine groups are a Lewis base comprising a group 15 element.

17. The electrode according to claim 16, wherein the Lewis base is 4,4'-bipyridine.

18. A semiconductor device or photovoltaic device comprising a metal organic framework (MOF), wherein the MOF comprises an inorganic building unit comprising:
   metal atoms selected from group 1 to group 12 elements, and
   functional groups of organic linkers comprising oxygen (O) and one or more atoms selected from the group consisting of: phosphorus (P), arsenic (As), antimony (Sb), silicon (Si), selenium (Se) and bismuth (Bi).

19. The photovoltaic device according to claim 18, wherein the photovoltaic device is a photovoltaic cell comprising the MOF as a photoactive material.

* * * * *